US012593489B2

(12) United States Patent
Chen et al.

(10) Patent No.: US 12,593,489 B2
(45) Date of Patent: Mar. 31, 2026

(54) SEMICONDUCTOR STRUCTURE INCLUDING GATE SPACER LAYER AND DIELECTRIC LAYER HAVING PORTION LOWER THAN TOP SURFACE OF GATE SPACER LAYER

(71) Applicant: TAIWAN SEMICONDUCTOR MANUFACTURING COMPANY, LTD., Hsinchu (TW)

(72) Inventors: Hong-Chih Chen, Changhua County (TW); Ta-Chun Lin, Hsinchu (TW); Jhon-Jhy Liaw, Zhudong (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 467 days.

(21) Appl. No.: 18/163,785

(22) Filed: Feb. 2, 2023

(65) Prior Publication Data

US 2024/0266410 A1 Aug. 8, 2024

(51) Int. Cl.
| | |
|---|---|
| *H10D 64/00* | (2025.01) |
| *H10D 30/01* | (2025.01) |
| *H10D 30/43* | (2025.01) |
| *H10D 30/67* | (2025.01) |
| *H10D 62/10* | (2025.01) |
| *H10D 64/01* | (2025.01) |
| *H10D 64/23* | (2025.01) |
| *H10D 84/01* | (2025.01) |
| *H10D 84/03* | (2025.01) |
| *H10D 84/83* | (2025.01) |

(52) U.S. Cl.
CPC ......... *H10D 64/258* (2025.01); *H10D 30/014* (2025.01); *H10D 30/43* (2025.01); *H10D 30/6729* (2025.01); *H10D 30/6735* (2025.01); *H10D 30/6757* (2025.01); *H10D 62/121* (2025.01); *H10D 64/017* (2025.01); *H10D 84/0128* (2025.01); *H10D 84/013* (2025.01); *H10D 84/0158* (2025.01); *H10D 84/038* (2025.01); *H10D 84/834* (2025.01)

(58) Field of Classification Search
CPC . H10D 64/258; H10D 30/6735; H10D 62/121
See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |

(Continued)

*Primary Examiner* — Reema Patel
(74) *Attorney, Agent, or Firm* — Cooper Legal Group, LLC

(57) ABSTRACT

Semiconductor structures and methods for manufacturing the same are provided. The semiconductor structure includes a gate structure formed over a substrate, and a source/drain (S/D) structure formed adjacent to the gate structure. The semiconductor structure includes a first dielectric layer formed over the S/D structure, and an S/D contact structure formed over the S/D structure. The S/D contact structure penetrates through the first dielectric layer, and a top surface of the gate structure is higher than a top surface of the S/D contact structure.

20 Claims, 55 Drawing Sheets

(56)  References Cited

U.S. PATENT DOCUMENTS

| | | | |
|---|---|---|---|
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2020/0266060 A1* | 8/2020 | Cheng | H10D 62/116 |
| 2021/0126134 A1* | 4/2021 | Ferng | H01L 21/30604 |
| 2022/0223526 A1* | 7/2022 | Min | H01L 23/535 |
| 2022/0320301 A1* | 10/2022 | Bae | H10D 30/6219 |
| 2023/0197803 A1* | 6/2023 | Park | H10D 62/121 |
| | | | 257/347 |

* cited by examiner

100a 138 142

146
140
148
126
144
144
146
148
136
108'

100c

100c

SEMICONDUCTOR STRUCTURE INCLUDING GATE SPACER LAYER AND DIELECTRIC LAYER HAVING PORTION LOWER THAN TOP SURFACE OF GATE SPACER LAYER

BACKGROUND

The electronics industry is experiencing ever-increasing demand for smaller and faster electronic devices that are able to perform a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). However, integration of fabrication of the multi-gate devices can be challenging.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
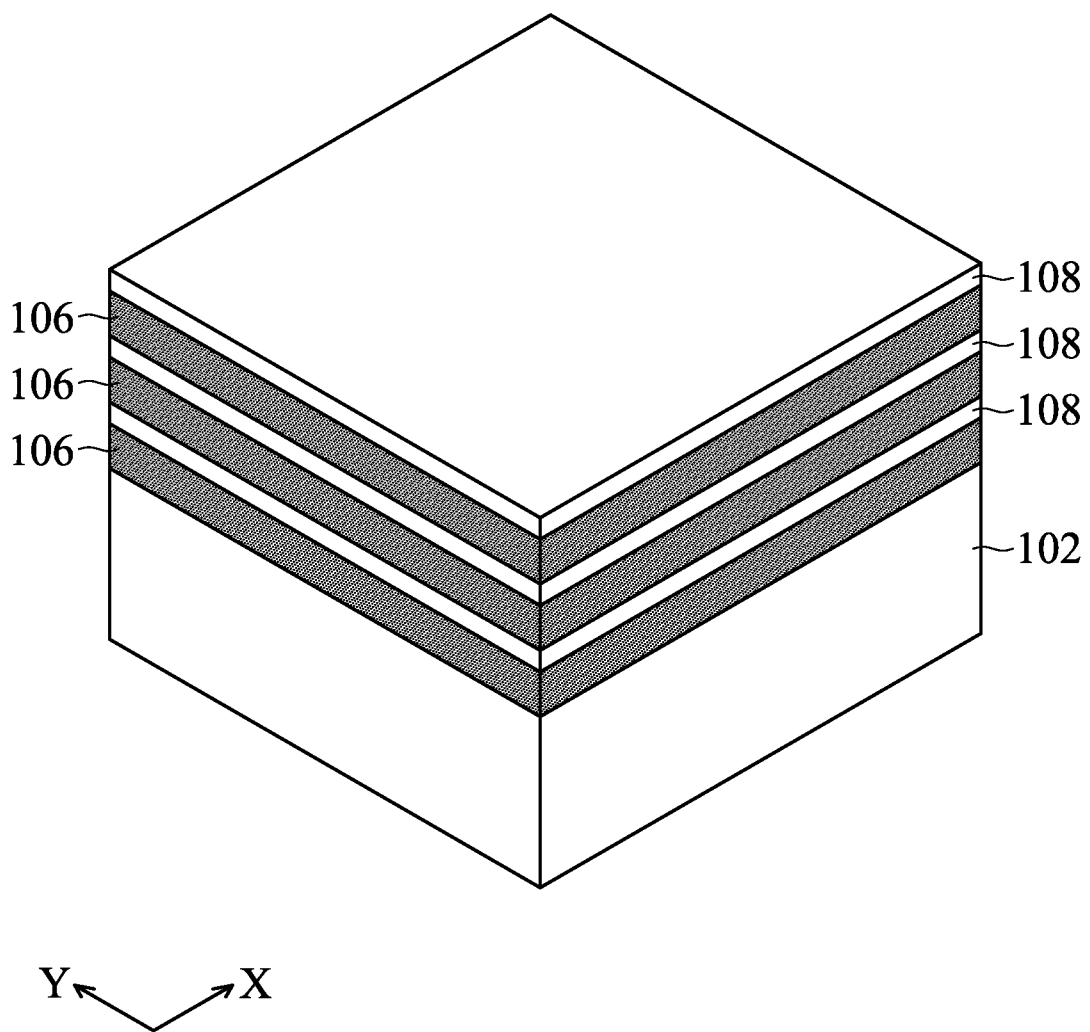
FIGS. 1A to 1E illustrate perspective views of intermediate stages of manufacturing a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The fins described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments of semiconductor structures and methods for forming the same are provided. The semiconductor structures may include a gate structure formed over a substrate and a source/drain (S/D) structure formed adjacent to the gate structure. An S/D contact structure is formed over the S/D structure. The additional conducive layer is formed on the gate electrode layer, and the additional conducive layer is a part of the gate structure. The top surface of the gate structure having the additional conducive layer is higher than or protrudes from the top surface of the S/D contact structure. The additional conducive layer provides more contact area for landing the gate contact structure over the gate structure. In some embodiments, the top portion of the S/D contact structure is recessed, and the unwanted capacitance between the gate structure and the S/D contact structure is reduced. In addition, the leakage between the gate structure and the S/D contact structure is reduced. The performance of the semiconductor structure is improved by controlling the positional relationship between the gate structure and the S/D contact structure.

FIGS. 1A to 1E illustrate perspective views of intermediate stages of manufacturing a semiconductor structure 100a in accordance with some embodiments. As shown in FIG. 1A, first semiconductor material layers 106 and second semiconductor material layers 108 are formed over a substrate 102.

The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

In some embodiments, the first semiconductor material layers 106 and the second semiconductor material layers 108 are alternately stacked over the substrate 102. In some embodiment, the first semiconductor material layers 106 and the second semiconductor material layers 108 are made of different semiconductor materials. In some embodiments, the first semiconductor material layers 106 are made of SiGe, and the second semiconductor material layers 108 are made of silicon. It should be noted that although three first semiconductor material layers 106 and three second semiconductor material layers 108 are formed, the semiconductor structure may include more or fewer first semiconductor material layers 106 and second semiconductor material layers 108. For example, the semiconductor structure may include two to five of the first semiconductor material layers 106 and the second semiconductor material layers.

The first semiconductor material layers 106 and the second semiconductor material layers 108 may be formed by using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

Figure 1B:
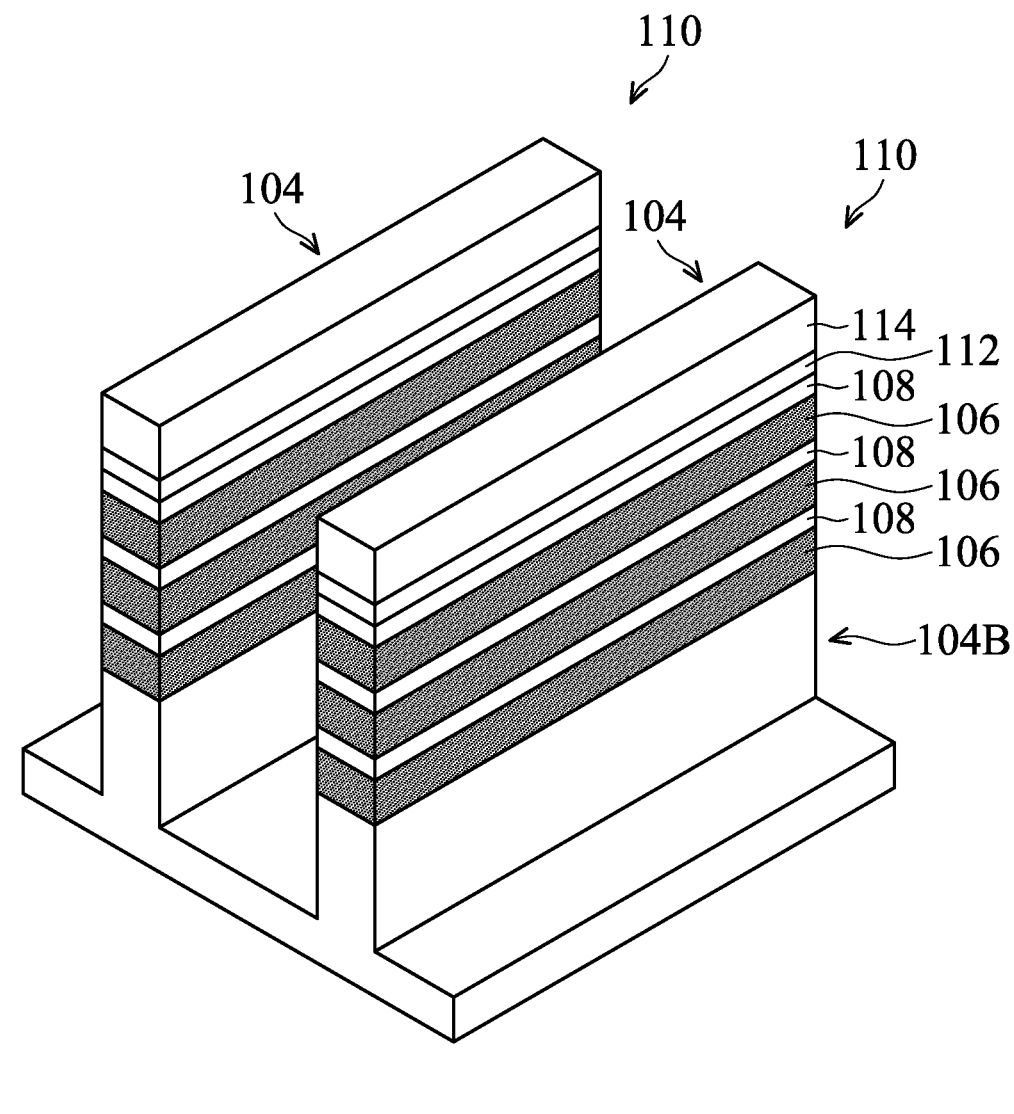

As shown in FIG. 1B, after the first semiconductor material layers 106 and the second semiconductor material layers 108 are formed as a semiconductor material stack over the substrate 102, the semiconductor material stack is patterned to form a fin structure 104, in accordance with some embodiments. In some embodiments, the fin structure 104 includes a base fin structure 104B and the semiconductor material stack of the first semiconductor material layers 106 and the second semiconductor material layers 108.

In some embodiments, the patterning process includes forming a mask structure 110 over the semiconductor material stack, and etching the semiconductor material stack and the underlying substrate 102 through the mask structure 110. In some embodiments, the mask structure 110 is a multilayer structure including a pad oxide layer 112 and a nitride layer 114 formed over the pad oxide layer 112. The pad oxide layer 112 may be made of silicon oxide, which is formed by thermal oxidation or chemical vapor deposition (CVD), and the nitride layer 114 may be made of silicon nitride, which is formed by chemical vapor deposition (CVD), such as low-temperature chemical vapor deposition (LPCVD) or plasma-enhanced CVD (PECVD).

Figure 1C:
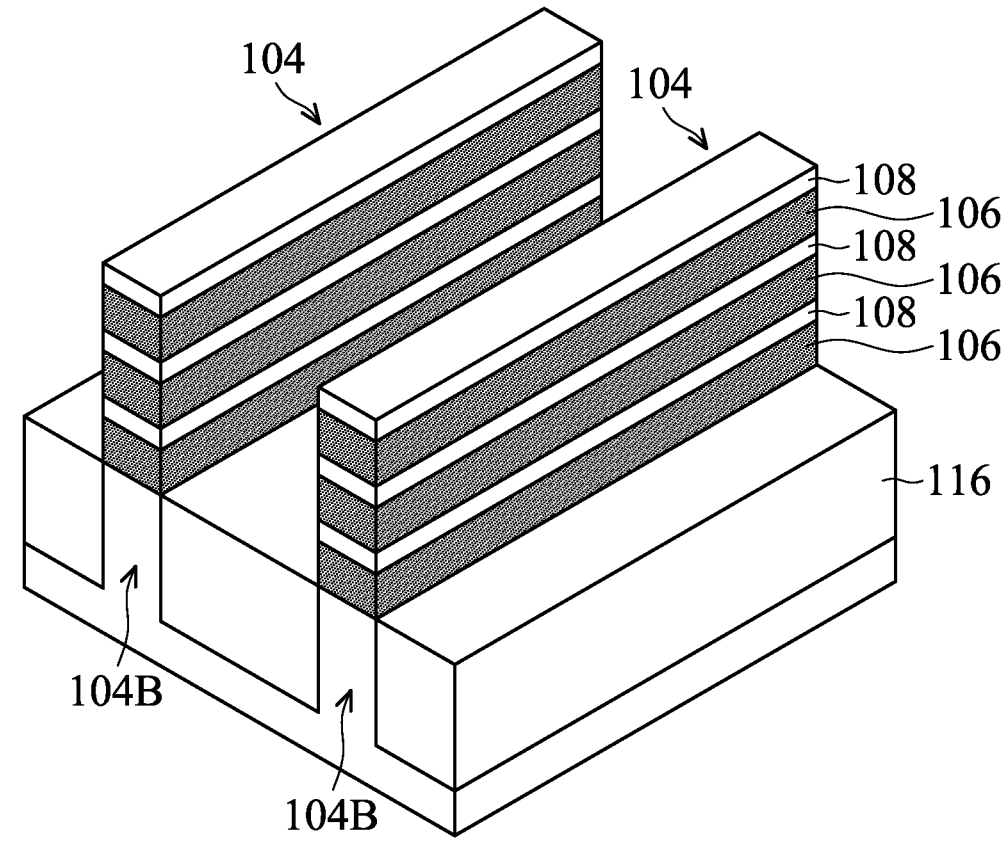

As shown in FIG. 1C, after the fin structure 104 is formed, an isolation structure 116 is formed around the fin structure 104, and the mask structure 110 is removed, in accordance with some embodiments. The isolation structure 116 is configured to electrically isolate active regions (e.g. the fin structure 104) of the semiconductor structure 100 and is also referred to as shallow trench isolation (STI) feature in accordance with some embodiments.

The isolation structure 116 may be formed by depositing an insulating layer over the substrate 102 and recessing the insulating layer so that the fin structure 104 is protruded from the isolation structure 116. In some embodiments, the isolation structure 116 is made of silicon oxide, silicon nitride, silicon oxynitride (SiON), another suitable insulating material, or a combination thereof. In some embodiments, a dielectric liner (not shown) is formed before the isolation structure 116 is formed, and the dielectric liner is made of silicon nitride and the isolation structure formed over the dielectric liner is made of silicon oxide.

Figure 1D:
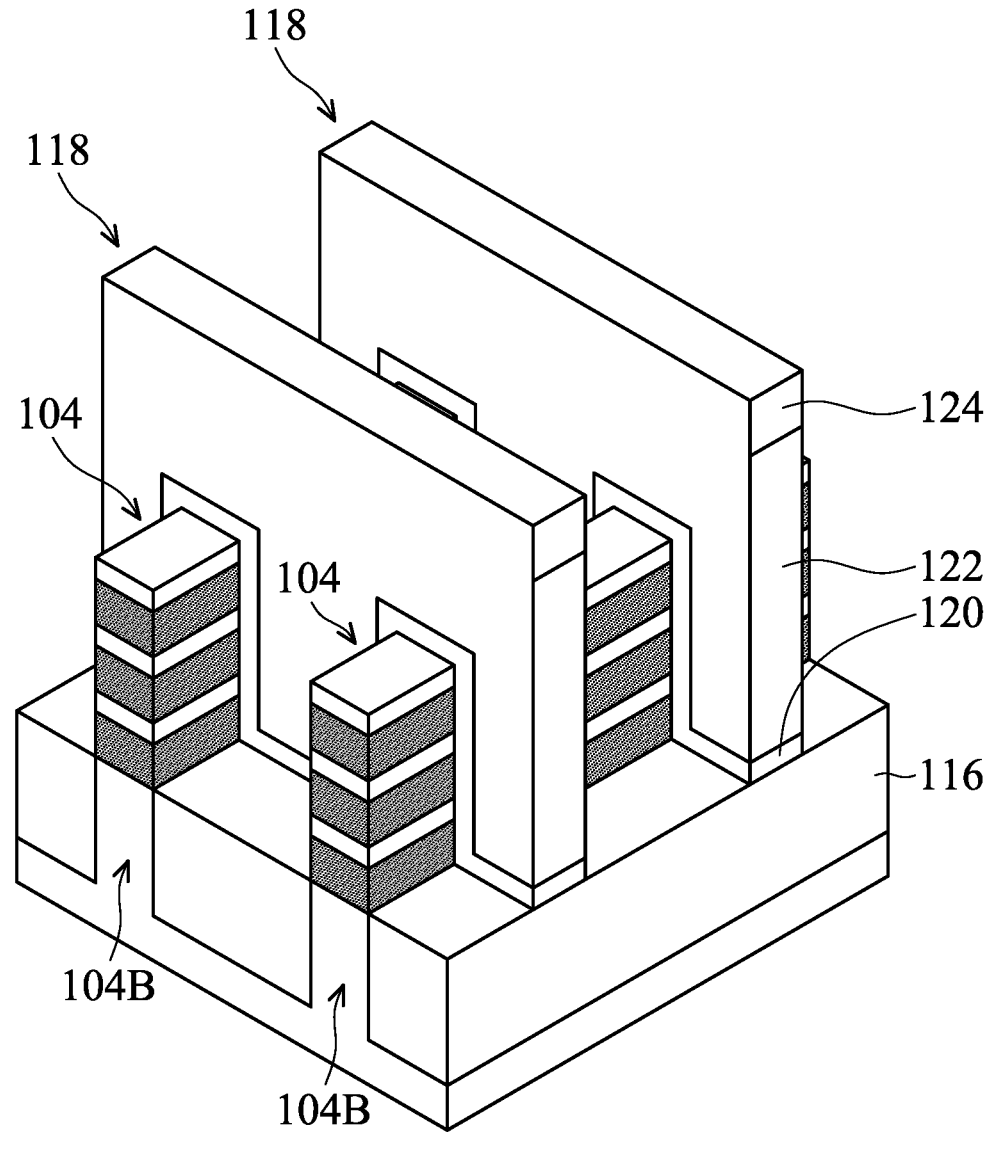

As shown in FIG. 1D, after the isolation structure 116 is formed, dummy gate structures 118 are formed across the fin structure 104 and extend over the isolation structure 116, in accordance with some embodiments. The dummy gate structures 118 may be used to define the source/drain regions and the channel regions of the resulting semiconductor structure 100.

In some embodiments, the dummy gate structures 118 include dummy gate dielectric layers 120 and dummy gate electrode layers 122. In some embodiments, the dummy gate dielectric layers 120 are made of one or more dielectric materials, such as silicon oxide, silicon nitride, silicon oxynitride (SiON), $HfO_2$, HfZrO, HfSiO, HfTiO, HfAlO, or a combination thereof. In some embodiments, the dummy gate dielectric layers 120 are formed using thermal oxidation, chemical vapor deposition (CVD), atomic vapor deposition (ALD), physical vapor deposition (PVD), another suitable method, or a combination thereof.

In some embodiments, the conductive material includes polycrystalline-silicon (poly-Si), poly-crystalline silicon-germanium (poly-SiGe), metallic nitrides, metallic silicides, metals, or a combination thereof. In some embodiments, the dummy gate electrode layers 122 are formed using chemical vapor deposition (CVD), physical vapor deposition (PVD), or a combination thereof.

In some embodiments, the hard mask layers 124 are formed over the dummy gate structures 118. In some embodiments, the hard mask layers 124 include multiple layers, such as an oxide layer and a nitride layer. In some embodiments, the oxide layer is silicon oxide, and the nitride layer is silicon nitride.

The formation of the dummy gate structures 118 may include conformally forming a dielectric material as the dummy gate dielectric layers 120. Afterwards, a conductive material may be formed over the dielectric material as the dummy gate electrode layers 122, and the hard mask layer 124 may be formed over the conductive material. Next, the dielectric material and the conductive material may be patterned through the hard mask layer 124 to form the dummy gate structures 118.

Figure 1E:
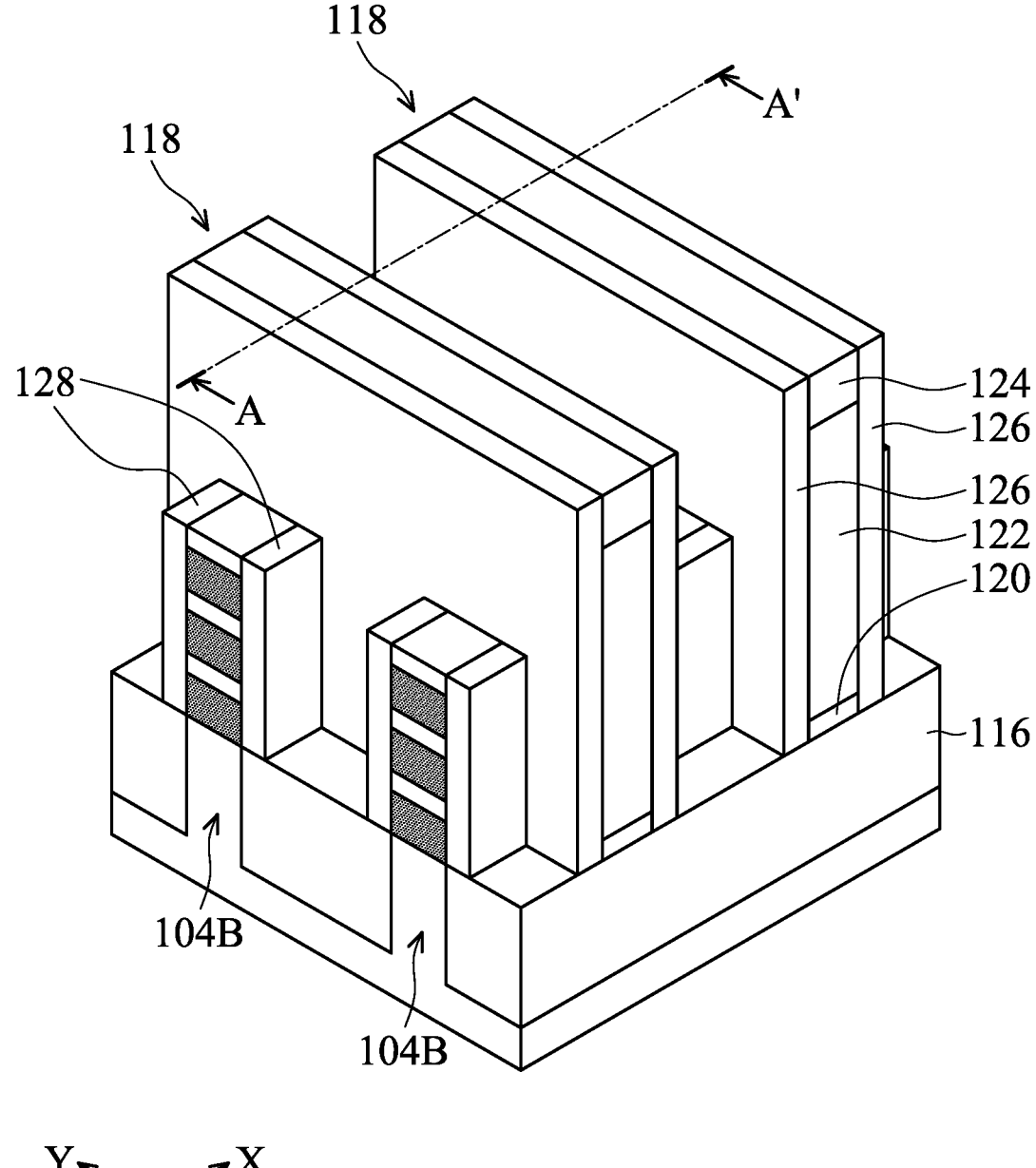

As shown in FIG. 1E, after the dummy gate structures 118 are formed, gate spacers 126 are formed along and covering opposite sidewalls of the dummy gate structure 118 and fin spacers 128 are formed along and covering opposite sidewalls of the source/drain regions of the fin structure 104, in accordance with some embodiments.

The gate spacers 126 may be configured to separate source/drain structures from the dummy gate structure 118 and support the dummy gate structure 118, and the fin spacers 128 may be configured to constrain a lateral growth of subsequently formed source/drain structure and support the fin structure 104.

In some embodiments, the gate spacers 126 and the fin spacers 128 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. The formation of the gate spacers 126 and the fin spacers 128 may include conformally depositing a dielectric material covering the dummy gate structure 118, the fin structure 104, and the isolation structure 116 over the substrate 102, and performing an anisotropic etching process, such as dry plasma etching, to remove the dielectric layer covering the top surfaces of the dummy gate structure 118, the fin structure 104, and portions of the isolation structure 116.

Figure 2:
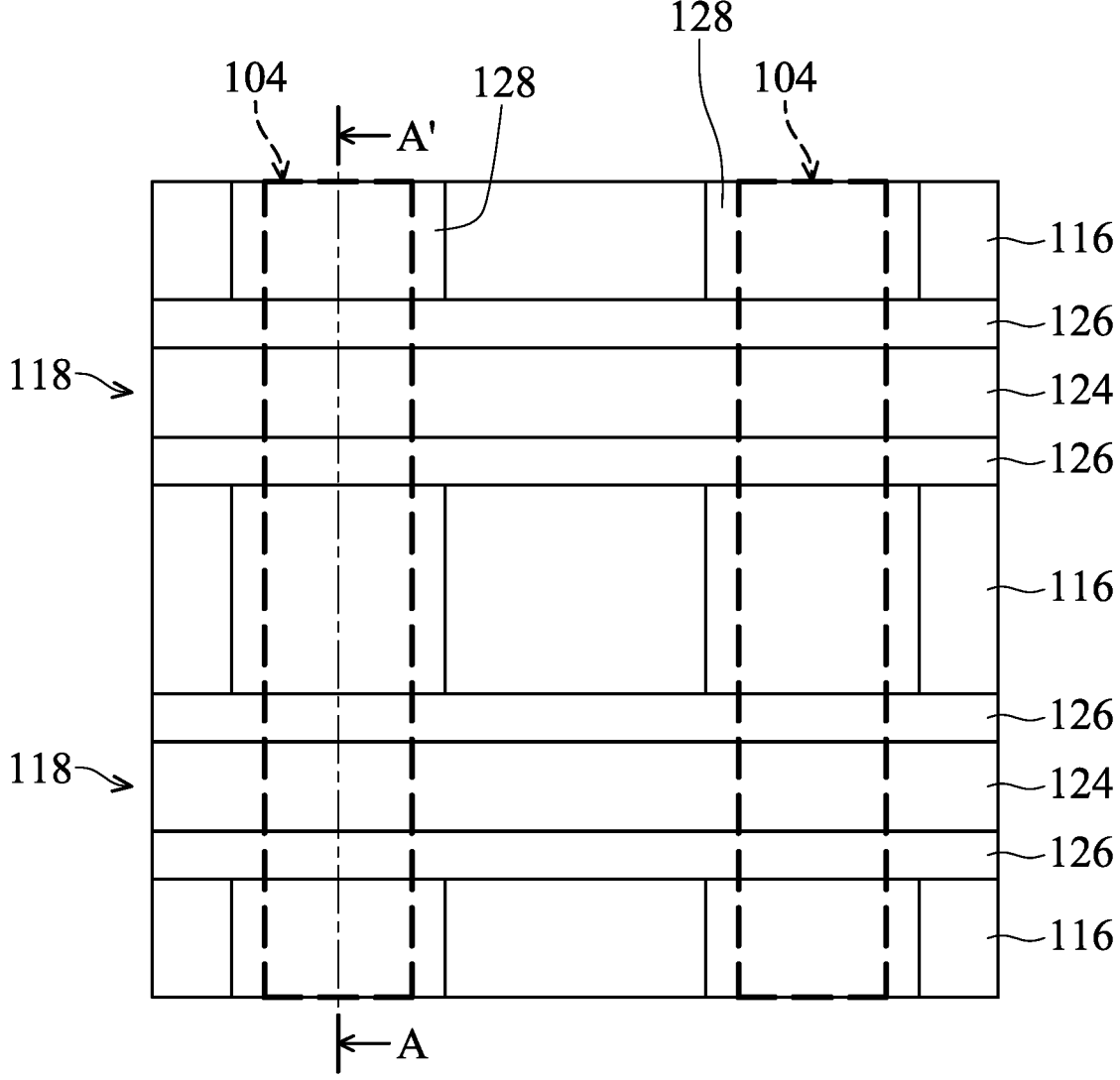
FIG. 2 shows a top view of the semiconductor structure of FIG. 1E, in accordance with some embodiments.

FIG. 2 shows a top view of the semiconductor structure 100a of FIG. 1E, in accordance with some embodiments.

As shown in FIG. 2, the fin structure 104 is formed along the first direction (e.g. X-axis), and the dummy gate structure 118 is formed along the second direction (e.g. Y-axis). The gate spacers 126 are formed on sidewalls of the dummy gate structure 118.

Figure 3A:
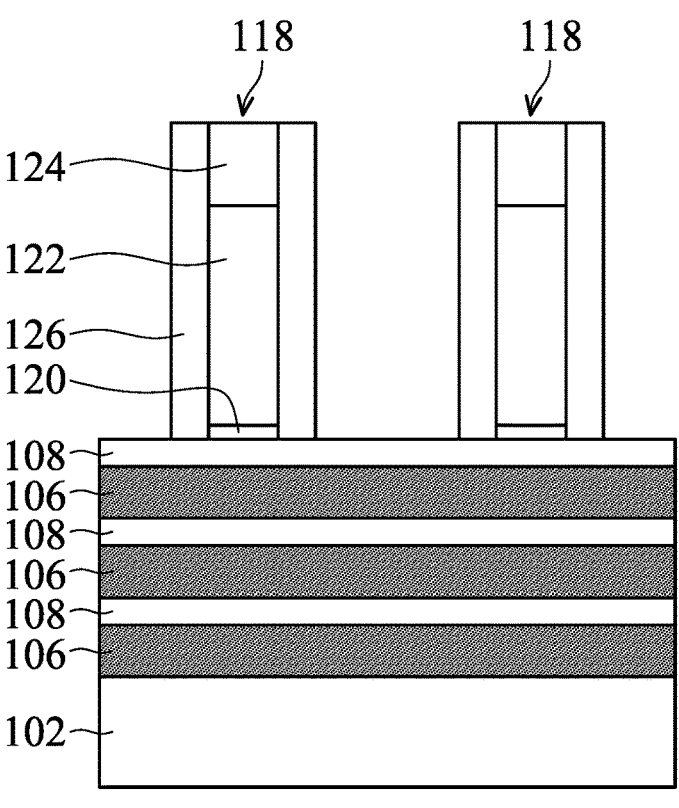
FIGS. 3A to 3G illustrate cross-sectional representations of various stages of manufacturing the semiconductor structure shown along line A-A' in FIG. 1E and along line A-A' of FIG. 2, in accordance with some embodiments.

FIGS. 3A to 3G illustrate cross-sectional representations of various stages of manufacturing the semiconductor structure 100a shown along line A-A' in FIG. 1E and along line A-A' of FIG. 2, in accordance with some embodiments. More specifically, FIG. 3A illustrates the cross-sectional representation shown along line A-A' in FIG. 1E.

Figure 3B:
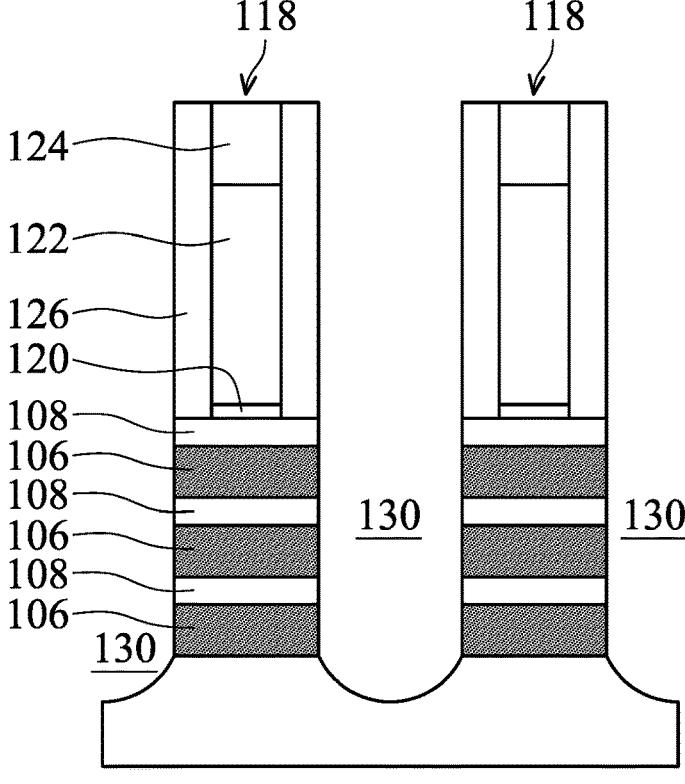

As shown in FIG. 3B, after the gate spacers 126 and the fin spacers 128 are formed, the source/drain (S/D) regions of the fin structure 104 are recessed to form source/drain (S/D) recesses 130, as shown in in accordance with some embodiments. More specifically, the first semiconductor material layers 106 and the second semiconductor material layers 108 not covered by the dummy gate structures 118 and the gate spacers 126 are removed in accordance with some embodiments. In addition, some portions of the base fin structure 104B are also recessed to form curved top surfaces, as shown in FIG. 2B in accordance with some embodiments.

In some embodiments, the fin structure 104 is recessed by performing an etching process. The etching process may be an anisotropic etching process, such as dry plasma etching, and the dummy gate structure 118 and the gate spacers 126 are used as etching masks during the etching process. In some embodiments, the fin spacers 128 are also recessed to form lowered fin spacers 128'.

Figure 3C:
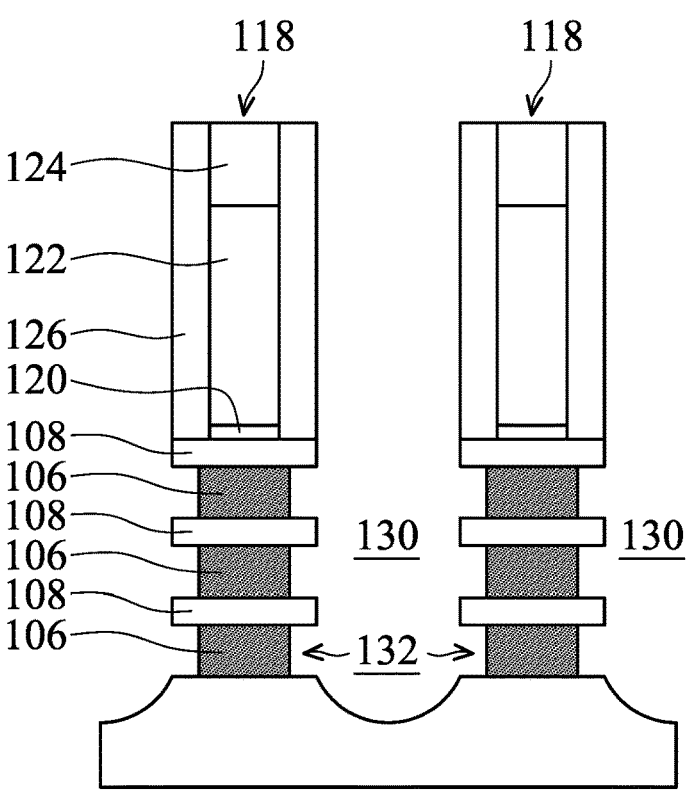

Afterwards, as shown in FIG. 3C, after the source/drain recesses 130 are formed, the first semiconductor material layers 106 exposed by the source/drain recesses 130 are laterally recessed to form notches 132, in accordance with some embodiments.

In some embodiments, an etching process is performed on the semiconductor structure 100 to laterally recess the first semiconductor material layers 106 of the fin structure 104 from the source/drain recesses 130. In some embodiments, during the etching process, the first semiconductor material layers 106 have a greater etching rate (or etching amount) than the second semiconductor material layers 108, thereby forming notches 132 between adjacent second semiconductor material layers 108. In some embodiments, the etching process is an isotropic etching such as dry chemical etching, remote plasma etching, wet chemical etching, another suitable technique, and/or a combination thereof.

Figure 3D:
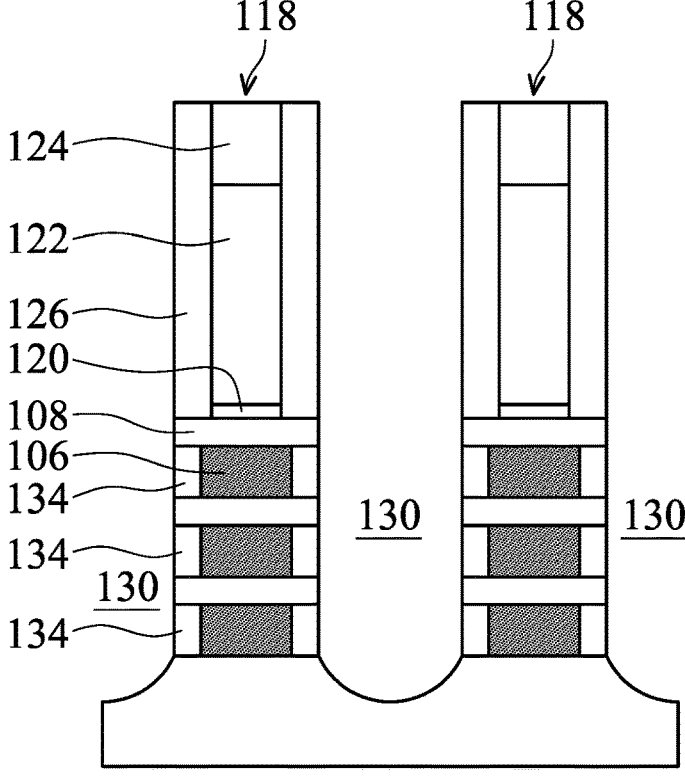

Next, as shown in FIG. 3D, inner spacers 134 are formed in the notches 132 between the second semiconductor material layers 108, in accordance with some embodiments. The inner spacers 134 are configured to separate the source/drain (S/D) structures 136 and the gate structures 142 formed in subsequent manufacturing processes in accordance with some embodiments.

In some embodiments, the inner spacers 134 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof. In some embodiments, the inner spacer layer 134 is formed by a deposition process, such as chemical vapor deposition (CVD) process, atomic layer deposition (ALD) process, another applicable process, or a combination thereof.

Figure 3E:
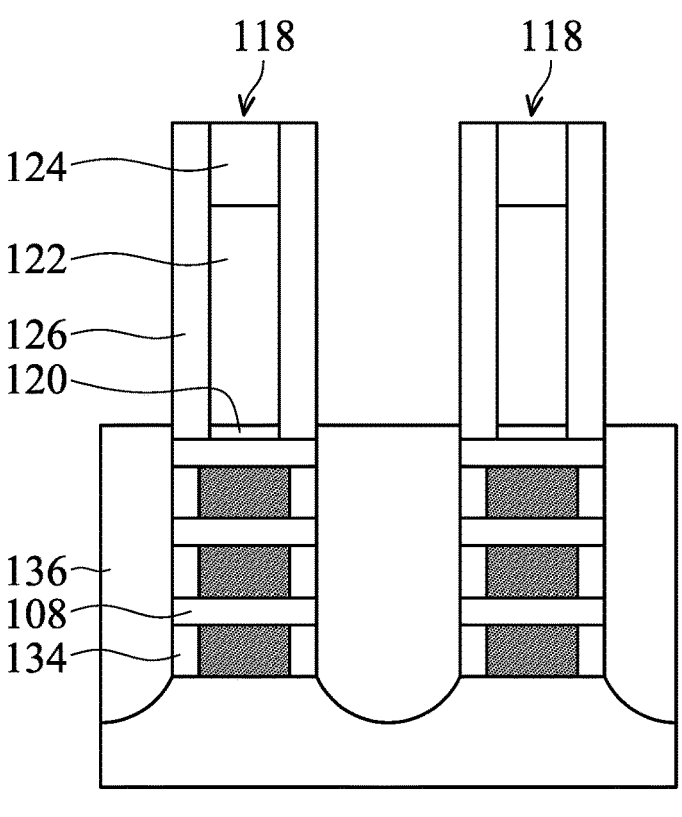

Afterwards, as shown in FIG. 3E, after the inner spacers 134 are formed, source/drain (S/D) structures 136 are formed in the S/D recesses 130, in accordance with some embodiments. In some embodiments, the S/D structures 136 are formed using an epitaxial growth process, such as Molecular beam epitaxy (MBE), Metal-organic Chemical Vapor Deposition (MOCVD), Vapor-Phase Epitaxy (VPE), other applicable epitaxial growth process, or a combination thereof. In some embodiments, the S/D structures 136 are made of any applicable material, such as Ge, Si, GaAs, AlGaAs, SiGe, GaAsP, SiP, SiC, SiCP, or a combination thereof.

In some embodiments, the S/D structures 136 are in-situ doped during the epitaxial growth process. For example, the S/D structures 136 may be the epitaxially grown SiGe doped with boron (B). For example, the S/D structures 136 may be the epitaxially grown Si doped with carbon to form silicon: carbon (Si:C) source/drain features, phosphorous to form silicon: phosphor (Si:P) source/drain features, or both carbon and phosphorous to form silicon carbon phosphor (SiCP) source/drain features. In some embodiments, the S/D structures 136 are doped in one or more implantation processes after the epitaxial growth process.

Figure 3F:
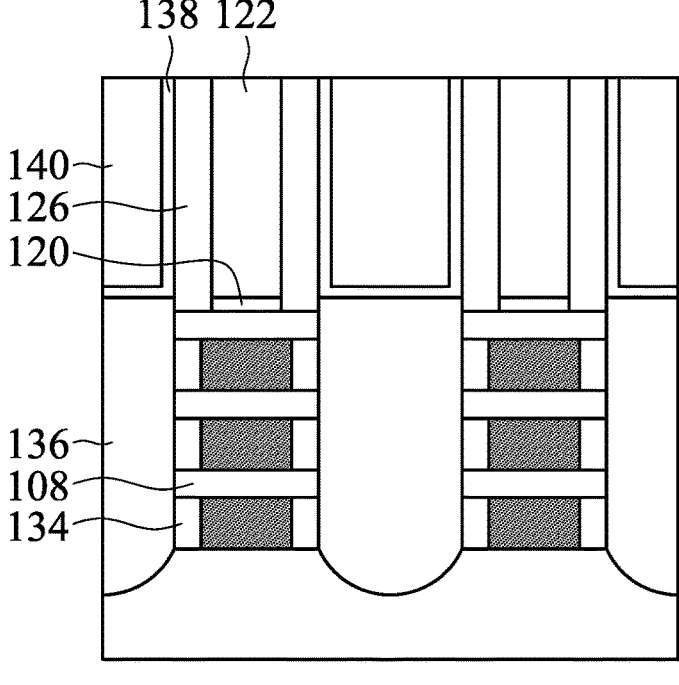

Next, as shown in FIG. 3F, after the S/D structures 136 are formed, a contact etch stop layer (CESL) 138 is conformally formed to cover the S/D structures 136 and an interlayer dielectric (ILD) layer 140 is formed over the contact etch stop layers 138, in accordance with some embodiments.

In some embodiments, the contact etch stop layer 138 is made of a dielectric materials, such as silicon nitride, silicon oxide, silicon oxynitride, another suitable dielectric material, or a combination thereof. The dielectric material for the contact etch stop layers 138 may be conformally deposited over the semiconductor structure by performing chemical vapor deposition (CVD), ALD, other application methods, or a combination thereof.

The ILD layer 140 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The ILD layer 140 may be formed by chemical vapor deposition (CVD), physical vapor deposition, (PVD), atomic layer deposition (ALD), or other applicable processes.

After the contact etch stop layer 138 and the ILD layer 140 are deposited, a planarization process such as CMP or an etch-back process may be performed until the gate electrode layers 120 of the dummy gate structures 118 are exposed, as shown in FIG. 2F-1 in accordance with some embodiments.

Figure 3G:
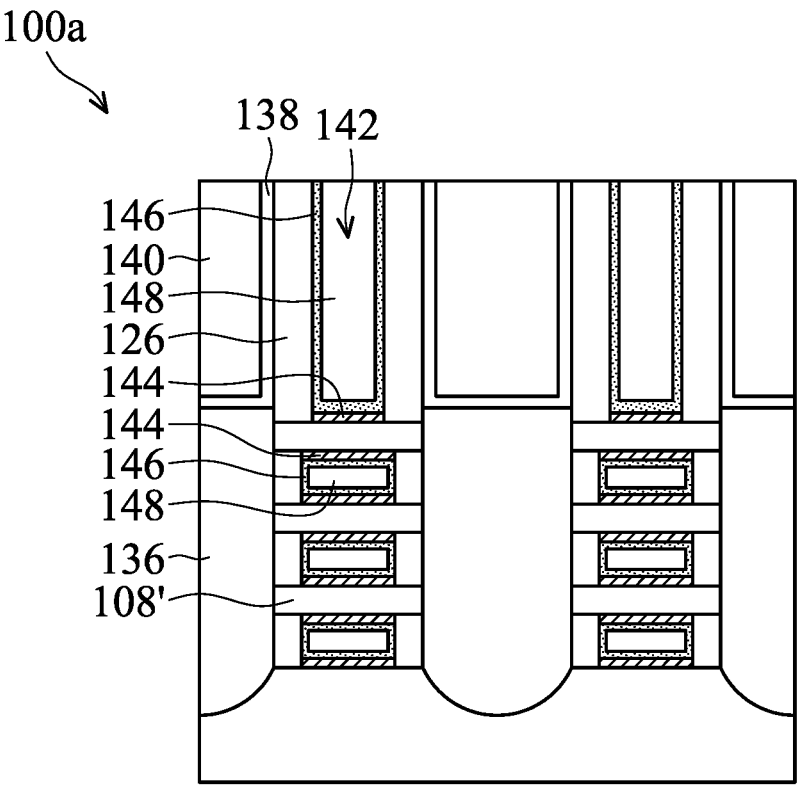

Afterwards, as shown in FIG. 3G, the dummy gate structures 118 are replaced by a gate structure 142, in accordance with some embodiments. More specifically, the dummy gate structures 118 and the first semiconductor material layers 106 are removed to form nanostructures 108' with the second semiconductor material layers 108, in accordance with some embodiments. The S/D structure 136 is attached to the nanostructures 108'.

The removal process may include one or more etching processes. For example, when the dummy gate electrode layers 122 are polysilicon, a wet etchant such as a tetramethylammonium hydroxide (TMAH) solution may be used to selectively remove the dummy gate electrode layers 122. Afterwards, the dummy gate dielectric layers 120 may be removed using a plasma dry etching, a dry chemical etching, and/or a wet etching. The first semiconductor material layers 106 may be removed by performing a selective wet etching process, such as APM (e.g., ammonia hydroxide-hydrogen peroxide-water mixture) etching process. For example, the wet etching process uses etchants such as ammonium hydroxide ($NH_4OH$), TMAH, ethylenediamine pyrocatechol (EDP), and/or potassium hydroxide (KOH) solutions. In some embodiments, the upper portions of the gate spacers 126 are also removed.

After the nanostructures 108' are formed, the gate structures 142 are formed wrapped around the nanostructures 108'. The gate structures 142 wrap around the nanostructures 108' to form gate-all-around transistor structures in accordance with some embodiments. In some embodiments, the gate structure 142 includes an interfacial layer 144, a gate dielectric layer 146, and a gate electrode layer 148.

In some embodiments, the interfacial layers 144 are oxide layers formed around the nanostructures 108' and on the top of the base fin structure 104B. In some embodiments, the interfacial layers 144 are formed by performing a thermal process.

In some embodiments, the gate dielectric layers 146 are formed over the interfacial layers 144, so that the nanostructures 108' are surrounded (e.g. wrapped) by the gate dielectric layers 146. In addition, the gate dielectric layers 146 also cover the sidewalls of the gate spacers 126 and the inner spacers 134 in accordance with some embodiments. In some embodiments, the gate dielectric layers 146 are made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$—$Al2O_3$) alloy, another suitable high-k dielectric material, or a combination thereof. In some embodiments, the gate dielectric layers 146 are formed using chemical vapor deposition (CVD), atomic layer deposition (ALD), another applicable method, or a combination thereof.

In some embodiments, the gate electrode layers 148 are formed on the gate dielectric layer 146. In some embodiments, the gate electrode layers 148 are made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the gate electrode layers 148 are formed using chemical vapor deposition (CVD), atomic layer deposition (ALD), electroplating, another applicable method, or a combination thereof. Other conductive layers, such as work function metal layers, may also be formed in the gate structures 142, although they are not shown in the figures. In some embodiments, the n-work function layer includes tungsten (W), copper (Cu), titanium (Ti), silver (Ag), aluminum (Al), titanium nitride (TiN), tantalum nitride (TaN), tantalum carbide (TaC), titanium aluminum alloy (TiAl), titanium aluminum nitride (TiAlN), tantalum carbon nitride (TaCN), tantalum silicon nitride (TaSiN), manganese (Mn), zirconium (Zr) or a combination thereof. In some embodiments, the p-work function layer includes titanium (Ti), titanium nitride (TiN), tantalum nitride (TaN), tantalum carbide (TaC), molybdenum nitride, tungsten nitride (WN), ruthenium (Ru) or a combination thereof.

After the interfacial layers 144, the gate dielectric layers 146, and the gate electrode layers 148 are formed, a planarization process such as CMP process or an etch-back process may be performed until the ILD layer 140 is exposed.

Figure 4:
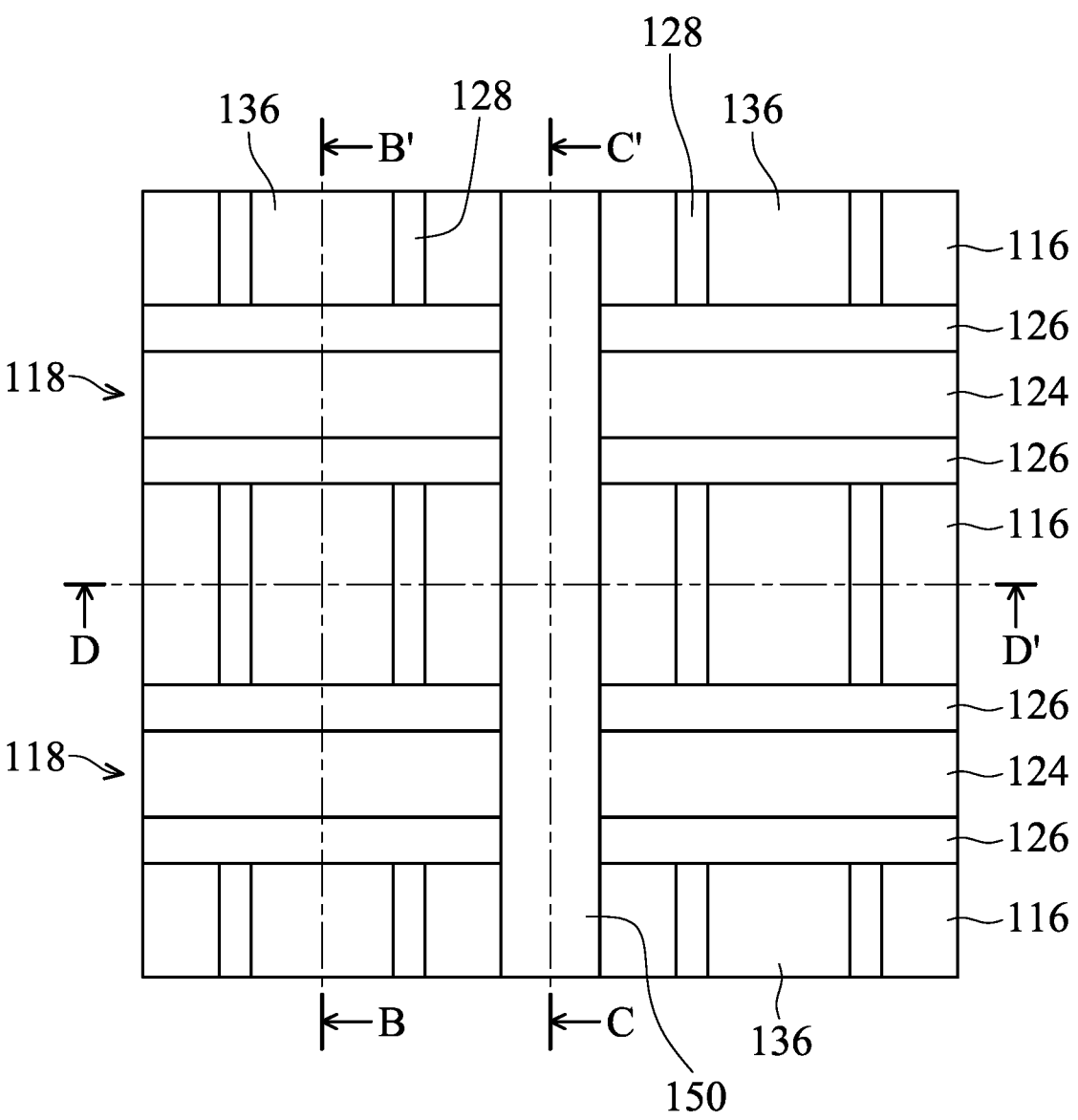
FIG. 4 shows a top view of the semiconductor structure after FIG. 3G, in accordance with some embodiments.

FIG. 4 shows a top view of the semiconductor structure 100a after FIG. 3G, in accordance with some embodiments.

As shown in FIG. 4, a gate isolation structure 150 is formed across two adjacent gate structures 142. The gate structure 142 is divided into two parts by the gate isolation structure 150. The gate isolation structure 150 is formed along the first direction (e.g. X-axis).

In some embodiments, the gate isolation structure 150 is made of silicon oxide, silicon nitride, silicon oxynitride (SiON), silicon carbonitride (SiCN), or a combination thereof. In some embodiments, the gate isolation structure 150 is formed by forming a trench through the gate structure 142, and the isolation material is filled into the trench. In some embodiments, the gate isolation structure 150 is formed using chemical vapor deposition (CVD), atomic layer deposition (ALD), electroplating, another applicable method, or a combination thereof. In some embodiments, the depth of the gate isolation structure 150 is in a range from about 5 nm to about 60 nm.

FIGS. 5A to 5M illustrate cross-sectional representations of various stages of manufacturing the semiconductor structure 100a shown along line A-A' in FIG. 1E and along line A-A' of FIG. 2 after FIG. 4, in accordance with some embodiments.

Figure 5A:
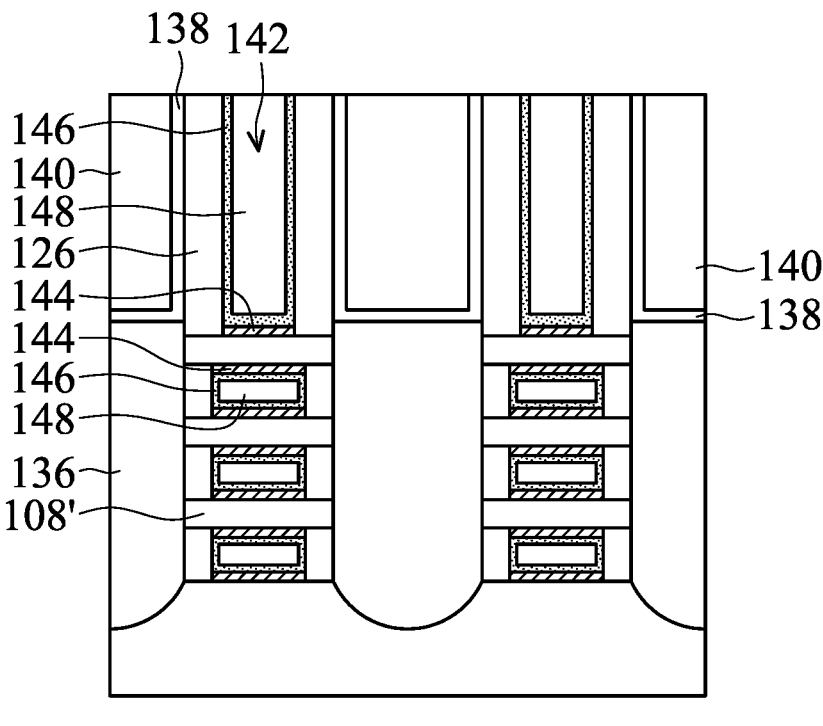
FIGS. 5A to 5M illustrate cross-sectional representations of various stages of manufacturing the semiconductor structure shown along line A-A' in FIG. 1E and along line A-A' of FIG. 2 after FIG. 4, in accordance with some embodiments.

The semiconductor structure 100a of FIG. 5A includes elements that are similar to, or the same as, elements of the semiconductor structure 100a of FIG. 3G.

Figure 5B:
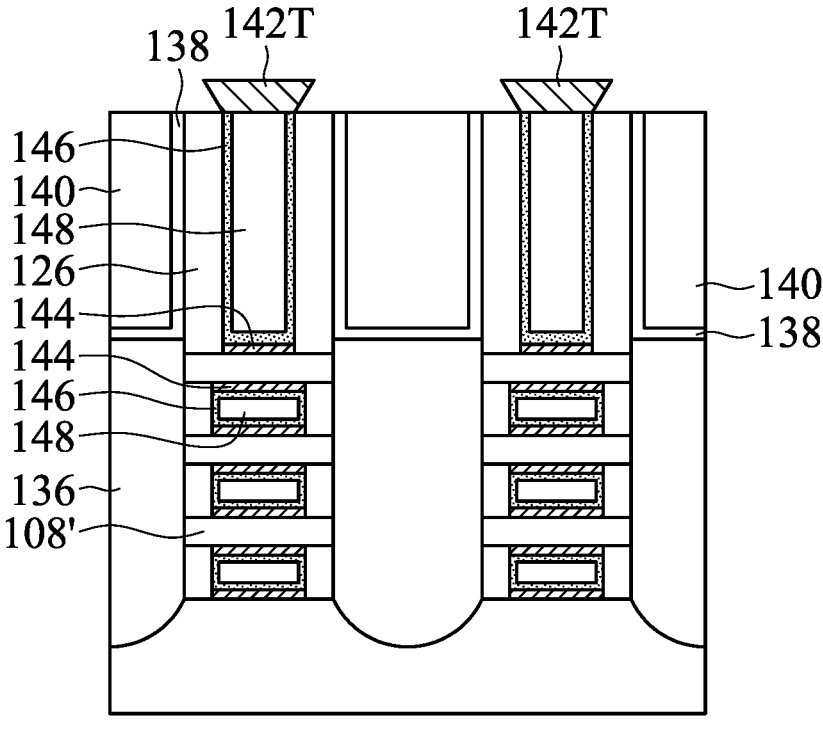

Next, as shown in FIG. 5B, an additional conductive layer 142T is selectively formed on the gate electrode layer 148 of the gate structure 142, in accordance with some embodiments. The additional conductive layer 142T is formed on the conductive material, not formed on the insulating material. The additional conductive layer 142T is an extending portion of the gate structure 142.

The additional conductive layer 142T protrudes upwardly from the top surface of the gate electrode layer 148. In addition, the top surface of the additional conductive layer 150 is higher than the top surface of the gate spacer layer 126. In some embodiments, the additional conductive layer 142T is made of tungsten (W), ruthenium (Ru), cobalt (Co), copper (Cu), Rhodium (Rh), tantalum nitride (TaN), titanium (Ti), titanium nitride (TiN), or another applicable material. In some embodiments, the additional conductive layer 142T has a top surface and a bottom surface, and a first width of the top surface is greater than a second width of the bottom surface.

Furthermore, since the additional conductive layer 142T is selectively formed on the gate structure 142, no additional mask layer is used to define the location of the additional conductive layer 142T. The additional conductive layer 142T is not formed by the photolithography process. Therefore, the fabrication time and cost are reduced.

Figure 5C:
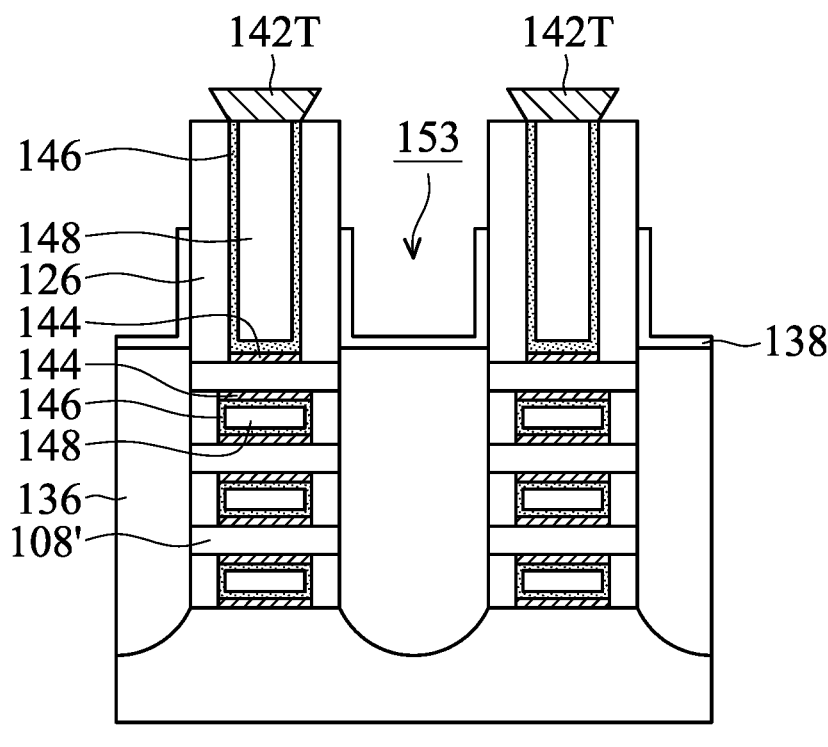

Afterwards, as shown in FIG. 5C, the ILD layer 140 is removed to form a recess 153, in accordance with some embodiments. As a result, the CESL 138 is exposed. The recess 153 is surrounded by the U-shaped CESL 138.

Figure 5D:
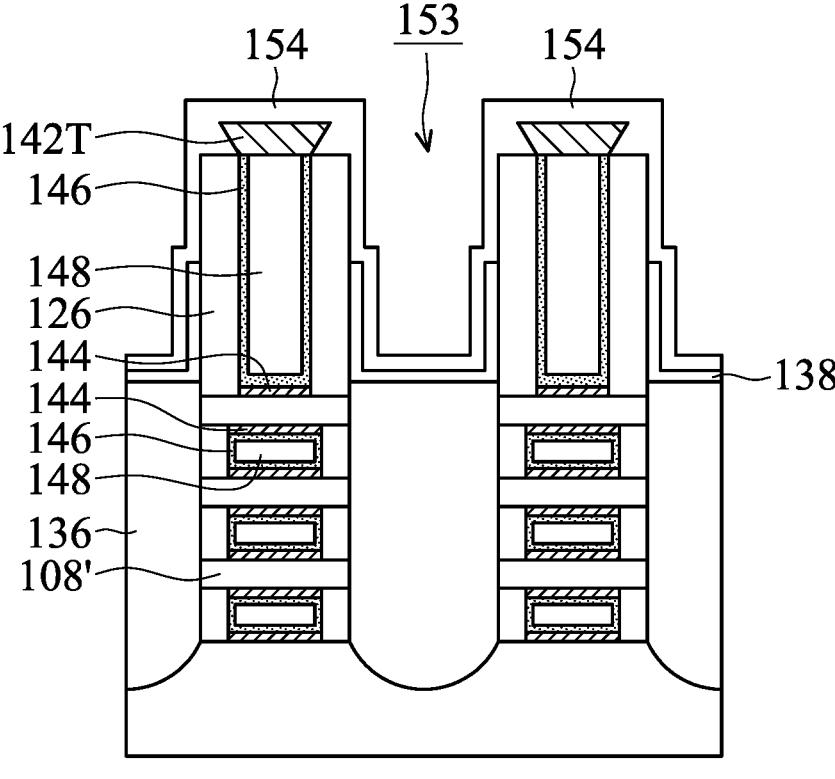

Afterwards, as shown in FIG. 5D, a first hard mask layer 154 is formed on the additional conductive layer 142T and on the CESL 138, in accordance with some embodiments. More specifically, the first hard mask layer 154 is conformally formed on the gate spacer layer 126, the CESL 138, and the additional conductive layer 142T.

In some embodiments, the first hard mask layer 154 is made of silicon nitride. In some embodiments, the first hard mask layer 154 is formed by chemical vapor deposition (CVD), physical vapor deposition, (PVD), atomic layer deposition (ALD), or other applicable processes.

Figure 5E:
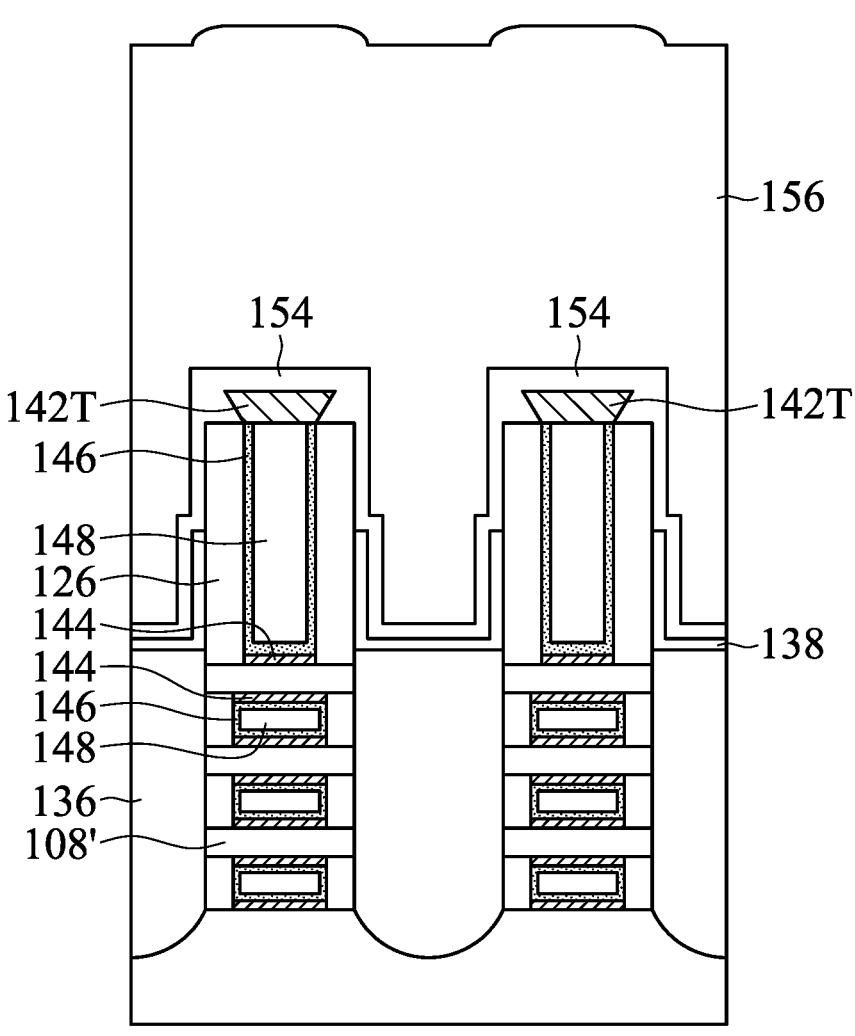

Next, as shown in FIG. 5E, a dielectric layer 156 is formed on the first hard mask layer 154, in accordance with some embodiments.

The dielectric layer 156 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. In some embodiments, the dielectric layer 156 is formed by chemical vapor deposition (CVD), physical vapor deposition, (PVD), atomic layer deposition (ALD), or other applicable processes.

Figure 5F:
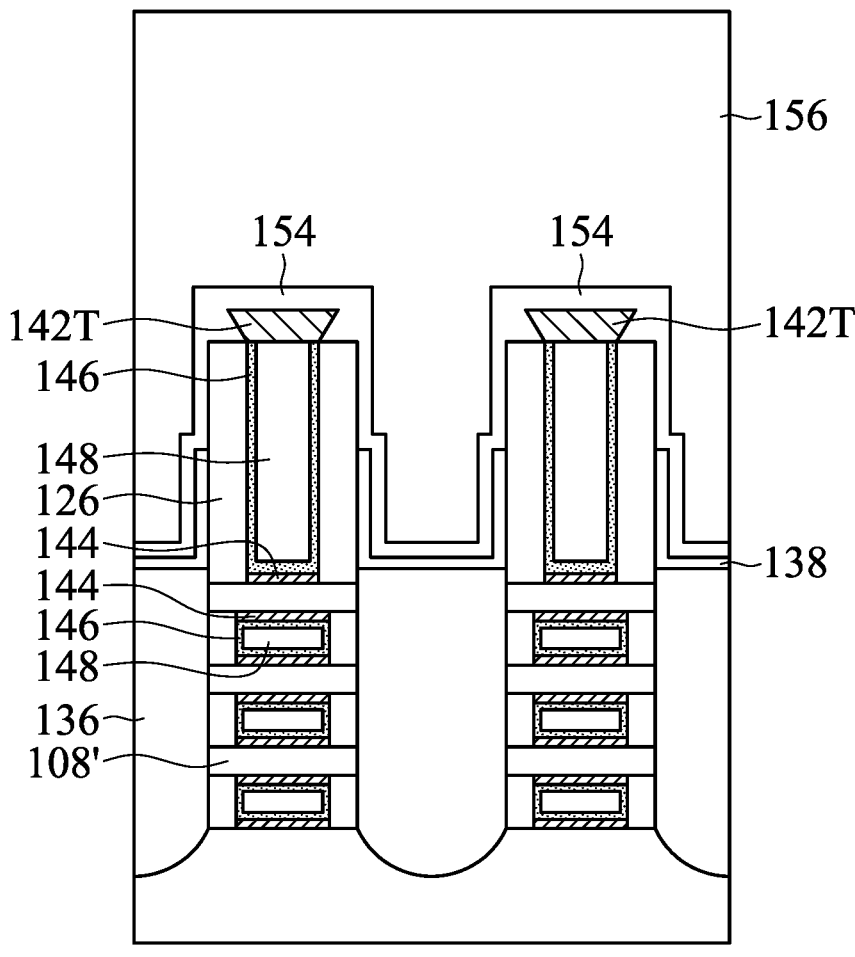

Next, as shown in FIG. 5F, a portion of the dielectric layer 156 is removed by a planarization process, such as chemical mechanical planarization (CMP) process, in accordance with some embodiments.

Figure 5G:
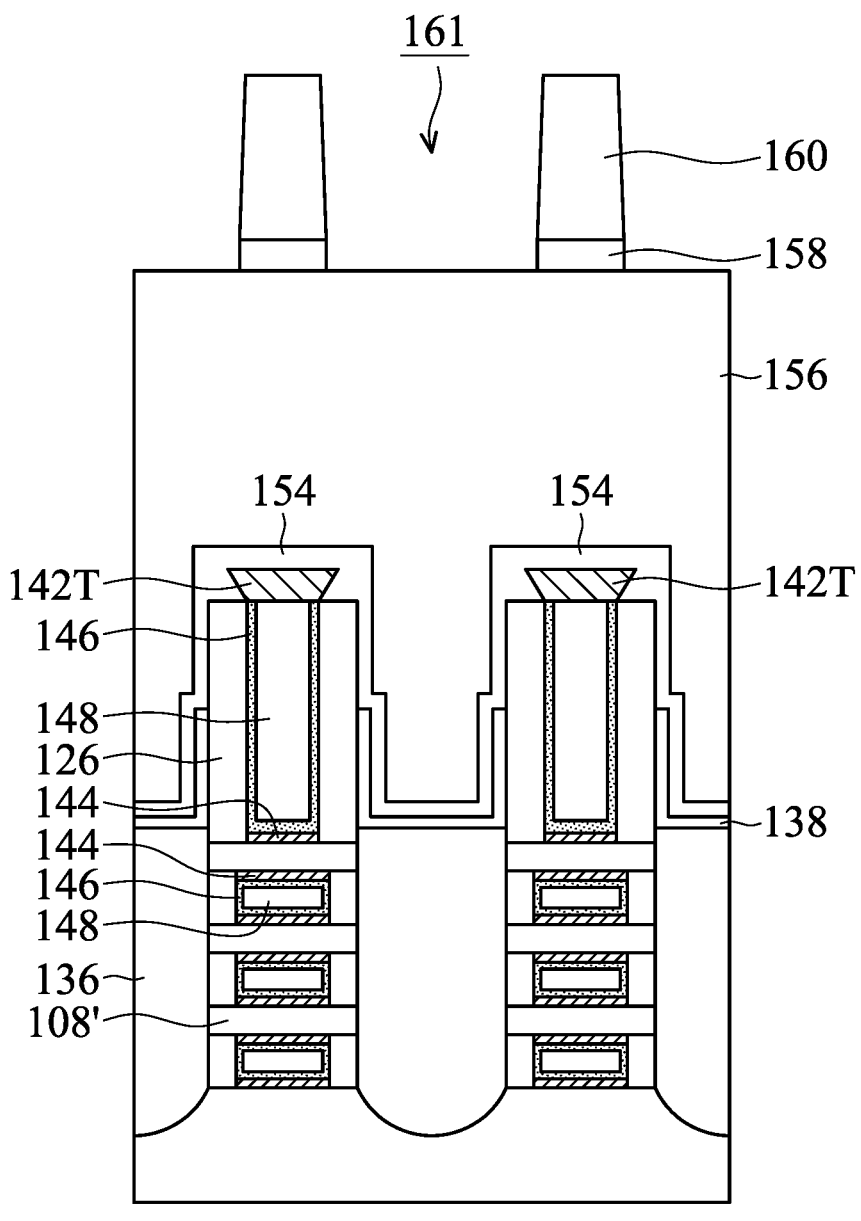

Next, as shown in FIG. 5G, an etch stop layer 158 is formed on the dielectric layer 156, and a dielectric layer 160 is formed on the etch stop layer 158, in accordance with some embodiments. Next, the dielectric layer 160 is patterned to form an opening 161 in the dielectric layer 160 and the etch stop layer 158.

In some embodiments, the etch stop layer 158 is made of a dielectric materials, such as silicon nitride, silicon oxide, silicon oxynitride, another suitable dielectric material, or a combination thereof. In some embodiments, the etch stop layer 158 is formed by chemical vapor deposition (CVD), physical vapor deposition, (PVD), atomic layer deposition (ALD), or other applicable processes.

The dielectric layer 160 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. In some embodiments, the dielectric layer 160 is formed by chemical vapor deposition (CVD), physical vapor deposition, (PVD), atomic layer deposition (ALD), or other applicable processes.

Figure 5H:
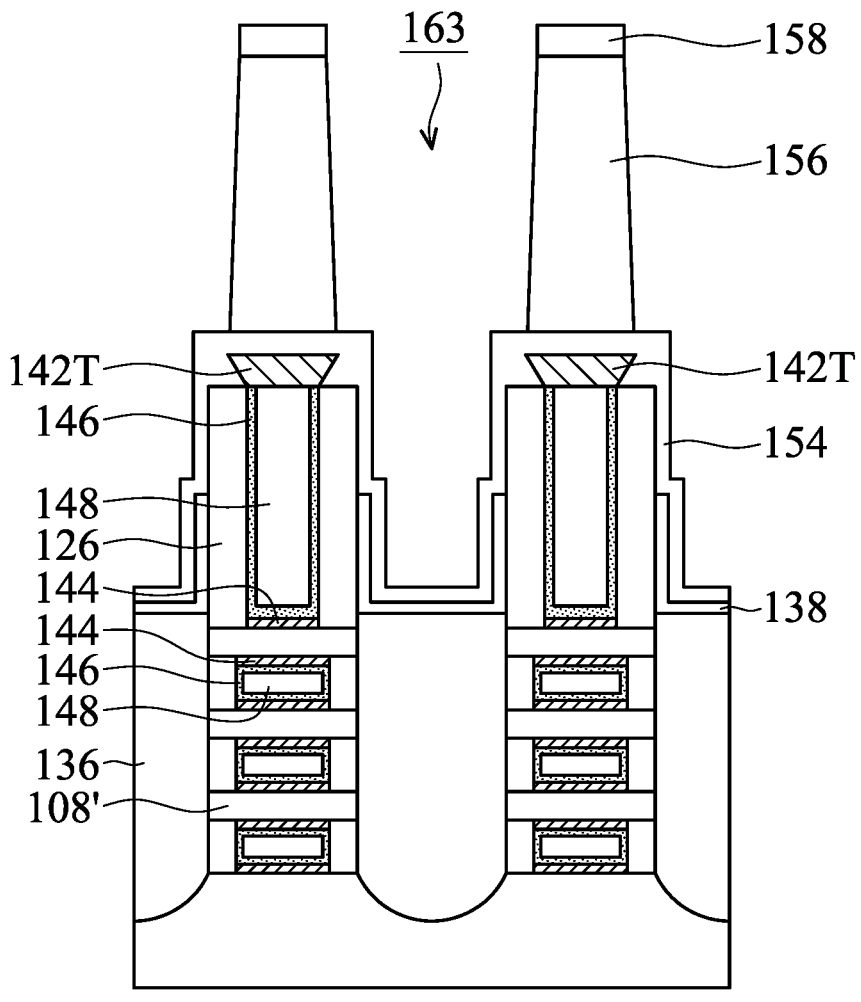

Afterwards, as shown in FIG. 5H, a portion of the dielectric layer 156 is removed by using the etch stop layer 158 as a mask, in accordance with some embodiments. As a result, a trench 163 is formed in the dielectric layer 156, and the portion of the first hard mask layer 154 is exposed by the trench 163.

Figure 5I:
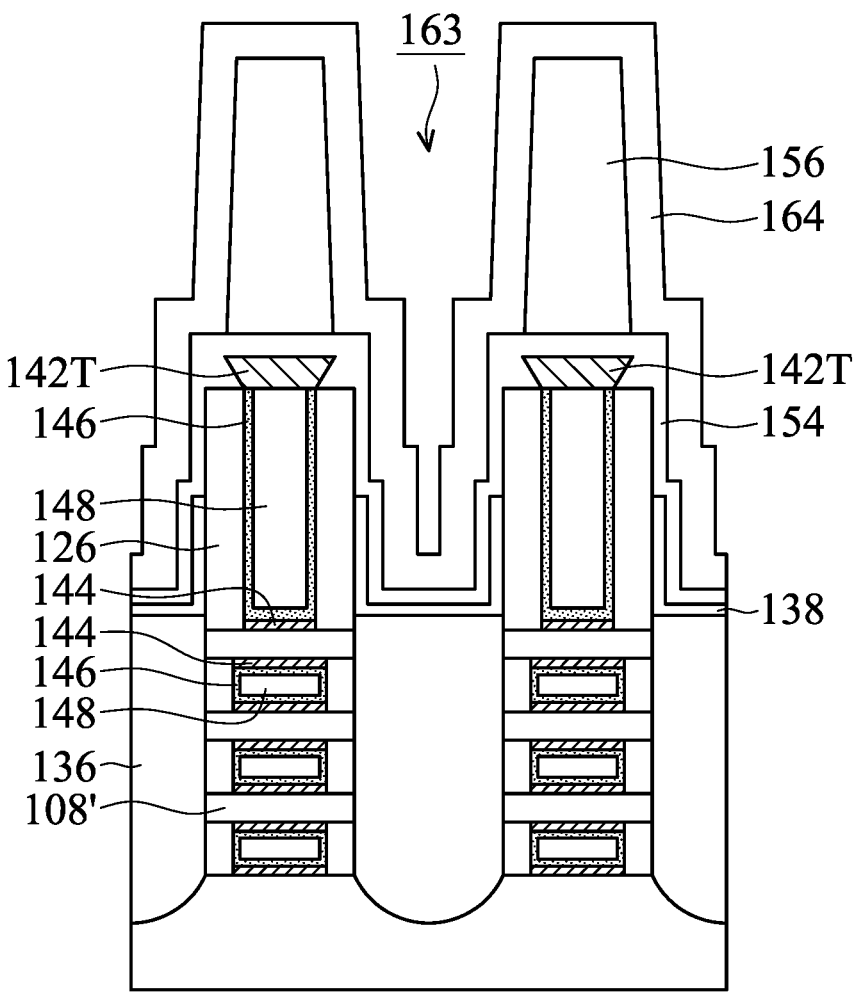

Next, as shown in FIG. 5I, the etch stop layer 158 is removed, and then a second hard mask layer 164 is formed on the first hard mask layer 154, in accordance with some embodiments. The dielectric layer 156 is covered by the second hard mask layer 164.

In some embodiments, the second hard mask layer 164 is made of silicon nitride. In some embodiments, the second hard mask layer 164 is formed by chemical vapor deposition (CVD), physical vapor deposition, (PVD), atomic layer deposition (ALD), or other applicable processes.

Figure 5J:
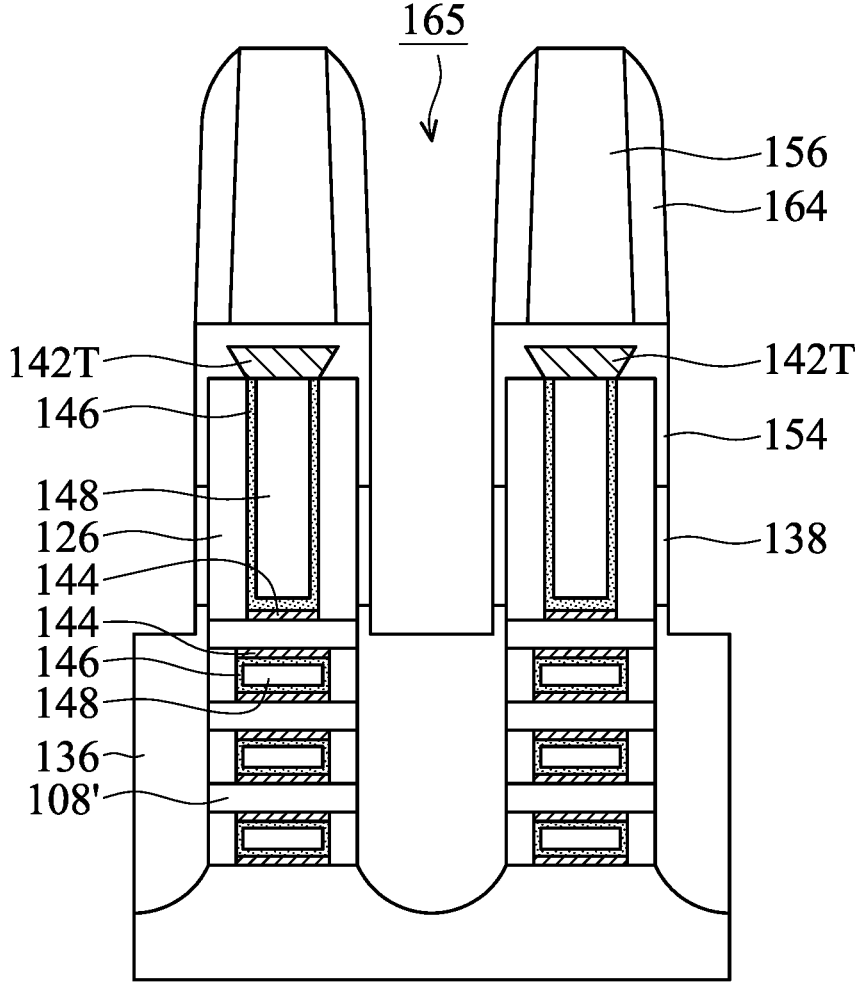

Afterwards, as shown in FIG. 5J, the horizontal portion of the second hard mask layer 164 is removed to form a trench 165, and the vertical portion of the second hard mask layer 164 remains, in accordance with some embodiments. As a result, the top surface of the S/D structure 136 is exposed by the trench 165.

In some embodiments, the horizontal portion of the second hard mask layer 164 is removed by an etching process, such as a dry etching process.

Figure 5K:
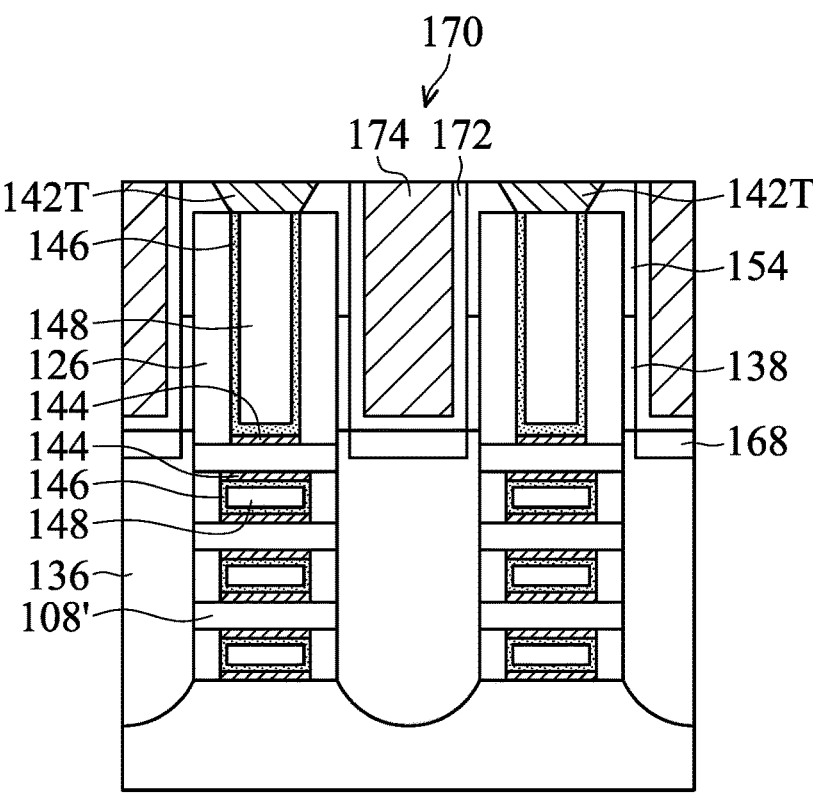

Next, as shown in FIG. 5K, a silicide layer 168 is formed on the top portion of the S/D structure 136, and a barrier material and a conductive material are formed in the trench 165 and on the S/D structure 136, in accordance with some embodiments. Afterwards, the dielectric layer 156, the second hard mask layer 164, and the barrier material and the conductive material are removed by a planarization process, such as CMP process. As a result, an S/D contact structure 170 is formed on the silicide layer 168.

The S/D structure 170 includes a barrier layer 172 and a conductive layer 174. More specifically, the silicide layer 168 is between the S/D structure 136 and the S/D contact structure 170. The silicide layer 168 is used to reduce contact resistance (Rcsd) between the S/D contact structure 170 and the S/D structure 136.

After the trench 165 is formed, the silicide layer 168 may be formed by forming a metal layer over the top surface of the S/D structure 136 and annealing the metal layer so the metal layer reacts with the S/D structure 136 to form the silicide layer 168. The unreacted metal layer may be removed after the silicide layer 168 is formed.

In some embodiments, the barrier layer 172 is made of tantalum nitride, although other materials, such as tantalum (Ta), titanium (Ti), titanium nitride (TiN), tantalum nitride (TaN) or applicable material. The barrier layer 172 may be formed using a process such as chemical vapor deposition (CVD), physical vapor deposition (PVD), plasma enhanced physical vapor deposition (PEPVD), atomic layer deposition (ALD), or any other applicable deposition processes.

In some embodiments, the conductive layer 174 is made of a conductive material including aluminum (Al), copper (Cu), tungsten (W), titanium (Ti), tantalum (Ta), titanium nitride (TiN), cobalt, tantalum nitride (TaN), nickel silicide (NiS), cobalt silicide (CoSi), copper silicide, tantalum carbide (TaC), tantalum silicide nitride (TaSiN), tantalum carbide nitride (TaCN), titanium aluminide (TiAl), titanium aluminum nitride (TiAlN), other applicable conductive materials, or a combination thereof. In some embodiments, the conductive layer 174 is formed by chemical vapor deposition (CVD), physical vapor deposition (PVD), plasma enhanced CVD (PECVD), plasma enhanced physical vapor deposition (PEPVD), atomic layer deposition (ALD), or any other applicable deposition processes.

Figure 5L:
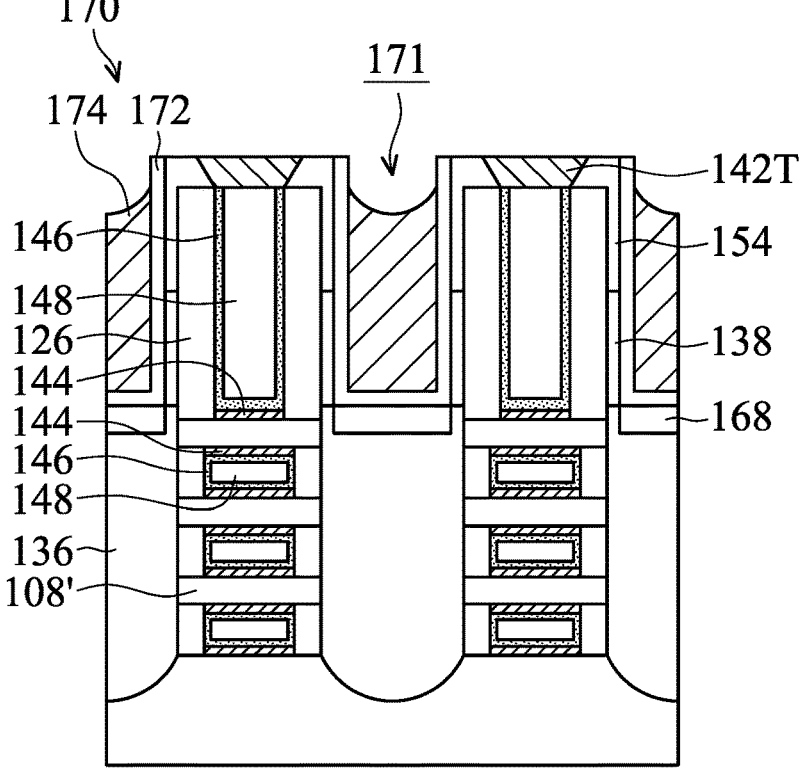

Afterwards, as shown in FIG. 5L, a top portion of the S/D contact structure 170 is removed to form a recess 171, in accordance with some embodiments. As a result, the top surface of the additional conductive layer 142T is higher than the top surface of the S/D contact structure 170.

The S/D contact structure 170 is recessed to form the recessed top surface. The recessed top surface of the S/D contact structure 170 is lower than the top surface of the gate spacer layer 126. The recessed top surface of the S/D contact structure 170 is lower than the top surface of the ILD layer 140.

The recessed top surface of the S/D contact structure 170 may have different profiles. In some embodiments, the recessed top surface of the S/D contact structure 170 has a concave profile.

Since the S/D contact structure 170 is recessed, the top surface of the additional conductive layer 142T of the gate structure 142 is higher than the recessed top surface of the S/D contact structure 170. Since the topmost surface of the additional conductive layer 142T of the gate structure 142 is higher than the recessed top surface of the S/D contact structure 170, the unwanted capacitance between the gate structure 142 and the S/D contact structure 170 is reduced. In addition, the leakage between the gate structure 142 and the S/D contact structure 170 is reduced. Furthermore, since the additional conductive layer 142T is formed on the gate structure 142, more contact area is provided to form the bridge contact structure 178 on the additional conductive layer 142T of the gate structure 142.

In some embodiments, the height difference between the top surface of the additional conductive layer 142T and the recessed top surface of the S/D contact structure 170 is in a range from about 0.1 nm to about 10 nm.

Figure 5M:
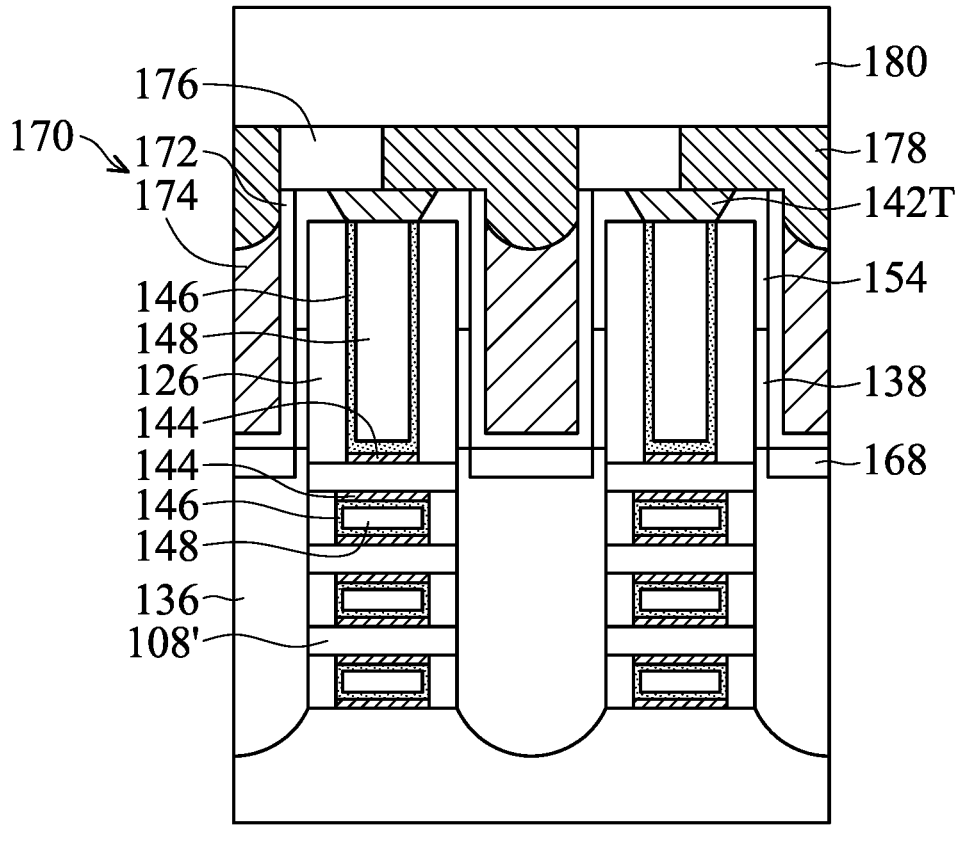

Next, as shown in FIG. 5M, a dielectric layer 176 is formed on the S/D contact structure 170 and the additional conductive layer 142T, a bridge contact structure 178 is formed in the dielectric layer 176, and then a dielectric layer 180 is formed on the dielectric layer 176, and in accordance with some embodiments. The bridge contact structure 178 is configured to connect the S/D contact structure 170 and the gate structure 142 with the additional conductive layer 142T. The S/D contact structure 170 is electrically connected to the additional conductive layer 142T by the bridge contact structure 178.

Since the S/D contact structure 170 is recessed to have the recessed top surface, the bridge contact structure 178 formed on and in direct contact with the recessed top surface of the S/D contact structure 170 also have curved bottom surface. As a result, a portion of the bridge contact structure 178 is lower than the top surface of the gate spacer layer 126.

In some embodiments, the interface between the bridge contact structure 178 and the additional conductive layer 142T of the gate structure 142 is higher than the interface between the bridge contact structure 178 and the S/D contact structure 170.

In some embodiments, the dielectric layer 176 and the dielectric layer 180 include silicon oxide, silicon nitride, silicon oxynitride, phosphosilicate glass (PSG), borophosphosilicate glass (BPSG), and/or other applicable low-k dielectric materials. The dielectric layer 176 and the dielectric layer 180 may be formed by chemical vapor deposition (CVD), physical vapor deposition, (PVD), atomic layer deposition (ALD), or other applicable processes.

In some embodiments, the bridge contact structure 178 is made of a conductive material including aluminum (Al), copper (Cu), tungsten (W), titanium (Ti), tantalum (Ta), other applicable conductive materials, or a combination thereof. In some embodiments, the conductive layer 174 is formed by chemical vapor deposition (CVD), physical vapor deposition (PVD), plasma enhanced CVD (PECVD), atomic layer deposition (ALD), or any other applicable deposition processes.

Figure 6:
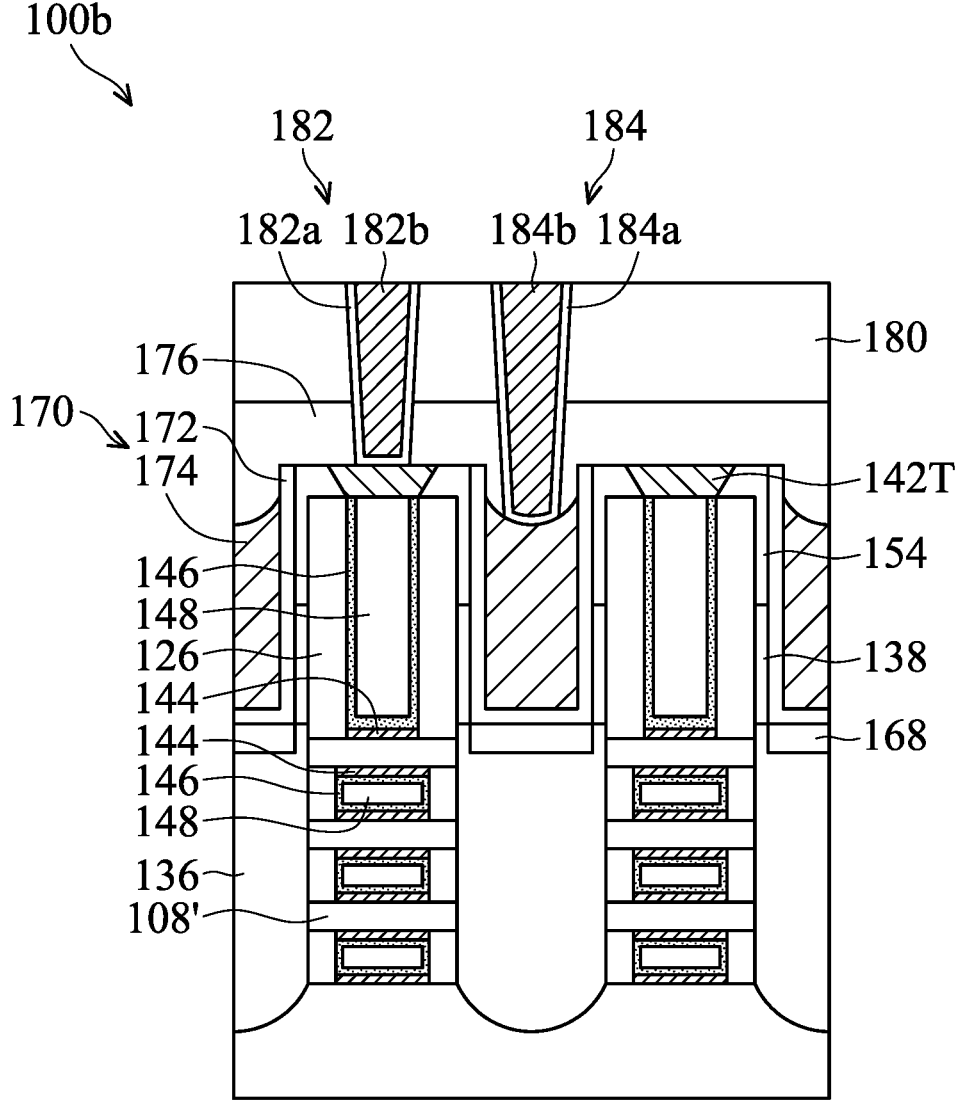
FIG. 6 illustrates a cross-sectional representation of a semiconductor structure 100b, in accordance with some embodiments.

FIG. 6 illustrates a cross-sectional representation of a semiconductor structure 100b, in accordance with some embodiments. The semiconductor structure 100b of FIG. 6 includes elements that are similar to, or the same as, elements of the semiconductor structure 100a of FIG. 5M, the difference between the FIG. 6 and FIG. 5M is that a gate contact structure 182 is formed on the additional conductive layer 142T, and an S/D conductive plug 184 is formed on the S/D contact structure 170. Furthermore, a portion of the dielectric layer 176 is lower than the surface of the gate spacer layer 126.

The gate contact structure 182 includes a barrier layer 182*a* and a conductive layer 182*b* surrounding by the barrier layer 182*a*. The S/D conductive plug 184 includes a barrier layer 184*a* and a conductive layer 184*b* surrounding by the barrier layer 184*a*. In some embodiments, the interface between the gate contact structure 182 and the additional conductive layer 142T of the gate structure 142 is higher than the interface between the S/D conductive plug 184 and the S/D contact structure 170.

In some embodiments, the barrier layers 182*a*, 184*a* are made of tantalum nitride, although other materials, such as tantalum (Ta), titanium (Ti), titanium nitride (TiN), tantalum nitride (TaN) or applicable material. The barrier layers 182*a*, 184*a* may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes.

In some embodiments, the conductive layers 182*b*, 184*b* are made of a conductive material including aluminum (Al), copper (Cu), tungsten (W), titanium (Ti), tantalum (Ta), titanium nitride (TiN), cobalt, tantalum nitride (TaN), nickel silicide (NiS), cobalt silicide (CoSi), copper silicide, tantalum carbide (TaC), tantalum silicide nitride (TaSiN), tantalum carbide nitride (TaCN), titanium aluminide (TiAl), titanium aluminum nitride (TiAlN), other applicable conductive materials, or a combination thereof. In some embodiments, the conductive layers 182*b*, 184*b* are formed by chemical vapor deposition (CVD), physical vapor deposition (PVD), plasma enhanced CVD (PECVD), plasma enhanced physical vapor deposition (PEPVD), atomic layer deposition (ALD), or any other applicable deposition processes.

FIGS. 7A to 7L illustrate cross-sectional representations of various stages of manufacturing a semiconductor structure 100*c* shown along line A-A' in FIG. 1E and along line A-A' of FIG. 2 after FIG. 4, in accordance with some embodiments.

Figure 7A:
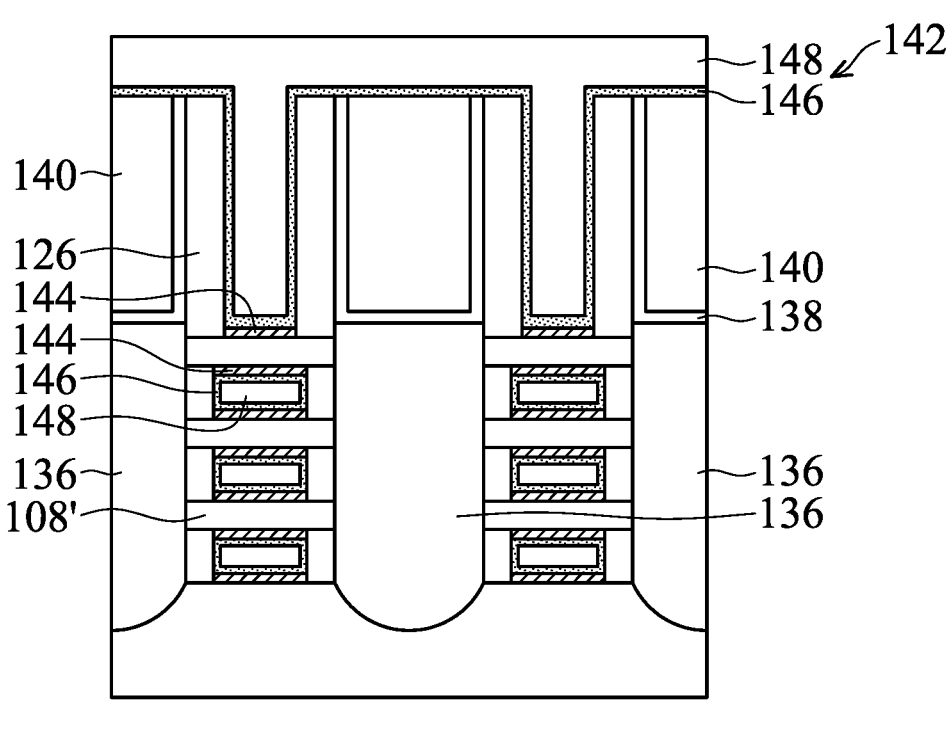
FIGS. 7A to 7L illustrate cross-sectional representations of various stages of manufacturing a semiconductor structure shown along line A-A' in FIG. 1E and along line A-A' of FIG. 2 after FIG. 4, in accordance with some embodiments.

As shown in FIG. 7A, the gate structure 142 including the gate electrode layer 148 and the gate dielectric layer 146 is formed over the nanostructures 108'. The gate electrode layer 148 has a T-shaped structure.

Figure 7B:
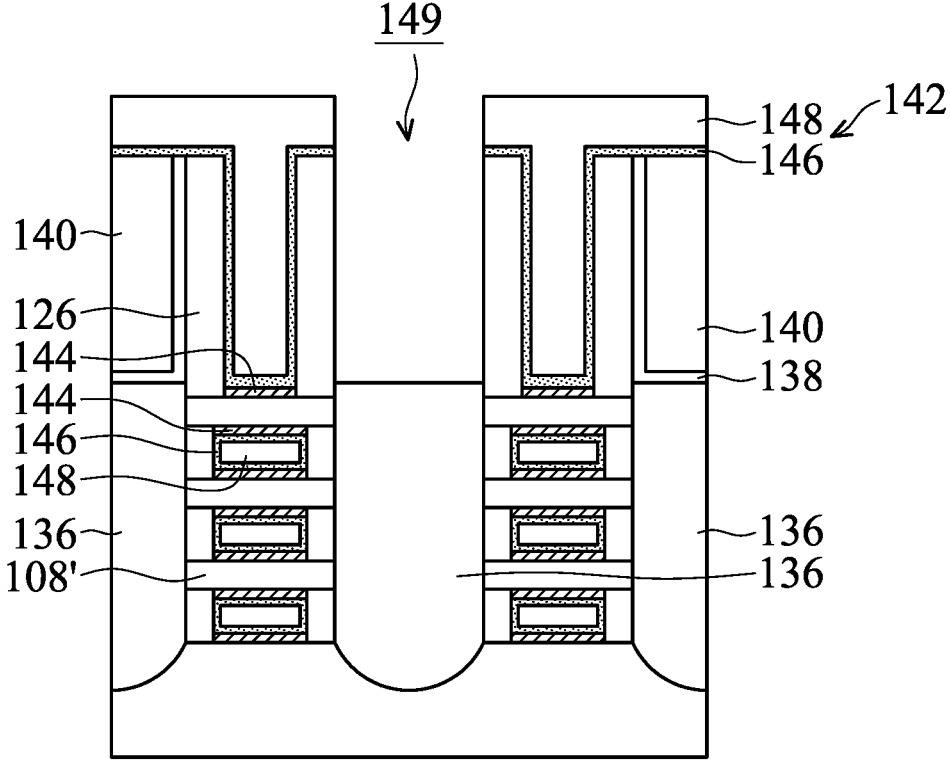

Next, as shown in FIG. 7B, a portion of the gate structure 148, apportion of the gate dielectric layer 146, a portion of the ILD layer 140 are removed to form a trench 149, in accordance with some embodiments. As a result, the top surface of the S/D structure 136 is exposed.

Figure 7C:
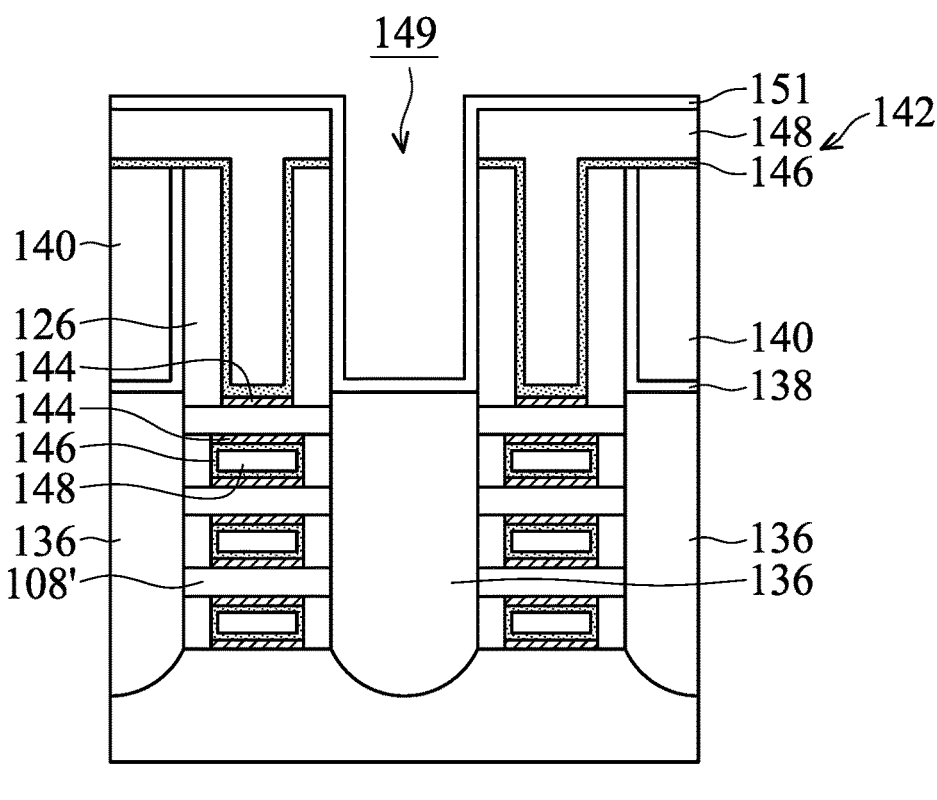

Next, as shown in FIG. 7C, a barrier layer 151 is formed in the trench 149 and over the gate electrode layer 148, in accordance with some embodiments. More specifically, the barrier layer 151 is conformally formed in the trench 149 and on the gate electrode layer 148, the ILD layer 140 and the exposed top surface of the S/D structure 136.

In some embodiments, the barrier layer 151 is made of tantalum nitride, although other materials, such as tantalum (Ta), titanium (Ti), titanium nitride (TiN), tantalum nitride (TaN) or applicable material. The barrier layer 151 may be formed using a process such as chemical vapor deposition (CVD), physical vapor deposition (PVD), plasma enhanced CVD (PECVD), atomic layer deposition (ALD), or any other applicable deposition processes.

Figure 7D:
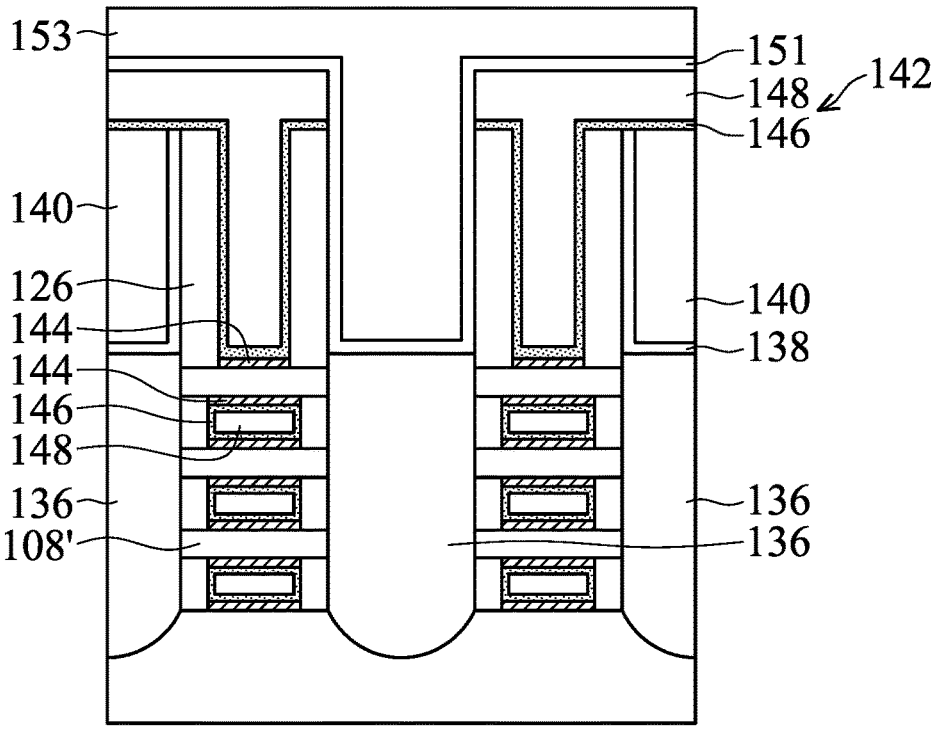

Afterwards, as shown in FIG. 7D, a dielectric layer 153 is formed on the barrier layer 151 and over the gate electrode layer 148 of the gate structure 142, in accordance with some embodiments.

In some embodiments, the dielectric layer 153 include silicon oxide, silicon nitride, silicon oxynitride, phosphosilicate glass (PSG), borophosphosilicate glass (BPSG), and/or other applicable low-k dielectric materials. The dielectric layer 153 may be formed by chemical vapor deposition (CVD), physical vapor deposition, (PVD), atomic layer deposition (ALD), or other applicable processes.

Figures 7E, 7F:
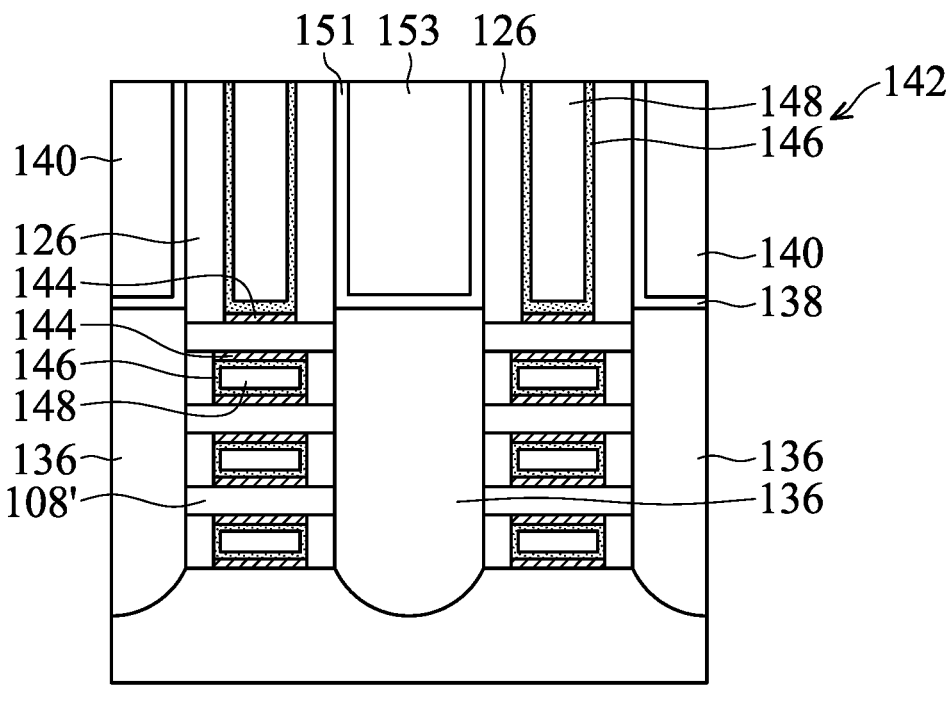

Next, as shown in FIG. 7E, a portion of the dielectric layer 153, a portion of the gate electrode layer 148 and a portion of the gate dielectric layer 146 of the gate structure 142 are removed, in accordance with some embodiments. In some embodiments, the portion of the dielectric layer 153 and a portion of the gate electrode layer 148 of the gate structure 142 are removed by a planarization process, such as CMP process. As a result, the top surface of the dielectric layer 153 is substantially coplanar with the top surface of the gate spacer layer 126.

Afterwards, as shown in FIG. 7F, the dielectric layer 153 is removed to form a trench 155, in accordance with some embodiments. A silicide layer 168 is formed on the top portion of the S/D structure 136.

Figure 7G:
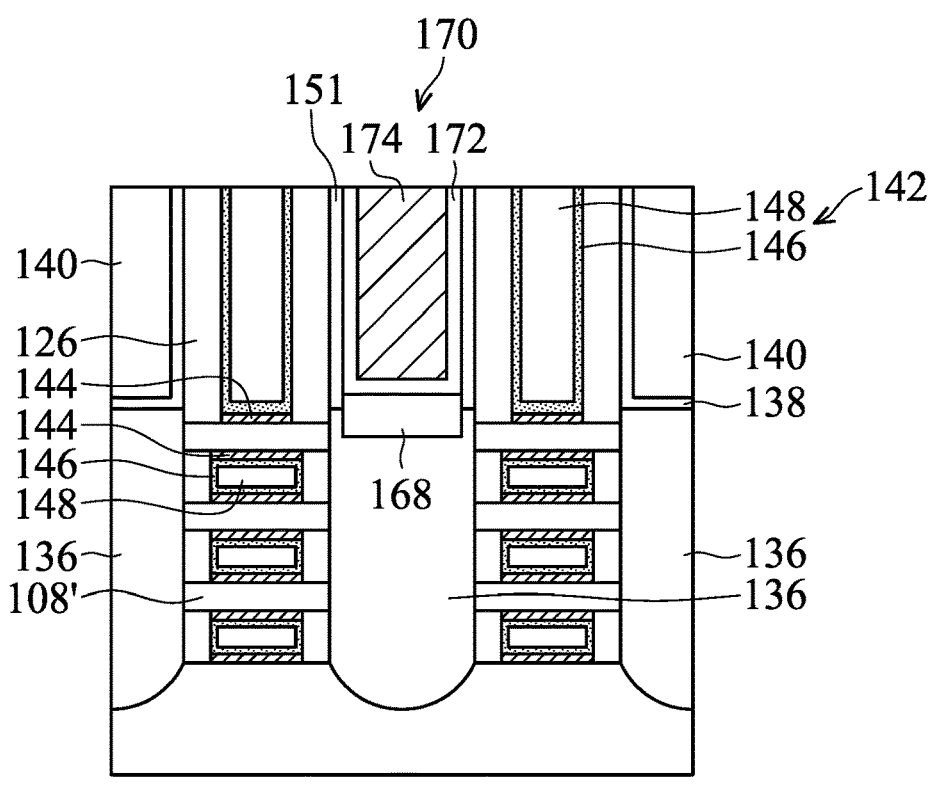

Next, as shown in FIG. 7G, the barrier material 172 and the conductive layer 174 are formed in the trench 155 and on the silicide layer 168 to form the S/D contact structure 170, in accordance with some embodiments.

Figure 7H:
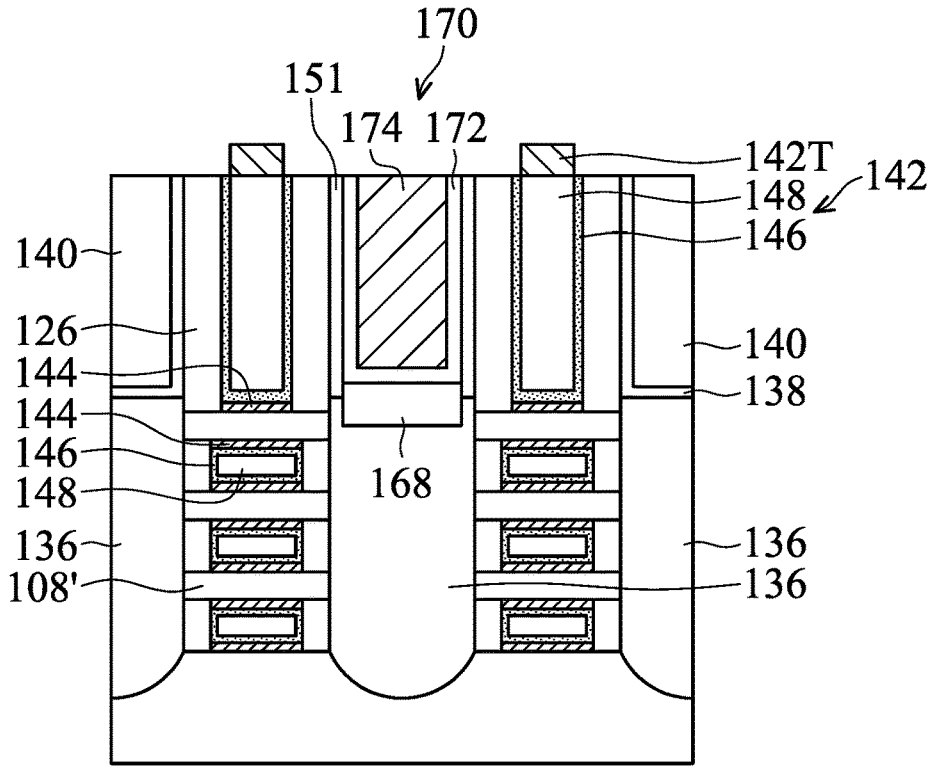

Afterwards, as shown in FIG. 7H, the additional conductive layer 142T is selectively formed on the gate electrode layer 148, in accordance with some embodiments. The additional conductive layer 142T is formed on the conductive material, not formed on the insulating material. The additional conductive layer 142T is an extending portion of the gate structure 142.

The additional conductive layer 142T protrudes upwardly from the top surface of the gate electrode layer 148. In addition, the top surface of the additional conductive layer 142T of the gate structure 142 is higher than the top surface of the gate spacer layer 126. In some embodiments, the additional conductive layer 142T has a rectangular shape.

Figure 7I:
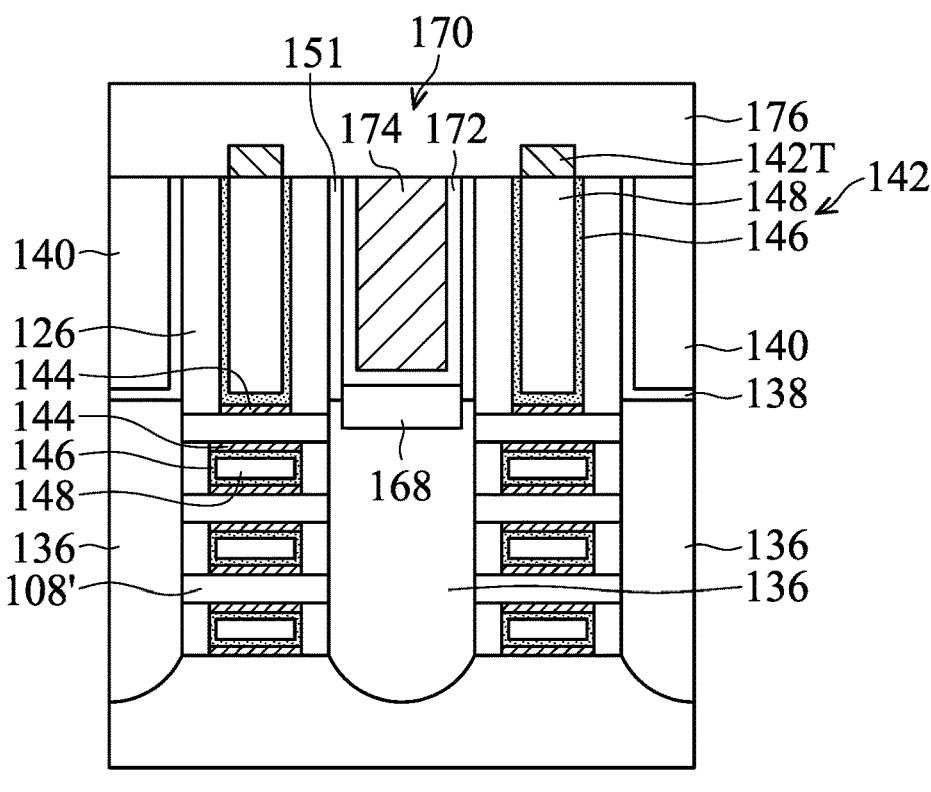

Next, as shown in FIG. 7I, the dielectric layer 176 is formed on the additional conductive layer 142T, the gate spacer layer 126 and the ILD layer 140, in accordance with some embodiments.

Figure 7J:
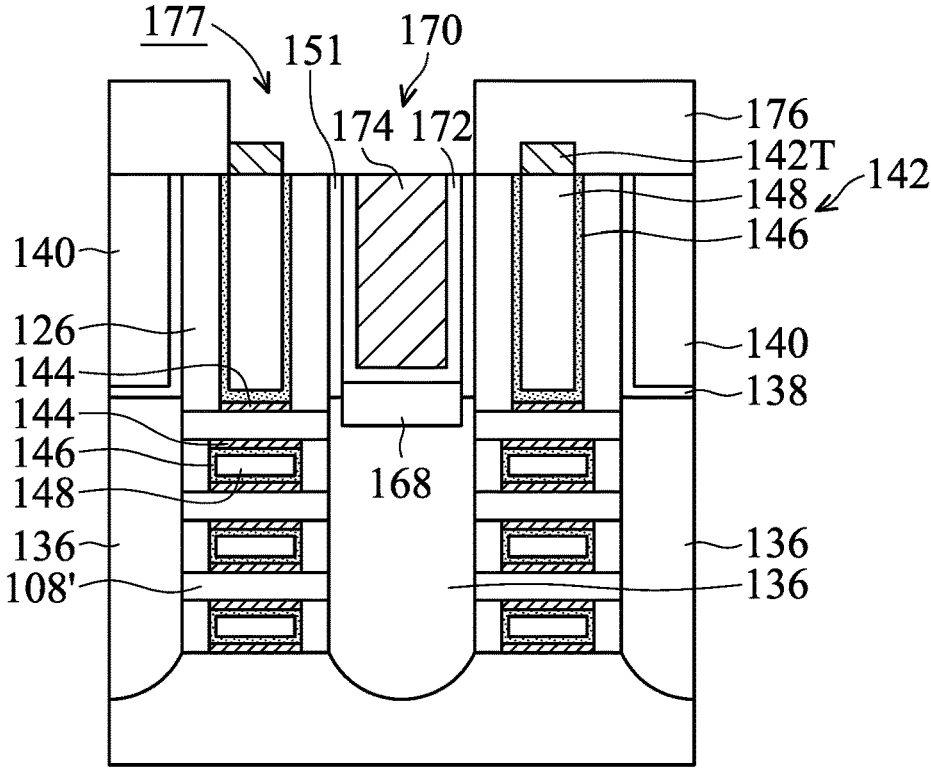

Afterwards, as shown in FIG. 7J, a portion of the dielectric layer 176 is removed to form an opening 177, in accordance with some embodiments. As a result, the additional conductive layer 142T and the top surface of the S/D contact structure 170 are exposed.

Figures 7K, 7L:
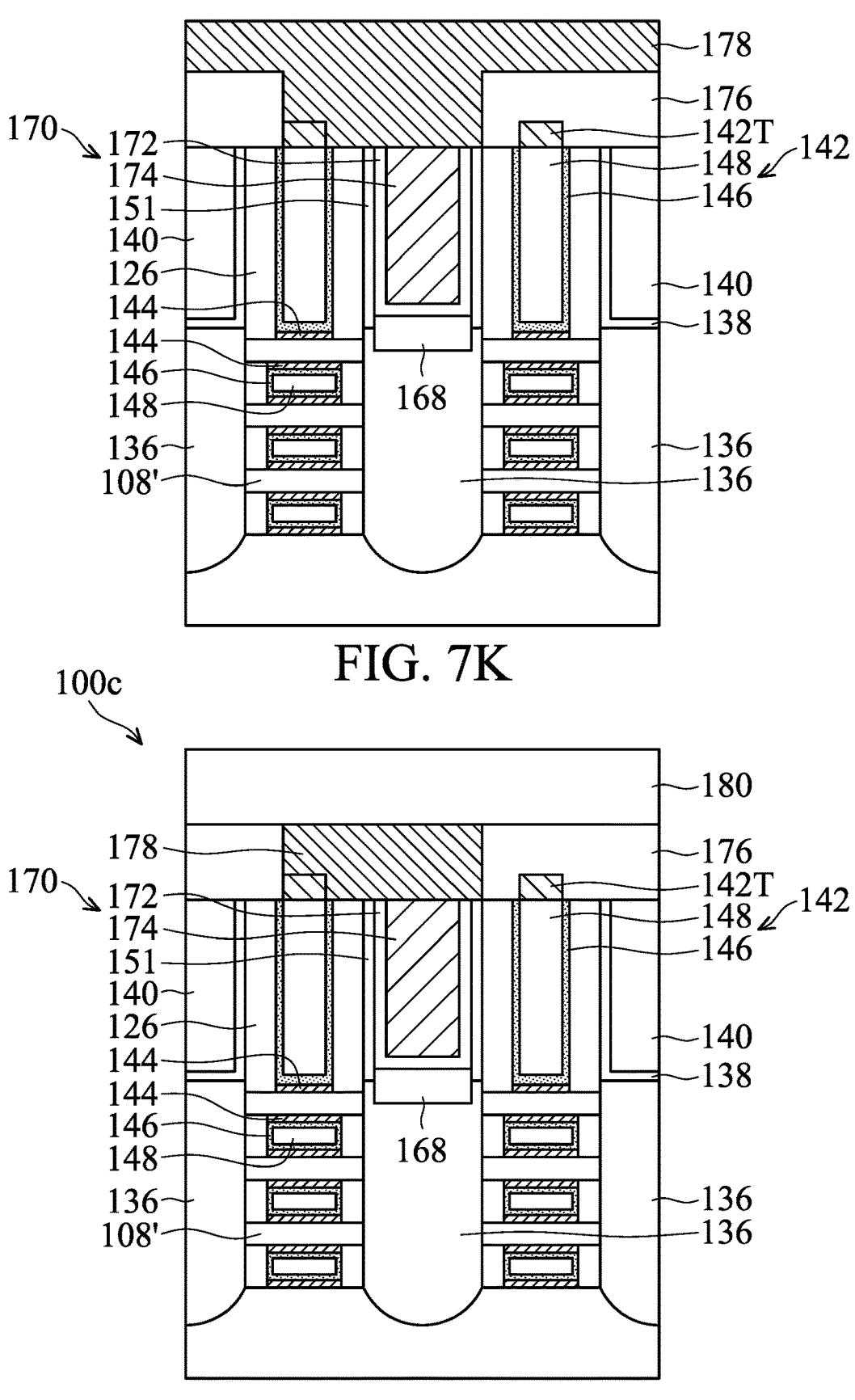

Next, as shown in FIG. 7K, the bridge contact structure 178 is formed in the opening 177 and on the additional conductive layer 142T and the S/D contact structure 170, in accordance with some embodiments. The bridge contact structure 178 is connected to the S/D contact structure 170 and the additional conductive layer 142T of the gate structure 142. The S/D contact structure 170 is electrically connected to the additional conductive layer 142T by the bridge contact structure 178.

Afterwards, as shown in FIG. 7L, a portion of the bridge contact structure 178 is removed, and then the dielectric layer 180 is formed on the bridge contact structure 178, in accordance with some embodiments. The additional conducive layer 142T provides more contact area for landing the gate contact structure 182 over the gate structure 142.

Figure 8A:
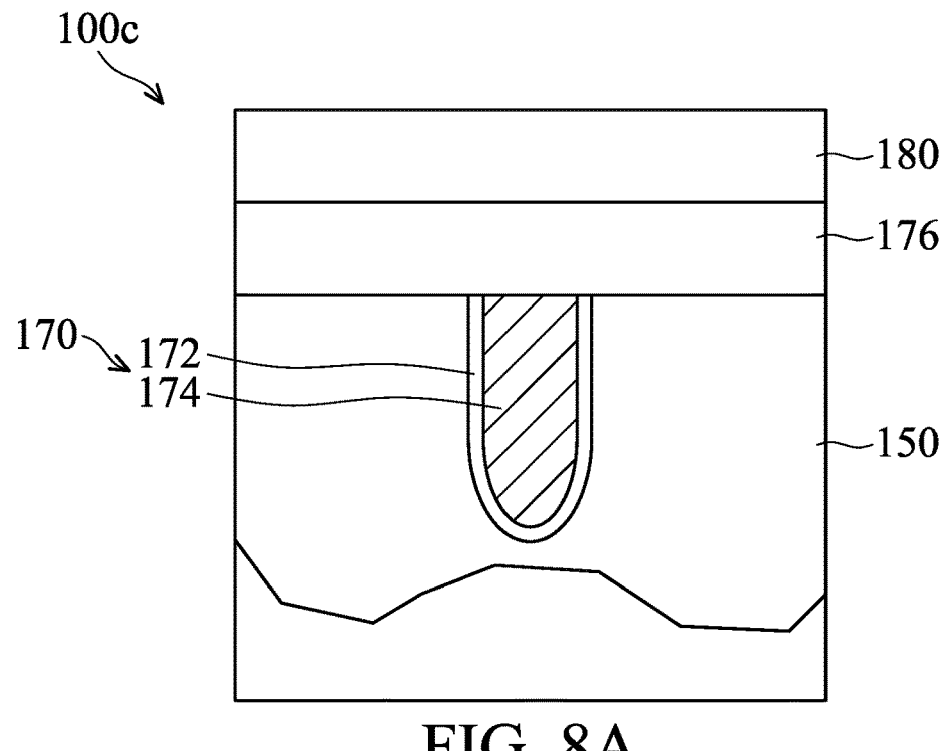
FIG. 8A illustrates a cross-sectional representation of the semiconductor structure shown along line C-C' of FIG. 4, in accordance with some embodiments.

FIG. 8A illustrates a cross-sectional representation of the semiconductor structure 100c shown along line C-C' of FIG. 4, in accordance with some embodiments.

As shown in FIG. 8A, the S/D contact structure 170 is embedded in the gate isolation structure 150. In addition, the dielectric layer 176 and the dielectric layer 180 are formed over the gate isolation structure 150.

Figure 8B:
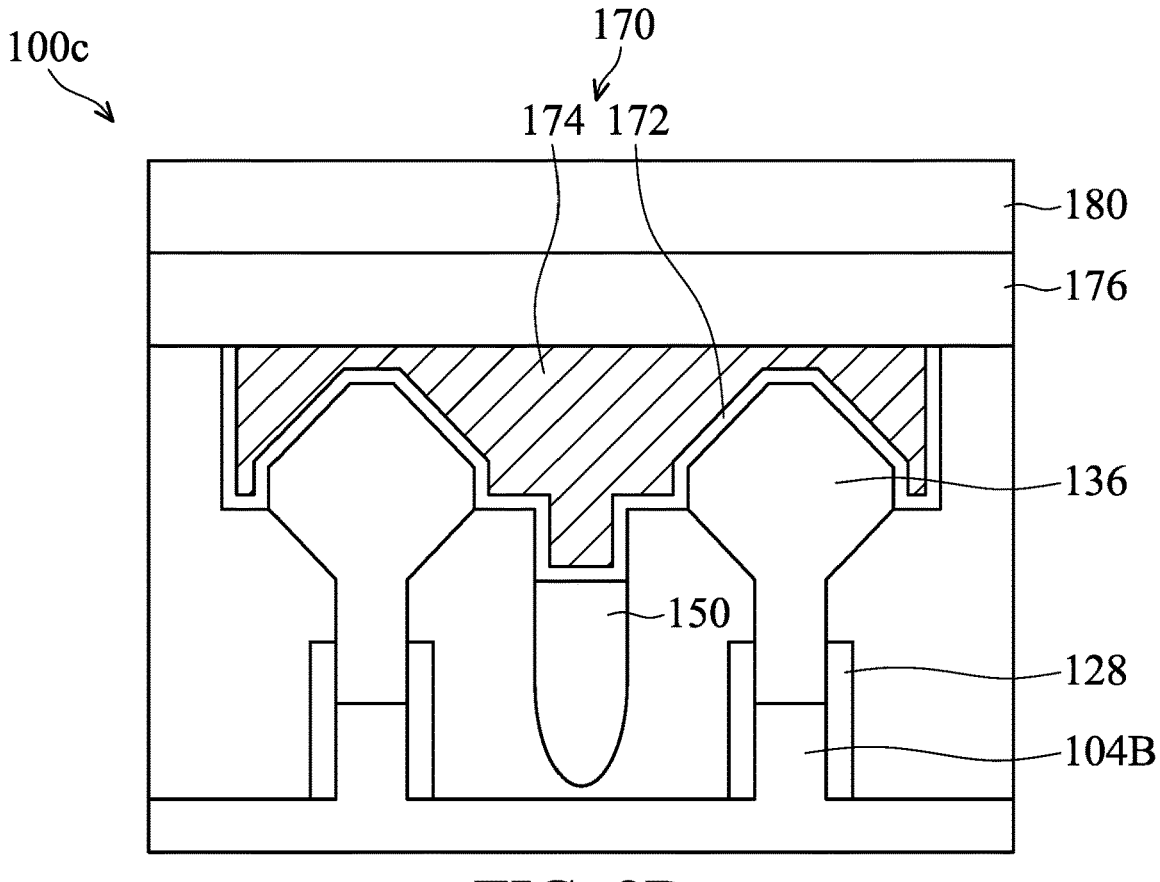
FIG. 8B illustrates a cross-sectional representation of the semiconductor structure shown along line D-D' of FIG. 4, in accordance with some embodiments.

FIG. 8B illustrates a cross-sectional representation of the semiconductor structure 100c shown along line D-D' of FIG. 4, in accordance with some embodiments.

As shown in FIG. 8B, the S/D contact structure 170 is a merged epitaxial structure and formed on the S/D structures 136 and the gate isolation structure 150. The S/D contact structure 170 is formed across the two adjacent S/D structures 136.

Figure 9:
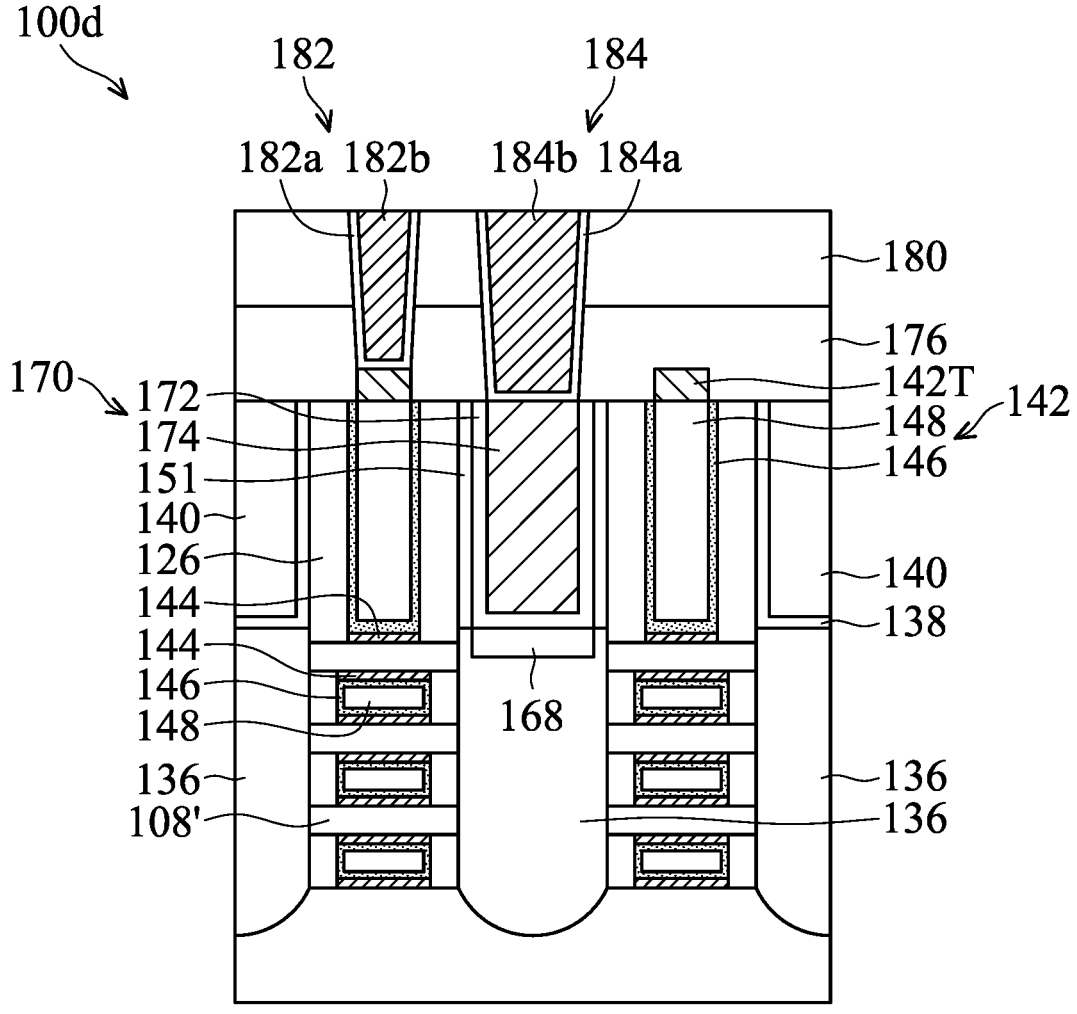
FIG. 9 illustrates a cross-sectional representation of a semiconductor structure, in accordance with some embodiments.

FIG. 9 illustrates a cross-sectional representation of a semiconductor structure 100d, in accordance with some embodiments. The semiconductor structure 100d of FIG. 9 includes elements that are similar to, or the same as, elements of the semiconductor structure 100a of FIG. 5M, the difference between the FIG. 9 and FIG. 6 is that the S/D conductive plug 184 is formed on the S/D contact structure 170 which is not recessed.

Figure 10A:
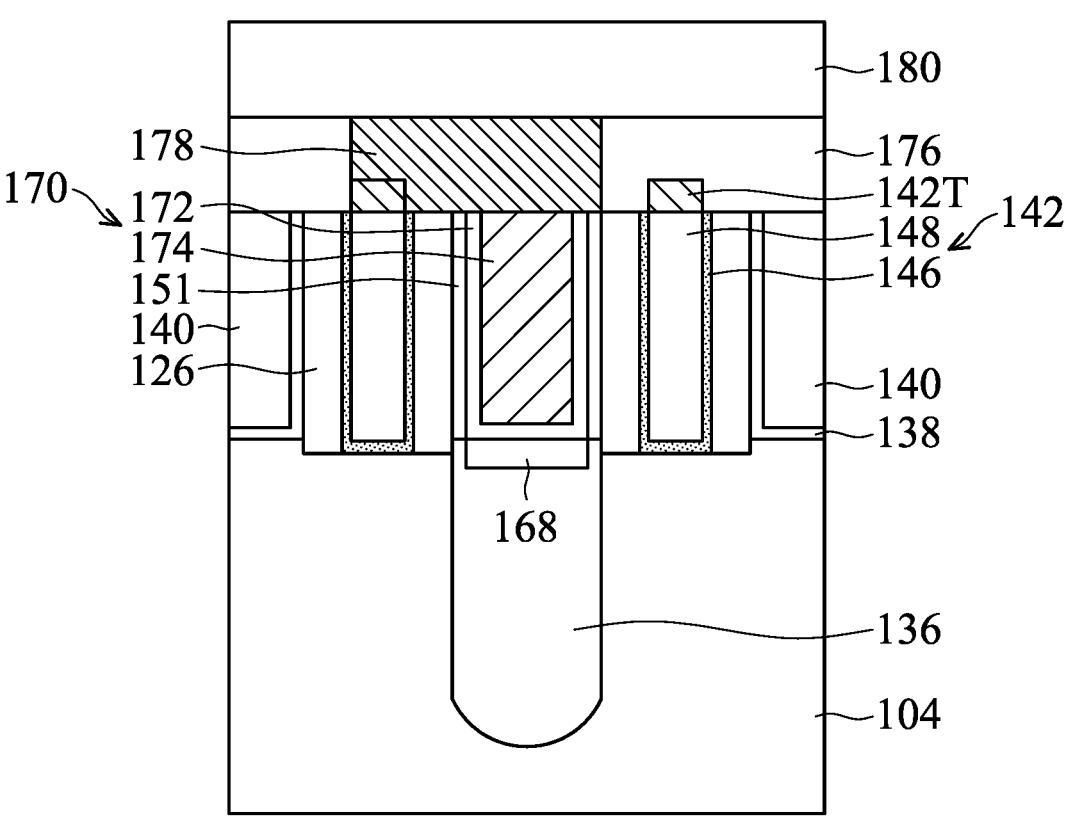
FIG. 10A illustrates a cross-sectional representation of a semiconductor structure, in accordance with some embodiments.

FIG. 10A illustrates a cross-sectional representation of a semiconductor structure 100e, in accordance with some embodiments. The semiconductor structure 100e of FIG. 10A includes elements that are similar to, or the same as, elements of the semiconductor structure 100c of FIG. 7L, the difference between the FIG. 10A and FIG. 7L is that the gate structure 142 and the S/D structure 136 are formed over the fin structure 104. The semiconductor structure 100e of FIG. 10A is a FinFET structure, and the semiconductor structure 100c of FIG. 7L is a GAA structure.

Figure 10B:
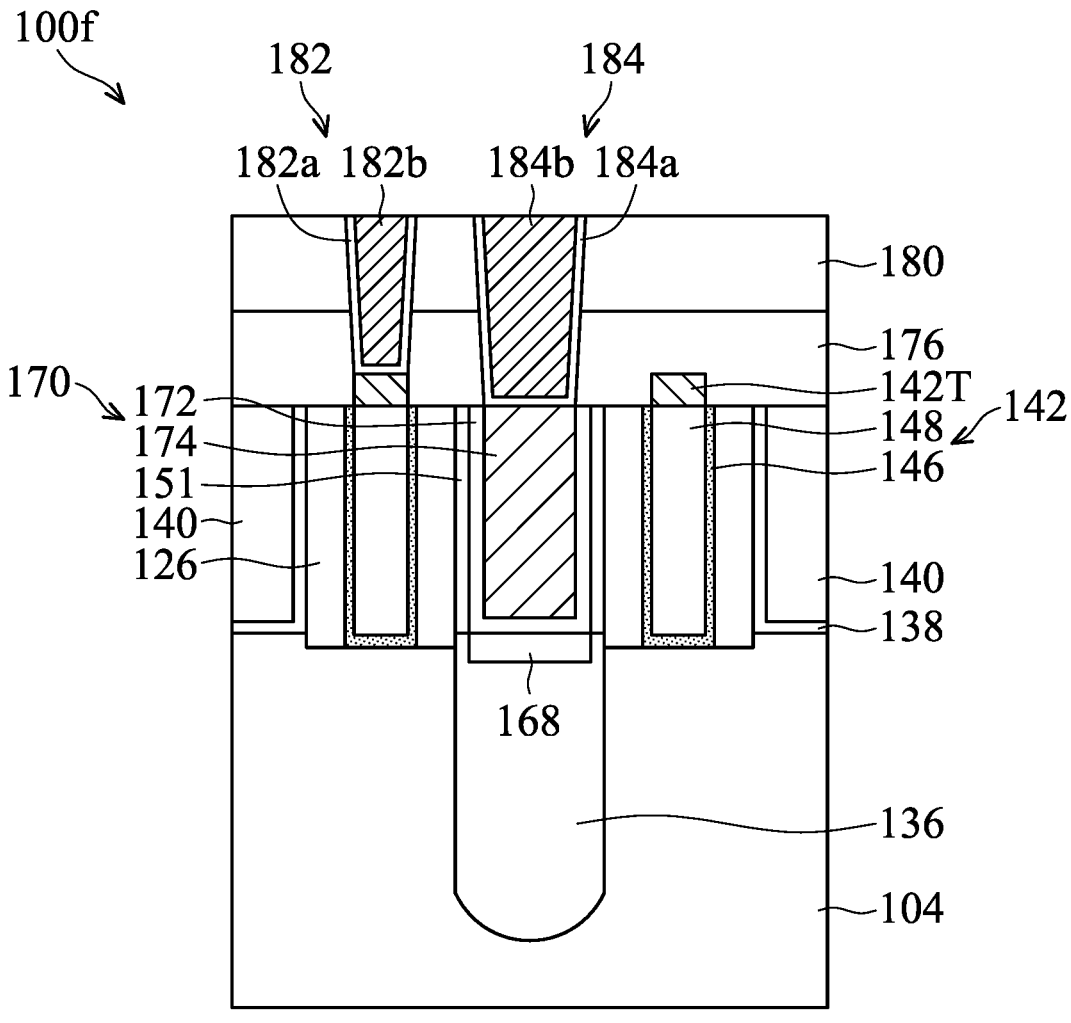
FIG. 10B illustrates a cross-sectional representation of a semiconductor structure, in accordance with some embodiments.

FIG. 10B illustrates a cross-sectional representation of a semiconductor structure 100f, in accordance with some embodiments. The semiconductor structure 100f of FIG. 10B includes elements that are similar to, or the same as, elements of the semiconductor structure 100d of FIG. 9, the difference between the FIG. 10B and FIG. 9 is that the gate structure 142 and the S/D structure 136 are formed over the fin structure 104. The semiconductor structure 100f of FIG. 10B is a FinFET structure, and the semiconductor structure 100d of FIG. 9 is a GAA structure.

Figure 11:
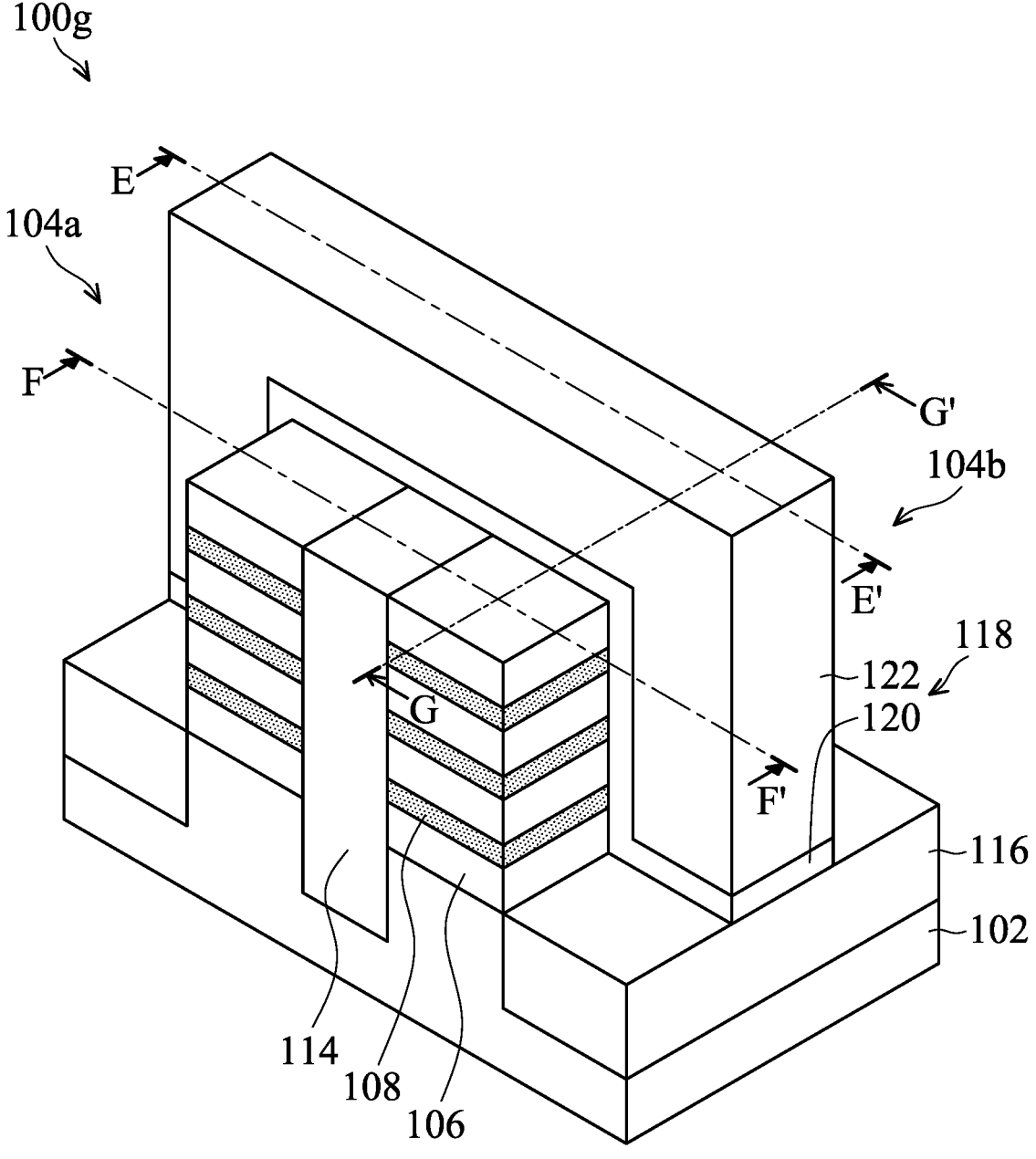
FIG. 11 illustrates a perspective view of a semiconductor structure, in accordance with some embodiments.

FIG. 11 illustrates a perspective view of a semiconductor structure 100g, in accordance with some embodiments. The semiconductor structure 100g is a forksheet structure.

As shown in FIG. 11, the substrate 102 includes a first region 10 and a second region 20. A dielectric wall 114 is between the first fin structure 104a and the second fin structure 104b. Each of the first fin structure 104a and the second fin structure 104b includes a number of the first semiconductor layers 106 and the second semiconductor layers 108. The dummy gate structure 118 is formed across the first fin structure 104a, the second fin structure 104b, dielectric wall 114 and the isolation structure 116. The dummy gate structure 118 includes the dummy gate dielectric layer 120 and the dummy gate electrode layer 122.

FIGS. 12A to 12G illustrate cross-sectional representations of various stages of manufacturing the semiconductor structure 100g shown along line E-E' in FIG. 11, in accordance with some embodiments.

Figure 12A:
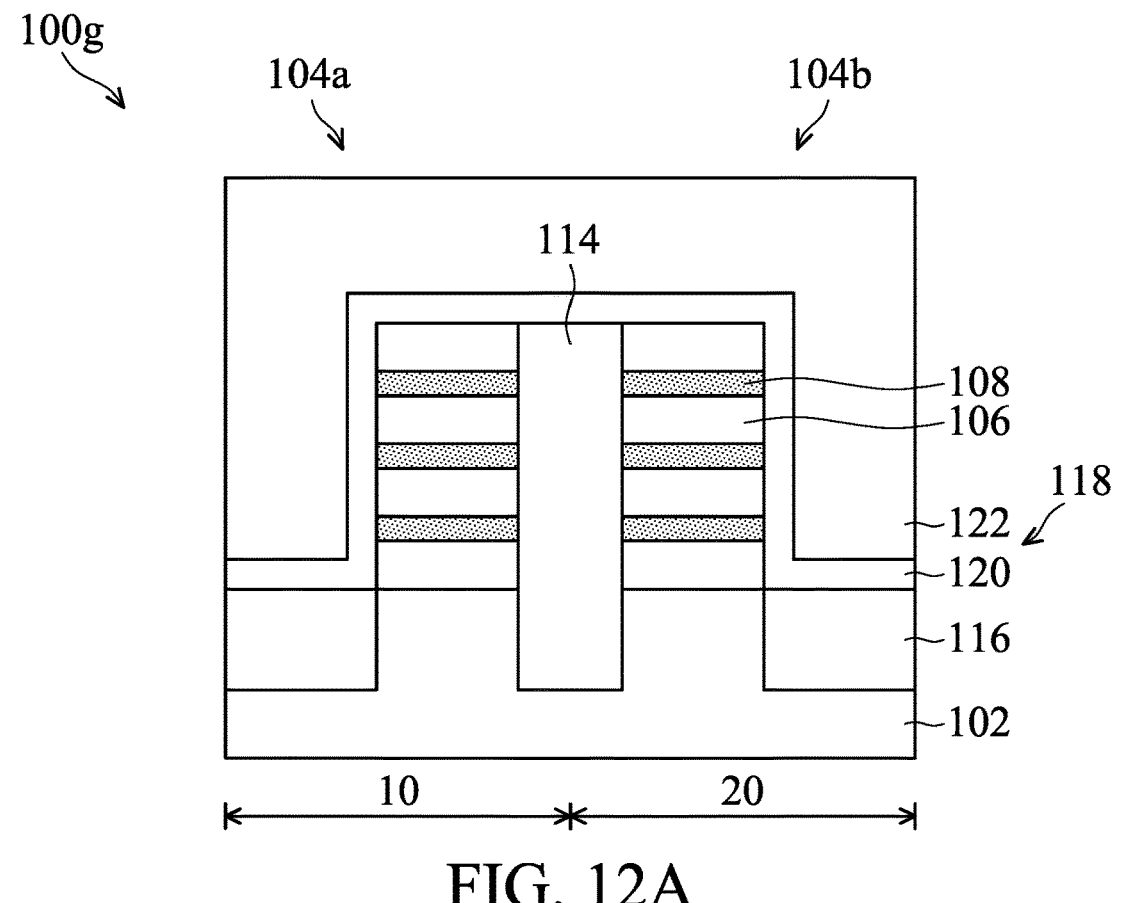
FIGS. 12A to 12G illustrate cross-sectional representations of various stages of manufacturing the semiconductor structure shown along line E-E' in FIG. 11, in accordance with some embodiments.

As shown in FIG. 12A, the dummy gate structure 118 is formed across the first fin structure 104a, the second fin structure 104b, dielectric wall 114 and the isolation structure 116. The dummy gate structure 118 includes the dummy gate dielectric layer 120 and the dummy gate electrode layer 122.

Figure 12B:
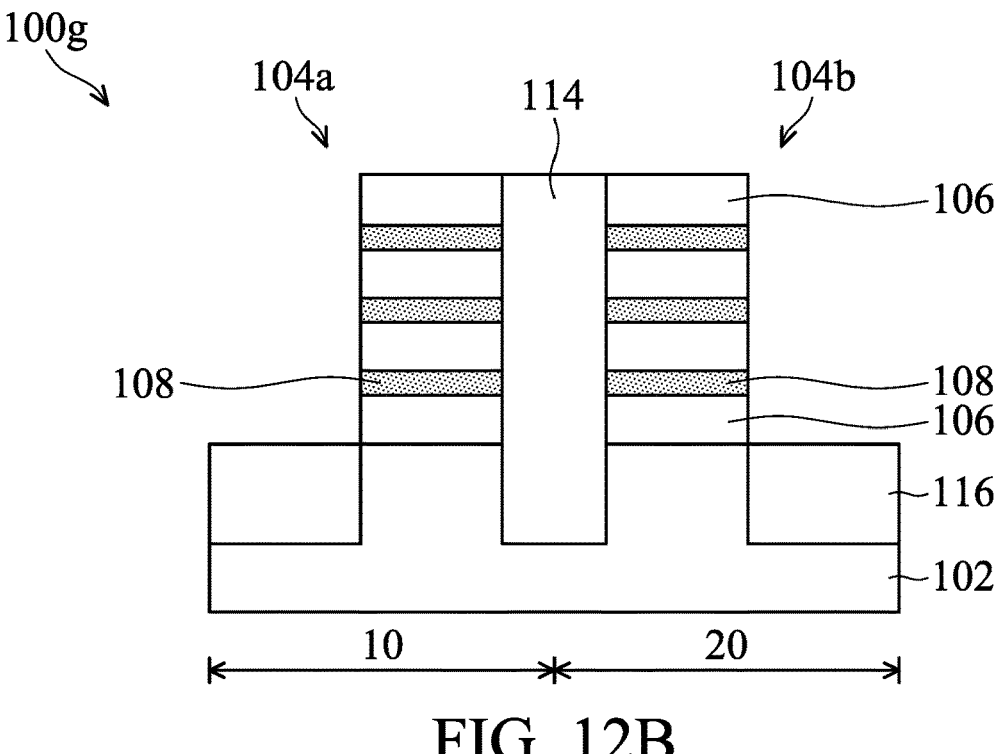

Next, as shown in FIG. 12B, the dummy gate structure 118 is removed to expose the first stack structure 104a and the second stack structure 104b, in accordance with some embodiments. As a result, the dielectric wall 114 is exposed. It should be noted that, the dielectric wall 114 along line E-E' in FIG. 11, is directly below the dummy gate structure 118 and protected by the dummy gate structure 118, it is not removed when the process for forming the first S/D structure 136a and the second S/D structure 136b (shown in FIGS. 13A and 13B).

The removal process may include one or more etching processes. For example, when the dummy gate electrode layer 122 is polysilicon, a wet etchant such as a tetramethylammonium hydroxide (TMAH) solution may be used to selectively remove the dummy gate electrode layer 122. Afterwards, the dummy gate dielectric layer 120 may be removed using a plasma dry etching, a dry chemical etching, and/or a wet etching.

Figure 12C:
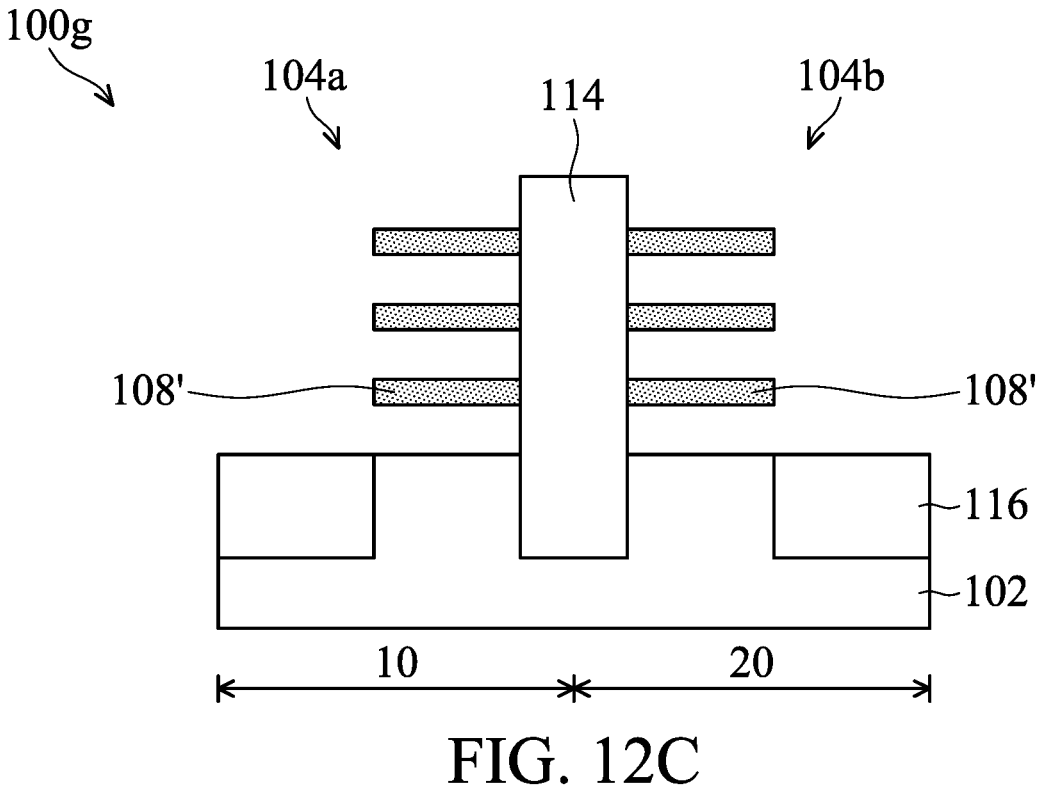

Afterwards, as shown in FIG. 12C, the first semiconductor material layers 106 are removed to form nanostructures 108' with the second semiconductor material layers 108, in accordance with some embodiments. The dielectric wall 114 is between the first nanostructures 108' of the first stack structure 104a in the first region 10 and the nanostructures 108' of the second stack structure 104b in the second region 20. The nanostructures 108' are connected to the dielectric wall 114. The top surface of the dielectric wall 114 is higher than the top surface of the topmost nanostructure 108'. The first S/D structure 136a and the second S/D structure 136b are attached to and connected to the nanostructures 108'.

The first semiconductor material layers 106 may be removed by performing a selective wet etching process, such as APM (e.g., ammonia hydroxide-hydrogen peroxide-water mixture) etching process. For example, the wet etching process uses etchants such as ammonium hydroxide ($NH_4OH$), TMAH, ethylenediamine pyrocatechol (EDP), and/or potassium hydroxide (KOH) solutions.

Figure 12D:
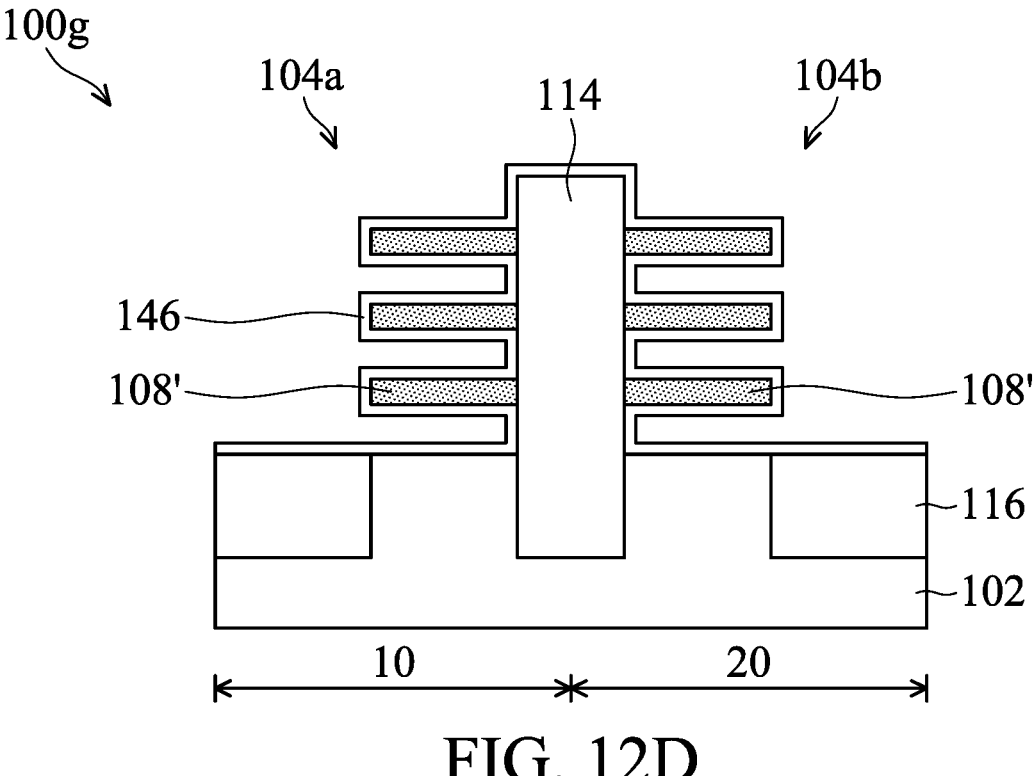

Next, as shown in FIG. 12D, after the nanostructures 108' are formed, a gate dielectric layer 146 is formed to surround the nanostructures 108' and over the isolation structure 110, in accordance with some embodiments. Furthermore, an interfacial layer (not shown) may be formed before forming the gate dielectric layer 146. The gate dielectric layer 146 is in direct contact with the dielectric wall 114.

In some embodiments, the interfacial layer is oxide layer formed around the nanostructures 108'. In some embodiments, the interfacial layer is formed by performing a thermal process. In some embodiments, the gate dielectric layers 146 are formed over the interfacial layers, so that the nanostructures 108' are surrounded (e.g. wrapped) by the gate dielectric layers 146. In some embodiments, the gate dielectric layers 146 are made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$—$Al2O_3$) alloy, another suitable high-k dielectric material, or a combination thereof. In some embodiments, the gate dielectric layers 146 are formed using chemical vapor deposition (CVD), atomic layer deposition (ALD), another applicable method, or a combination thereof.

Figure 12E:
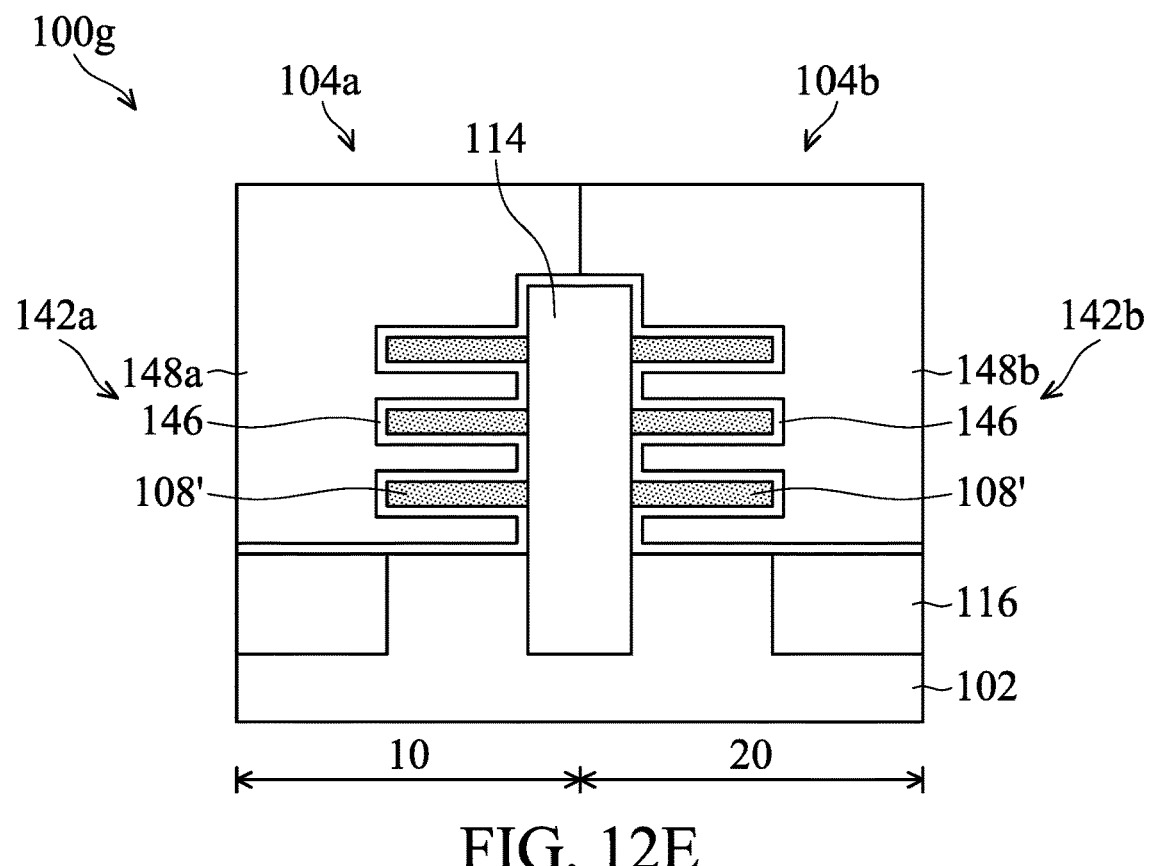

Afterwards, as shown in FIG. 12E, a first gate electrode layer 148a is formed in the first region 10 to surround the nanostructures 108' of the first stack structure 104a, in accordance with some embodiments. The first gate electrode layer 148a formed across the nanostructures 108' (shown in FIG. 3). The first gate structure 142a is constructed by the interfacial layer (not shown), the gate dielectric layer 146, and the first gate electrode layer 148*a*.

A second gate electrode layer 148*b* is formed in the second region 20 to surround the nanostructures 108', in accordance with some embodiments. The second gate structure 142*b* is constructed by the interfacial layer (not shown), the gate dielectric layer 146, and the second gate electrode layer 148*b*. The material of the second gate electrode layer 148*b* is different from that of the first gate electrode layer 148*a*. There is an interface between the first gate electrode layer 148*a* and the second gate electrode layer 148*b*.

Figure 12F:
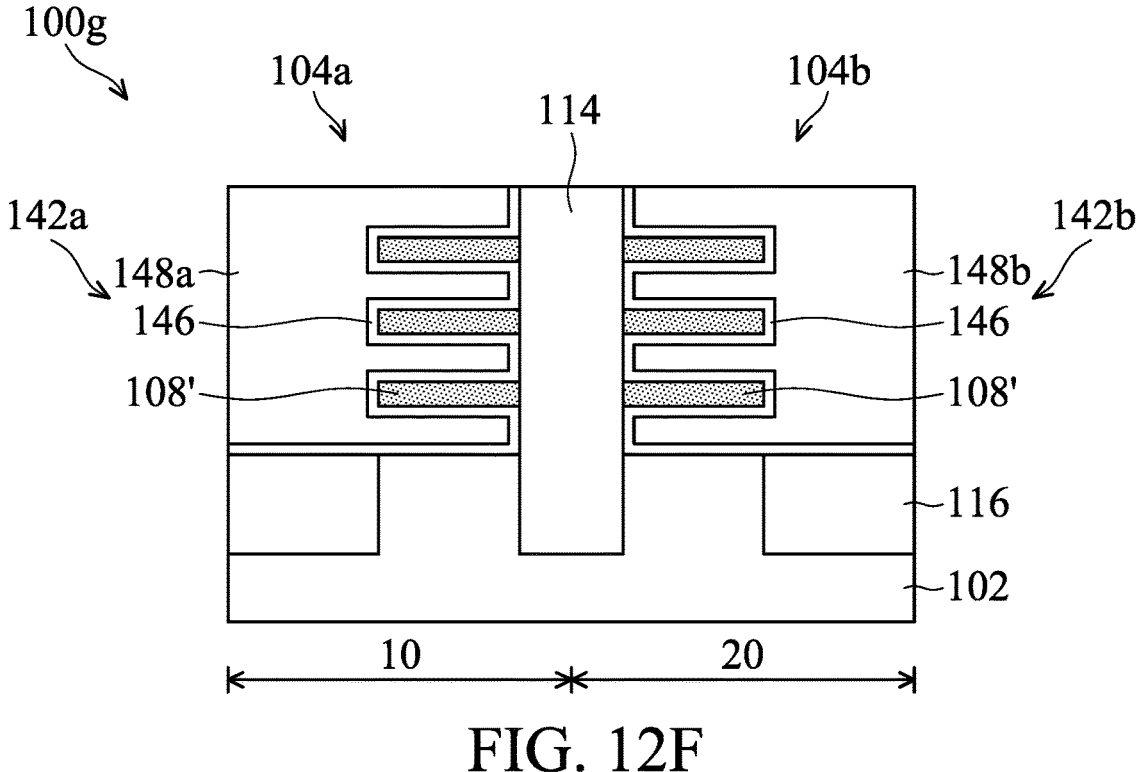

Next, as shown in FIG. 12F, the top portion of the first gate structure 142*a* and the top portion of the second gate structure 142*b* are removed, in accordance with some embodiments. In addition, the top portion of the gate dielectric layer 146 is removed to expose the dielectric wall 114.

Figure 12G:
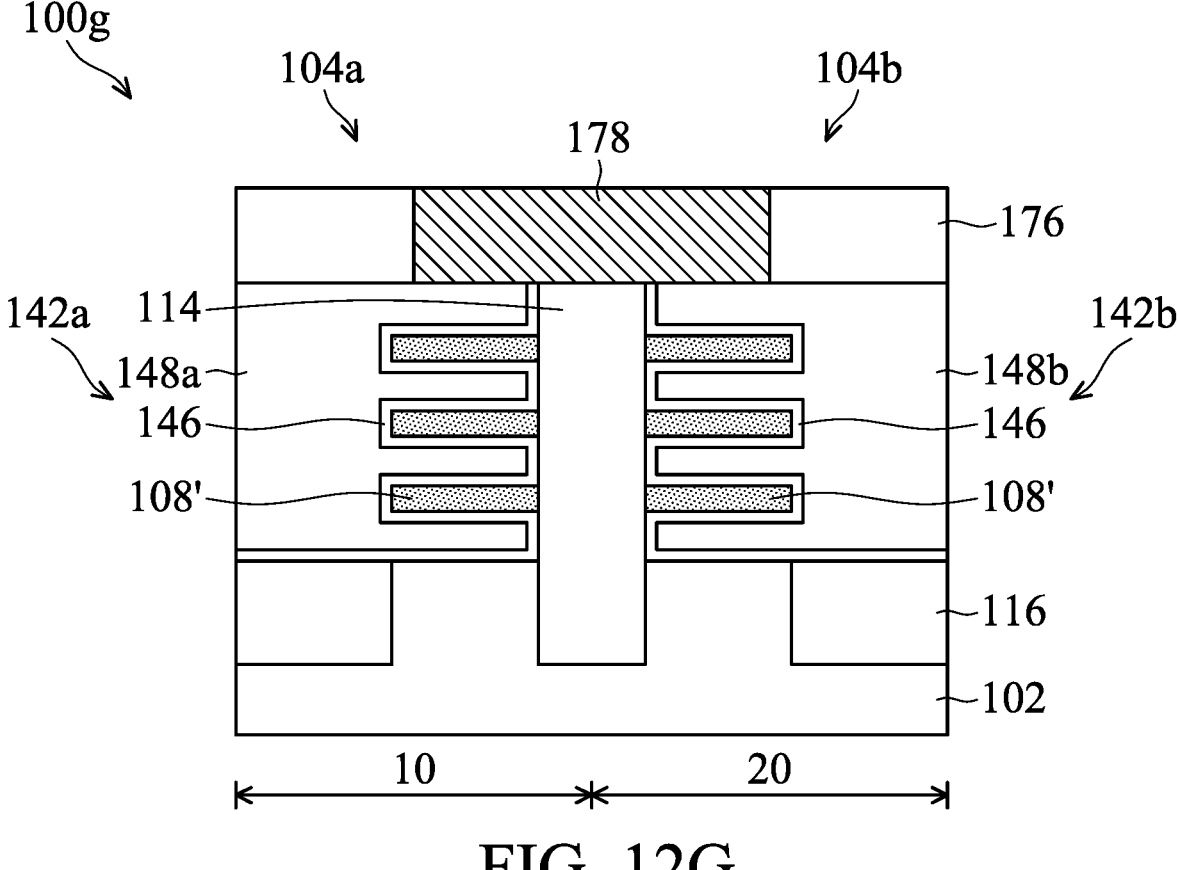

Afterwards, as shown in FIG. 12G, the dielectric layer 176 is formed over the first gate structure 142*a* and the second gate structure 142*b*, and the bridge contact structure 178 is embedded in the dielectric layer 176, in accordance with some embodiments. The bridge contact structure 178 is connected to the first gate structure 142*a* and the second gate structure 142*b*.

Figure 13A:
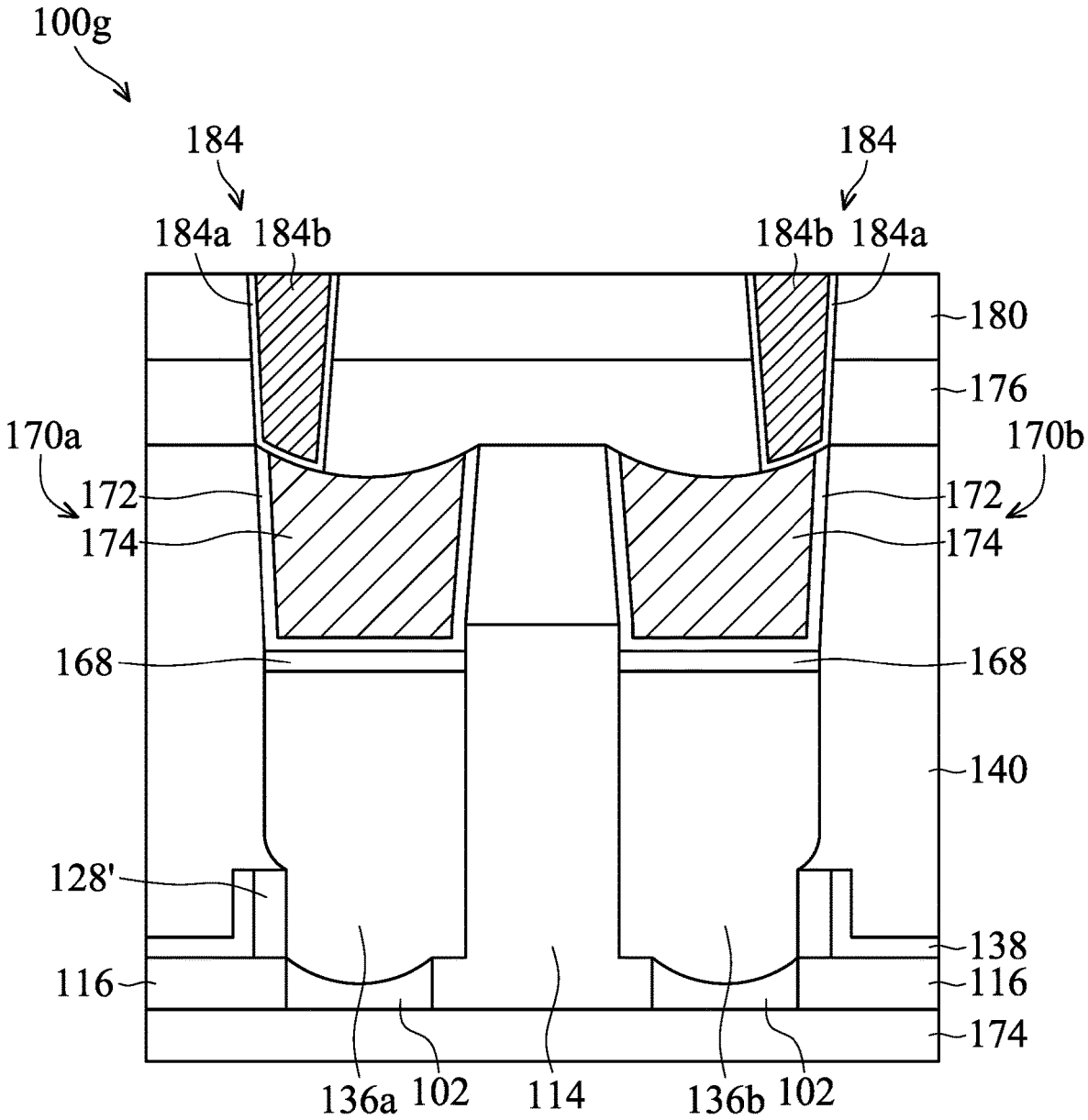
FIG. 13A illustrates a cross-sectional representation of the semiconductor structure shown along line F-F' in FIG. 11, in accordance with some embodiments.

FIG. 13A illustrates a cross-sectional representation of the semiconductor structure 100*g* shown along line F-F' in FIG. 11, in accordance with some embodiments.

As shown in FIG. 13A, the dielectric wall 114 is between the first S/D structure 136*a* and the second S/D structure 136*b*. The silicide layer 168 is formed on the first S/D structure 136*a*, and the first S/D contact structure 170*a* is formed on the silicide layer 168. The silicide layer 168 is formed on the second S/D structure 136*b*, and the second S/D contact structure 170*b* is formed on the silicide layer 168. The first S/D contact structure 170*a* is recessed to form the recessed top surface, and the second S/D contact structure 170*b* is recessed to form the recessed top surface. The first S/D conductive plug 184*a* is formed on the recessed first S/D contact structure 170*a*, and the second S/D conductive plug 184*b* is formed on the recessed second S/D contact structure 170*b*.

Figure 13B:
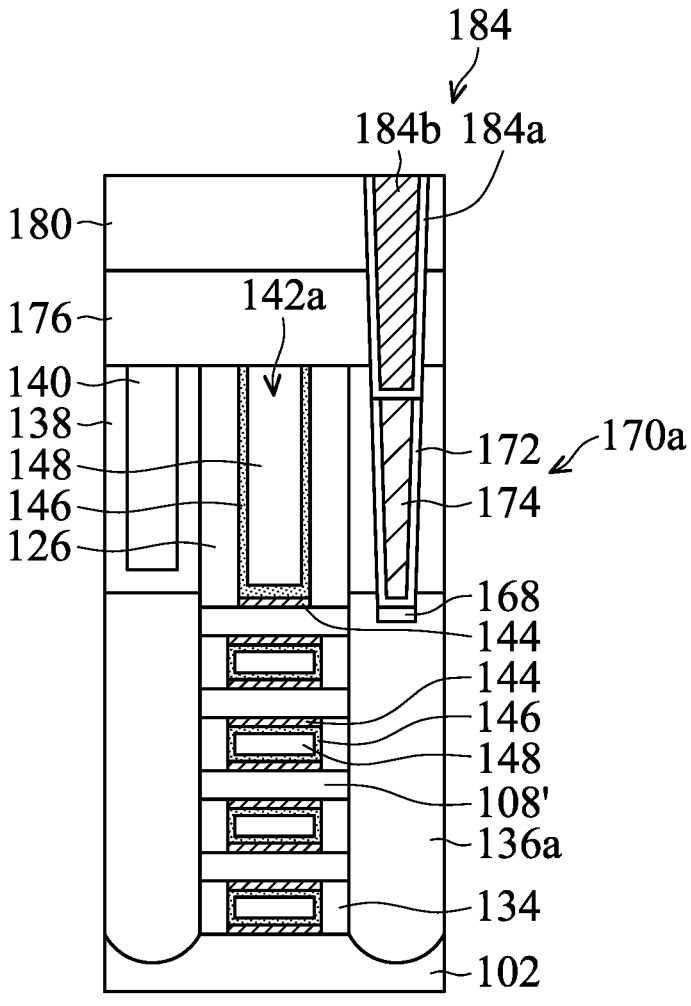
FIG. 13B illustrates a cross-sectional representation of the semiconductor structure shown along line G-G' in FIG. 11, in accordance with some embodiments.

FIG. 13B illustrates a cross-sectional representation of the semiconductor structure 100*g* shown along line G-G' in FIG. 11, in accordance with some embodiments.

As shown in FIG. 13B, the first S/D structure 136*a* is formed adjacent to the first gate structure 142*a*, and the S/D contact structure 170*a* is formed on the first S/D structure 136*a*. The S/D contact structure 170*a* is recessed, and the first S/D conductive plug 184*a* is formed on the recessed first S/D contact structure 170*a*. Note that the top surface of the first S/D contact structure 170*a* is lower than the top surface of the first gate structure 142*a*.

Figure 14A:
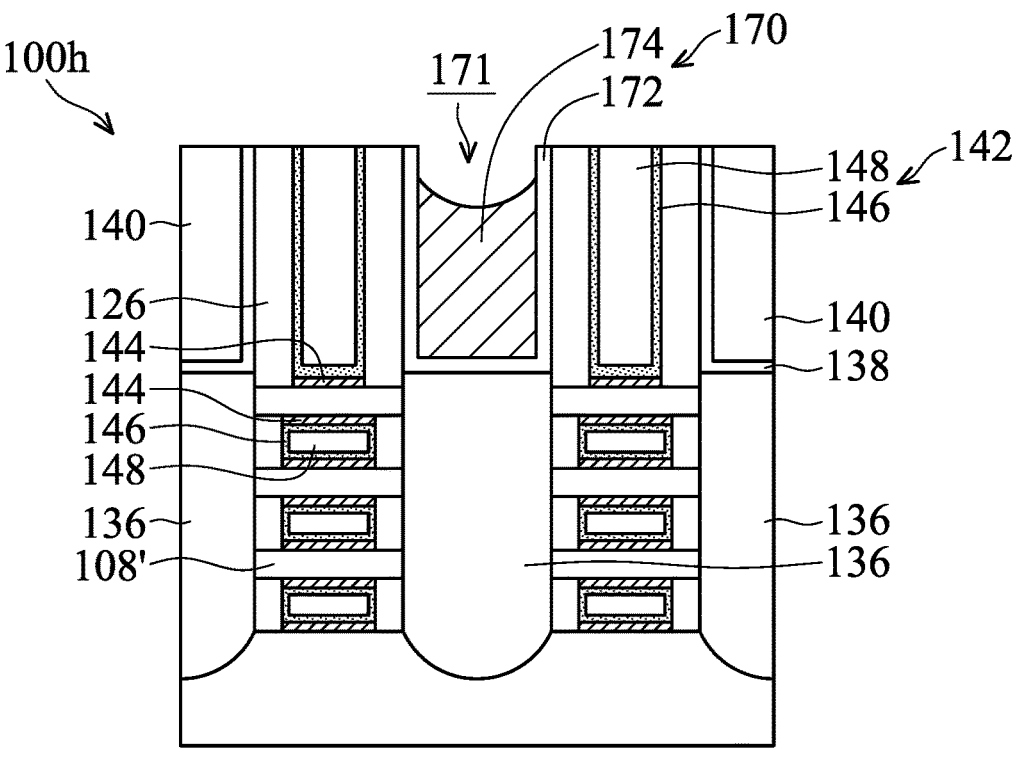
FIGS. 14A to 14C illustrate cross-sectional representations of various stages of manufacturing the semiconductor structure shown along line A-A' in FIG. 1E, in accordance with some embodiments.
Figure 14B:
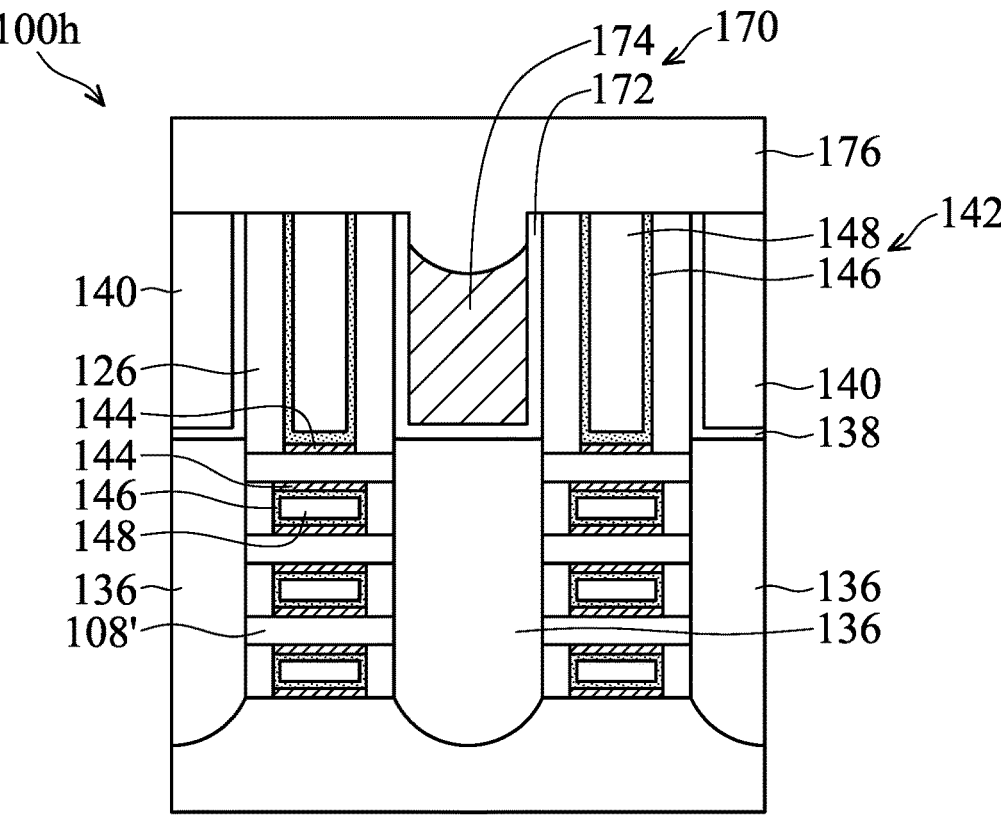
Figure 14C:
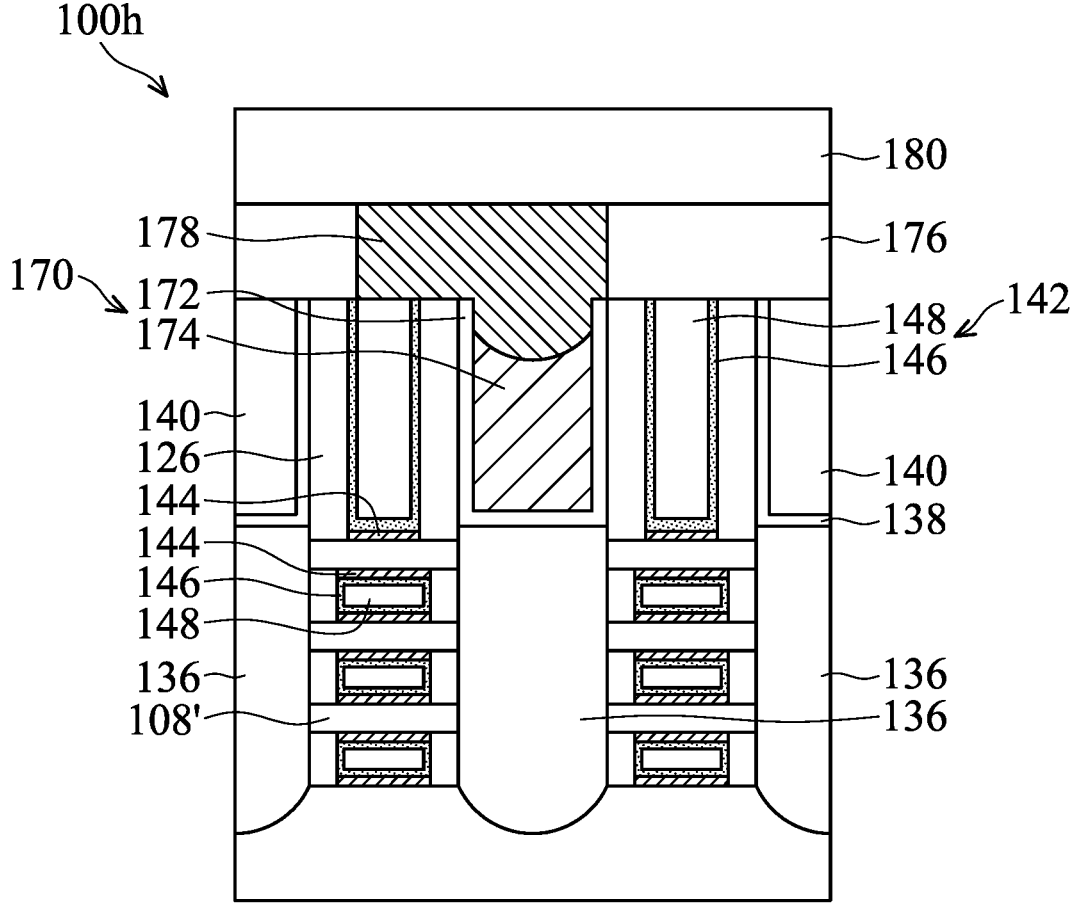

FIGS. 14A to 14C illustrate cross-sectional representations of various stages of manufacturing the semiconductor structure 100*g* shown along line A-A' in FIG. 1E, in accordance with some embodiments.

As shown in FIG. 14A, after the S/D contact structure 170 is formed, the top portion of the S/D contact structure 170 is removed to form the recess 171, in accordance with some embodiments. The S/D contact structure 170 is recessed to form the recessed top surface. A portion of the dielectric layer 176 is lower than the top surface of the gate spacer layer 126.

Next, as shown in FIG. 14B, the dielectric layer 176 is formed in the recess 171 and on the gate structure 142, the gate spacer layer 126 and the S/D contact structure 170, in accordance with some embodiments.

Afterwards, as shown in FIG. 14C, the bridge contact structure 176 is formed in the dielectric layer 176, in accordance with some embodiments. The bridge contact structure 176 is connected to the gate structure 142 and the S/D contact structure 170.

Since the topmost surface of the additional conductive layer 142T of the gate structure 142 is higher than the recessed top surface of the S/D contact structure 170, the unwanted capacitance between the gate structure 142 and the S/D contact structure 170 is reduced. In addition, the leakage between the gate structure 142 and the S/D contact structure 170 is reduced.

Figure 15A:
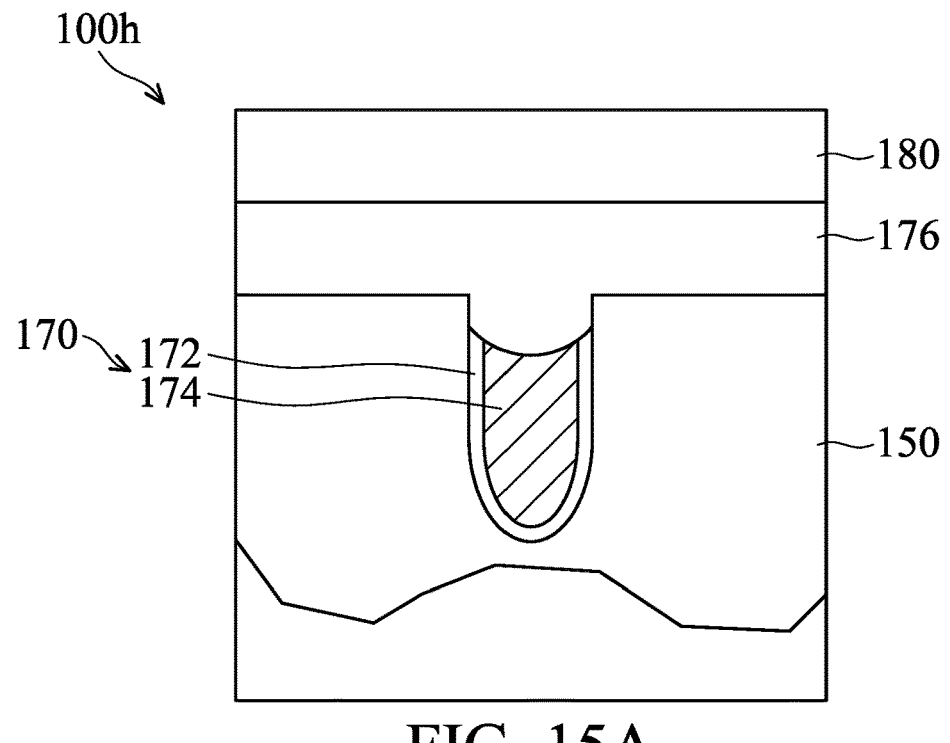
FIG. 15A illustrates a cross-sectional representation of the semiconductor structure shown along line C-C' of FIG. 4, in accordance with some embodiments.

FIG. 15A illustrates a cross-sectional representation of the semiconductor structure 100*h* shown along line C-C' of FIG. 4, in accordance with some embodiments.

As shown in FIG. 15A, the S/D contact structure 170 is embedded in the gate isolation structure 150. In addition, the dielectric layer 176 and the dielectric layer 180 are formed over the gate isolation structure 150. Since the S/D contact structure 170 has the recessed top surface, the portion of the dielectric layer 176 is formed on the recessed top surface. Therefore, the bottom portion of the dielectric layer 176 is lower than the top surface of the gate isolation structure 150.

Figure 15B:
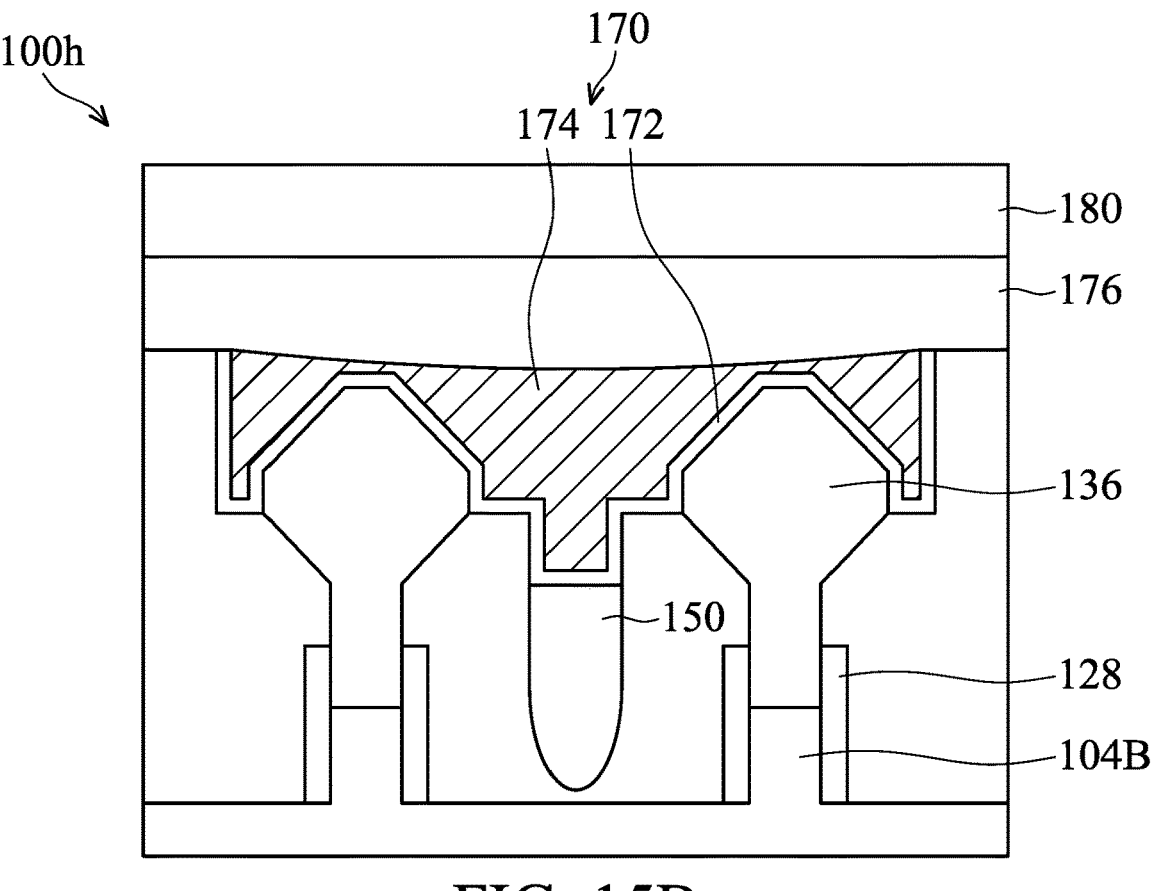
FIG. 15B illustrates a cross-sectional representation of the semiconductor structure shown along line D-D' of FIG. 4, in accordance with some embodiments.

FIG. 15B illustrates a cross-sectional representation of the semiconductor structure 100*h* shown along line D-D' of FIG. 4, in accordance with some embodiments.

As shown in FIG. 15B, the S/D contact structure 170 is formed on the S/D structure 136 and the gate isolation structure 150. The S/D contact structure 170 is formed across the two adjacent S/D structures 136. Since the S/D contact structure 170 has the recessed top surface, the portion of the dielectric layer 176 is formed on the recessed top surface. Therefore, the bottom portion of the dielectric layer 176 is lower than the top surface of the ILD layer 140.

Figure 16:
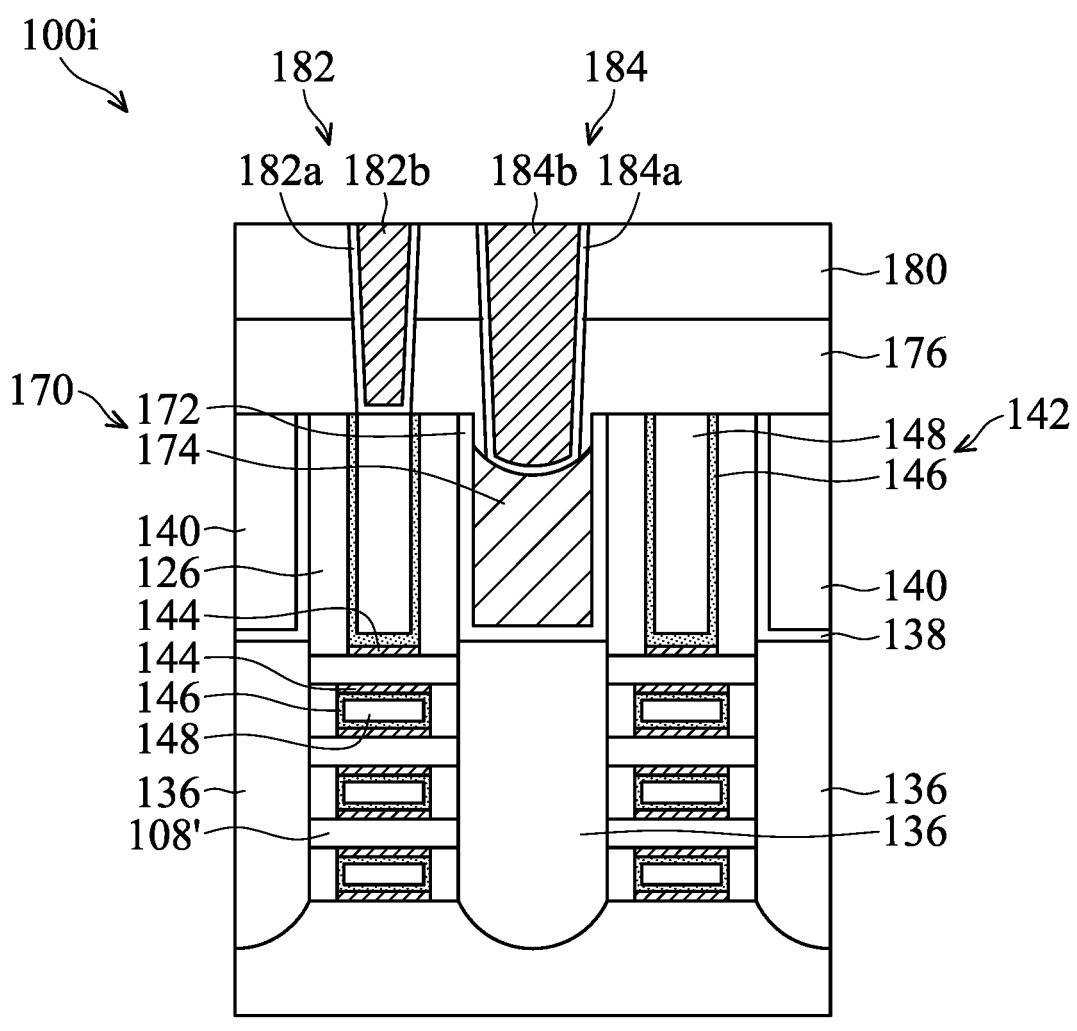
FIG. 16 illustrates a cross-sectional representation of a semiconductor structure, in accordance with some embodiments.

FIG. 16 illustrates a cross-sectional representation of a semiconductor structure 100*i*, in accordance with some embodiments. The semiconductor structure 100*i* of FIG. 16 includes elements that are similar to, or the same as, elements of the semiconductor structure 100*d* of FIG. 9, the difference between the FIG. 16 and FIG. 9 is that the S/D contact structure 170 is recessed, and the S/D conductive plug 184 is formed on recessed top surface of the S/D contact structure 170. In addition, the gate contact structure 182 is in formed on and in direct contact with the gate electrode layer 148 of the gate structure 142, rather than the additional conductive layer 142T.

Figure 17A:
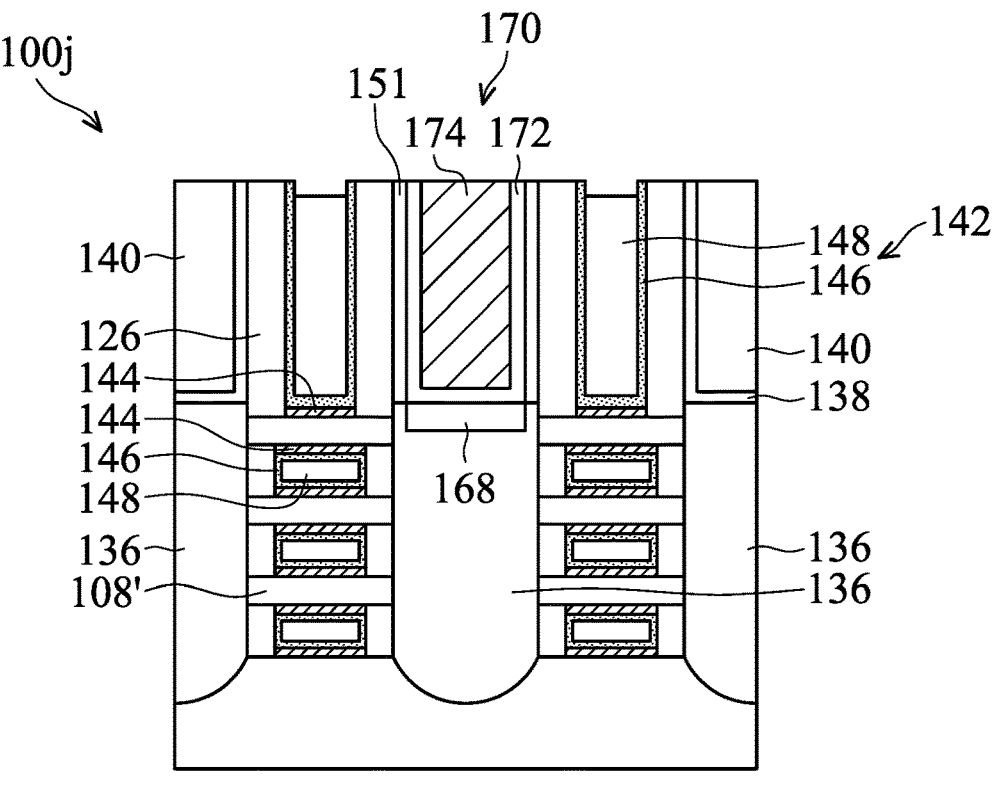
FIGS. 17A to 17C illustrate cross-sectional representations of various stages of manufacturing a semiconductor structure shown along line A-A' in FIG. 1E, in accordance with some embodiments.
Figure 17B:
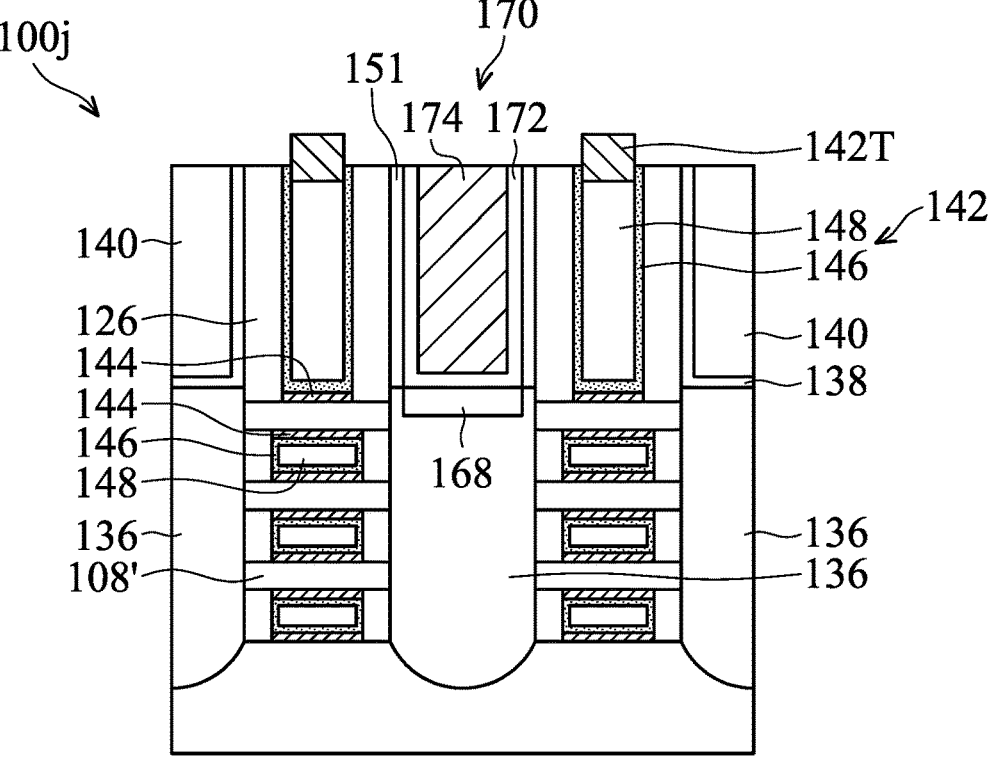
Figure 17C:
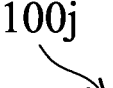
Figure 17C:
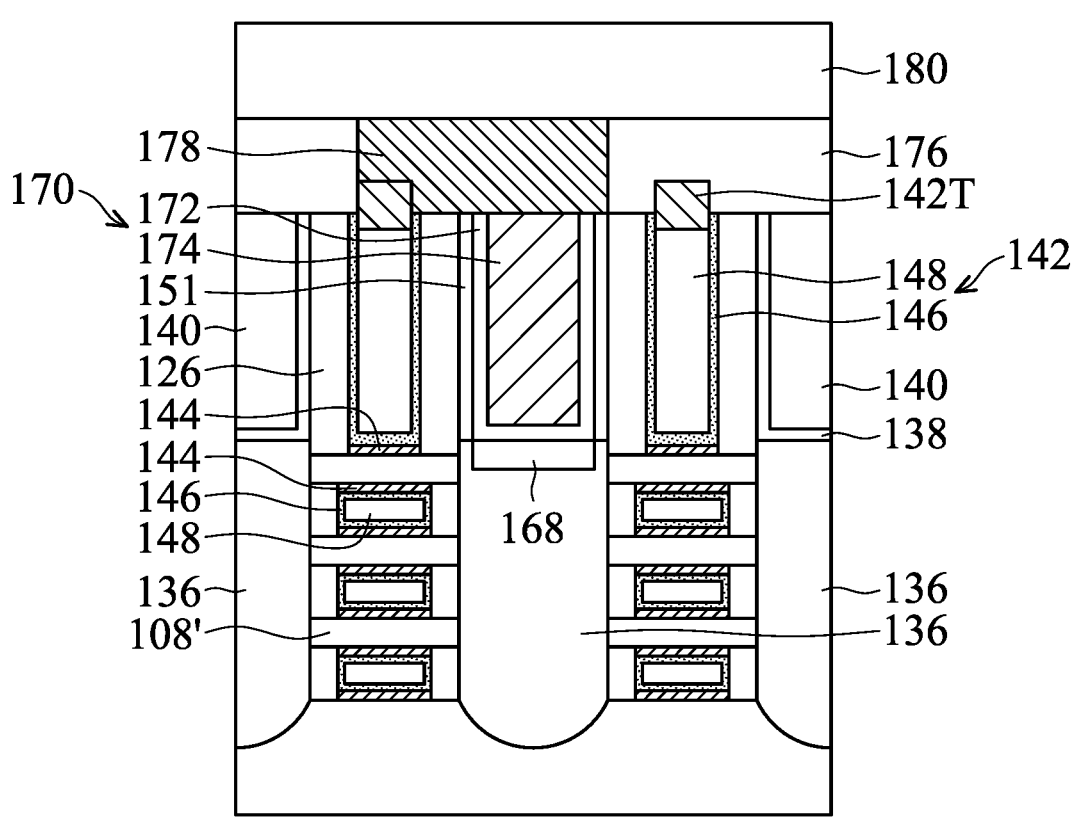

FIGS. 17A to 17C illustrate cross-sectional representations of various stages of manufacturing a semiconductor structure 100*j* shown along line A-A' in FIG. 1E, in accordance with some embodiments.

As shown in FIG. 17A, the top portion of the gate electrode layer 148 of the gate structure 142 is recessed to form the recessed top surface. Note that the gate dielectric layer 146 is not removed, and therefore the top surface of the gate dielectric layer 146 is higher than the recessed top surface of the gate electrode layer 148 of the gate structure 142.

Next, as shown in FIG. 17B, the additional conductive layer 142T is selectively formed on the gate electrode layer 148 of the gate structure 142, in accordance with some embodiments. Since the gate electrode layer 148 is recessed, the interface between the additional conductive layer 142T and the gate electrode layer 148 is lower than the top surface of the S/D contact structure 170. In addition, the inner sidewall of the gate dielectric layer is in direct contact with an outer sidewall of the additional conducive layer.

The top surface of the additional conductive layer 142T is higher than the top surface of the gate dielectric layer 146 of the gate structure 142. The bottom surface of the additional conductive layer 142T is lower than the top surface of the gate dielectric layer 146 and the top surface of the gate spacer layer 126. In other words, a portion of the additional conductive layer 142T is lower than the top surface of the gate dielectric layer 146 and the top surface of the gate spacer layer 126. The top surface of the gate dielectric layer 146 of the gate structure 142 is higher than the top surface of the gate electrode layer 148, but lower than the top surface of the additional conductive layer 142T.

Afterwards, as shown in FIG. 17C, the dielectric layer 176 is formed on the additional conductive layer 142T and the ILD layer 140, and the bridge contact structure 178 is formed on the additional conductive layer 142T and the S/D contact structure 170, in accordance with some embodiments. The dielectric layer 180 is formed on the bridge contact structure 178 and the dielectric layer 176. The S/D contact structure 170 is electrically connected to the additional conductive layer 142T by the bridge contact structure 178. The bridge contact structure 178 is in direct contact with the additional conductive layer 142T of the gate structure 142 and the S/D contact structure 170.

Figure 18:
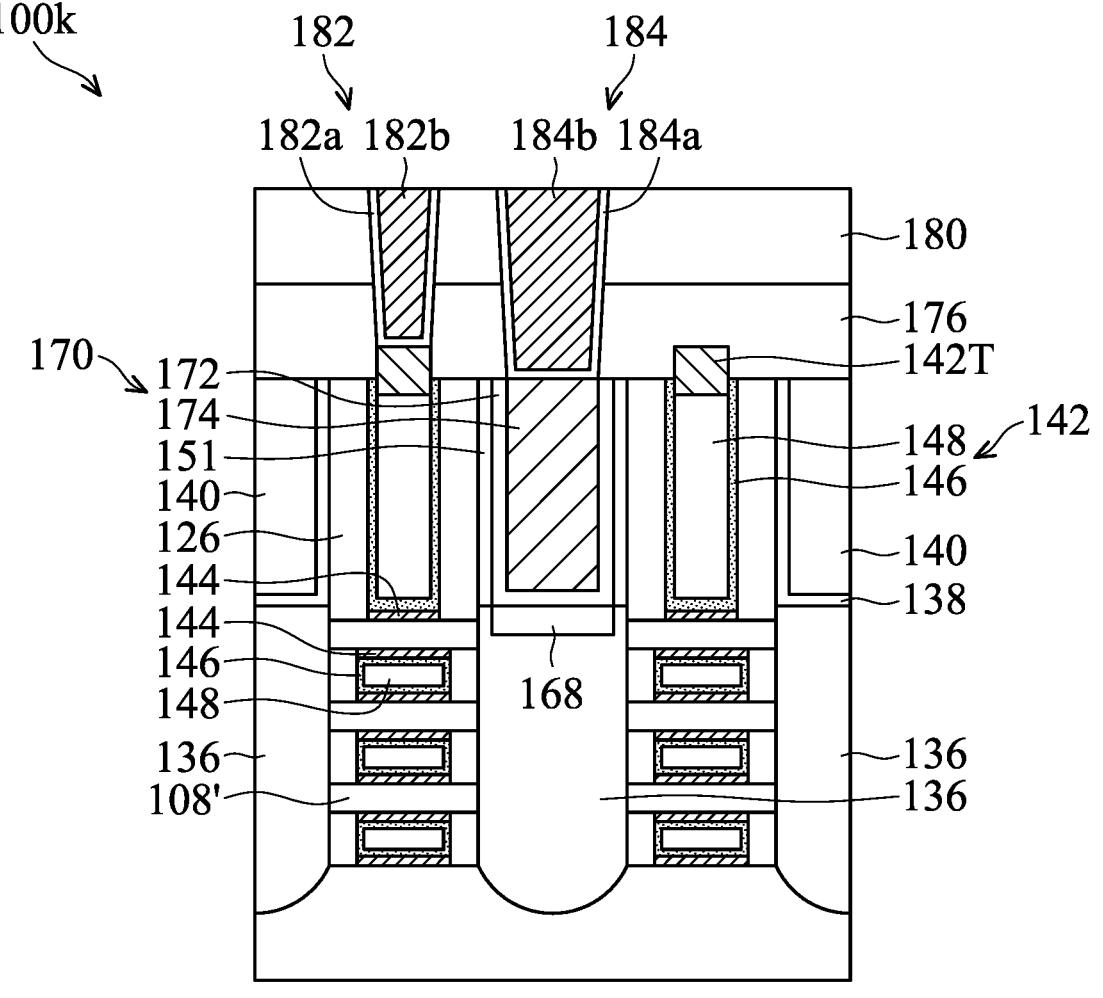
FIG. 18 illustrates a cross-sectional representation of a semiconductor structure, in accordance with some embodiments.

FIG. 18 illustrates a cross-sectional representation of a semiconductor structure 100k, in accordance with some embodiments. The semiconductor structure 100k of FIG. 18 includes elements that are similar to, or the same as, elements of the semiconductor structure 100d of FIG. 9, the difference between the FIG. 18 and FIG. 9 is that the gate structure 142 is recessed, and therefore a portion of the additional conductive layer 142T is lower than the top surface of the top surface of gate spacer layer 126. Although the portion of the additional conductive layer 142T is lower than the top surface of the S/D contact structure 170, the top surface of the additional conductive layer 142T is still higher than the top surface of the S/D contact structure 170.

Figure 19A:
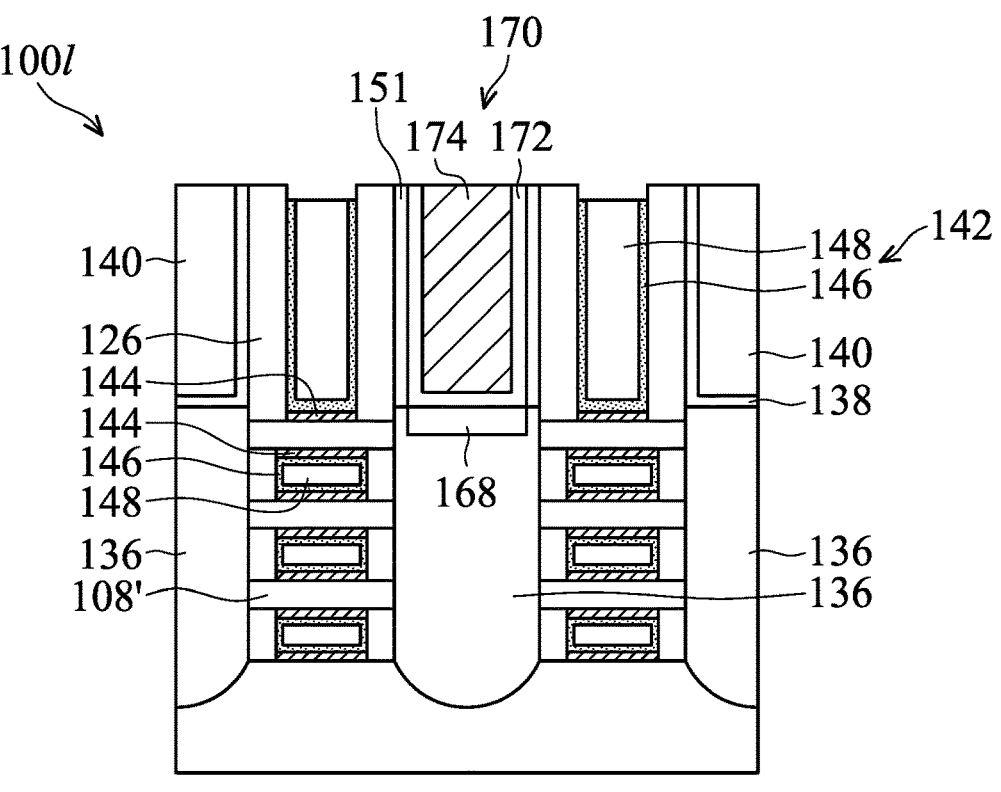
FIGS. 19A to 19C illustrate cross-sectional representations of various stages of manufacturing a semiconductor structure shown along line A-A' in FIG. 1E, in accordance with some embodiments.
Figure 19B:
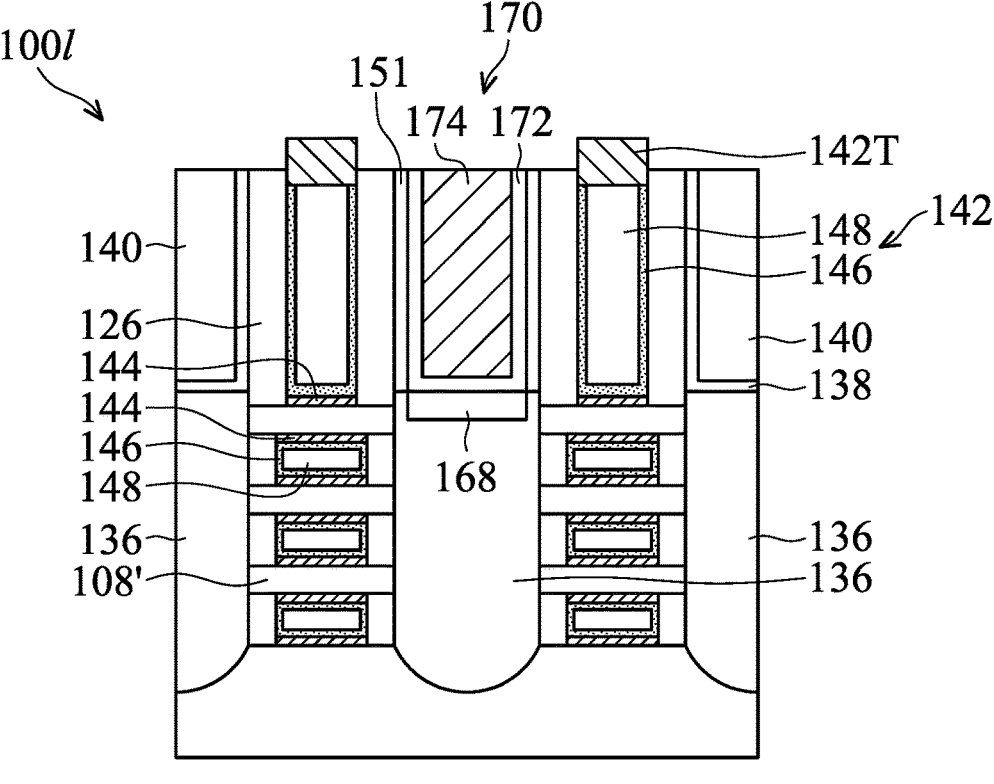
Figure 19C:
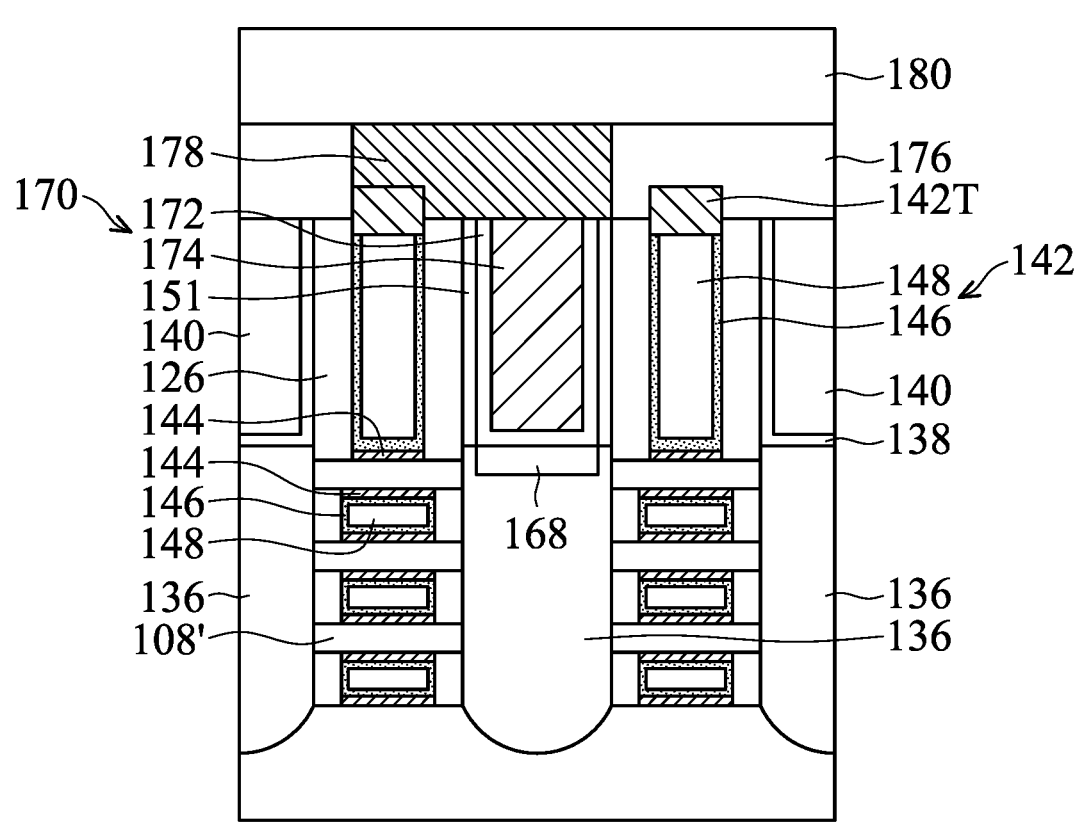

FIGS. 19A to 19C illustrate cross-sectional representations of various stages of manufacturing a semiconductor structure 100l shown along line A-A' in FIG. 1E, in accordance with some embodiments.

As shown in FIG. 19A, the top portion of the gate electrode layer 148 and the top portion of the gate dielectric layer 146 of the gate structure 142 are recessed.

Next, as shown in FIG. 19B, the additional conductive layer 142T is selectively formed on the gate electrode layer 148 and on the gate dielectric layer 146 of the gate structure 142, in accordance with some embodiments. The top surface of the additional conductive layer 142T is higher than the top surface of the gate spacer layer 126.

Afterwards, as shown in FIG. 19C, the dielectric layer 176 is formed on the additional conductive layer 142T and the ILD layer 140, and the bridge contact structure 178 is formed on the additional conductive layer 142T and the S/D contact structure 170, in accordance with some embodiments. The dielectric layer 180 is formed on the bridge contact structure 178 and the dielectric layer 176. The S/D contact structure 170 is electrically connected to the additional conductive layer 142T by the bridge contact structure 178.

Figure 20:
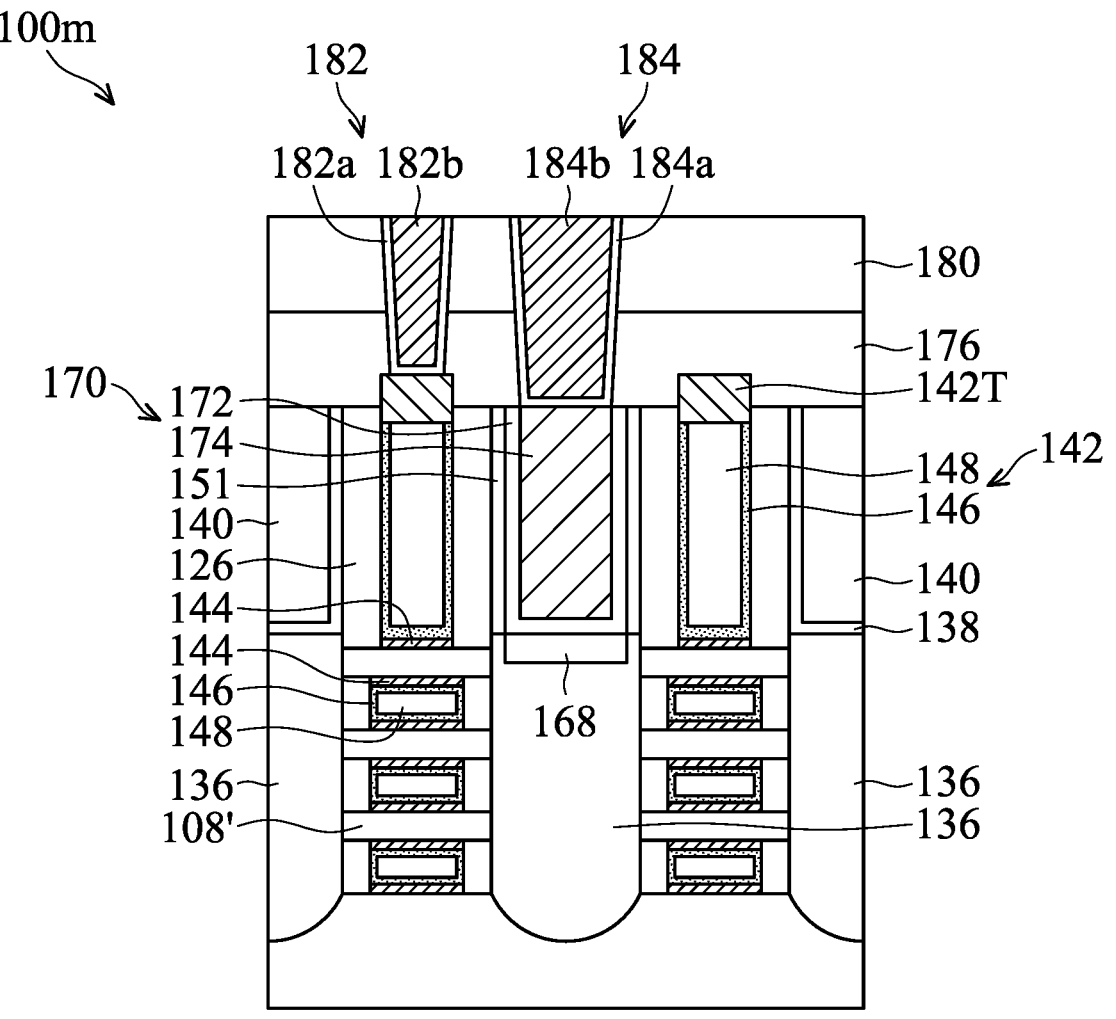
FIG. 20 illustrates a cross-sectional representation of a semiconductor structure, in accordance with some embodiments.

FIG. 20 illustrates a cross-sectional representation of a semiconductor structure 100m, in accordance with some embodiments. The semiconductor structure 100m of FIG. 20 includes elements that are similar to, or the same as, elements of the semiconductor structure 100k of FIG. 18, the difference between the FIG. 20 and FIG. 18 is that the gate dielectric layer 146 of the gate structure 142 is recessed, and the additional conductive layer 142T is formed on the recessed top surface of the gate dielectric layer 146 of the gate structure 142.

Figure 21A:
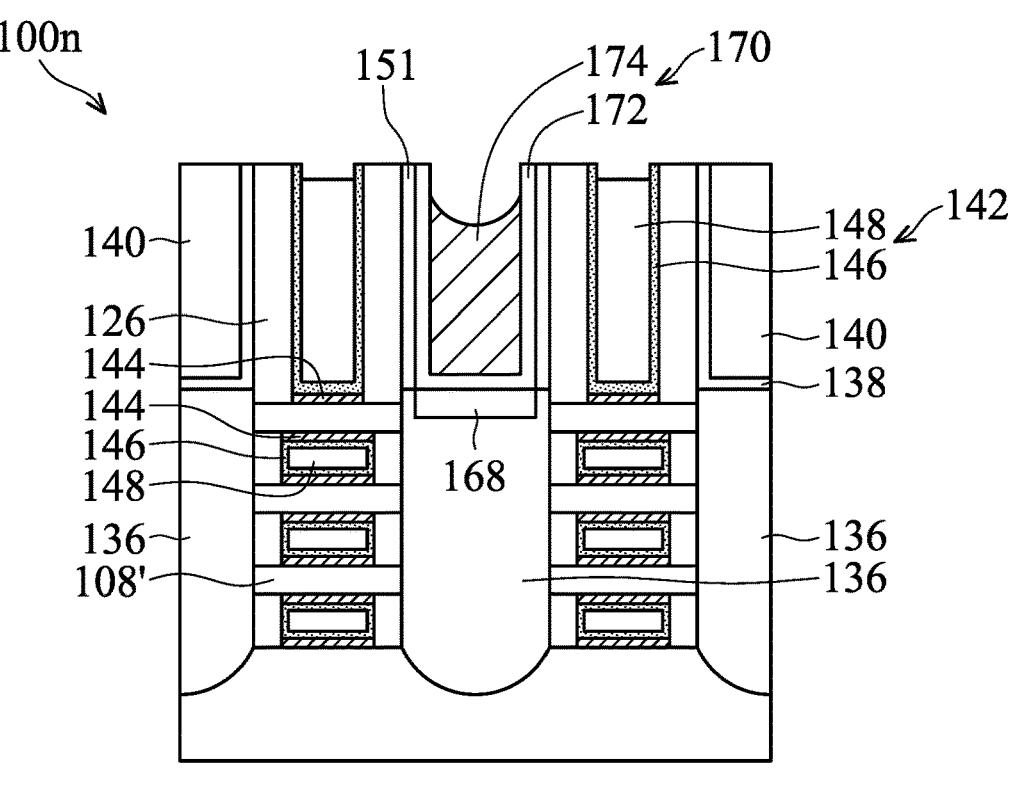
FIGS. 21A to 21C illustrate cross-sectional representations of various stages of manufacturing a semiconductor structure shown along line A-A' in FIG. 1E, in accordance with some embodiments.
Figure 21B:
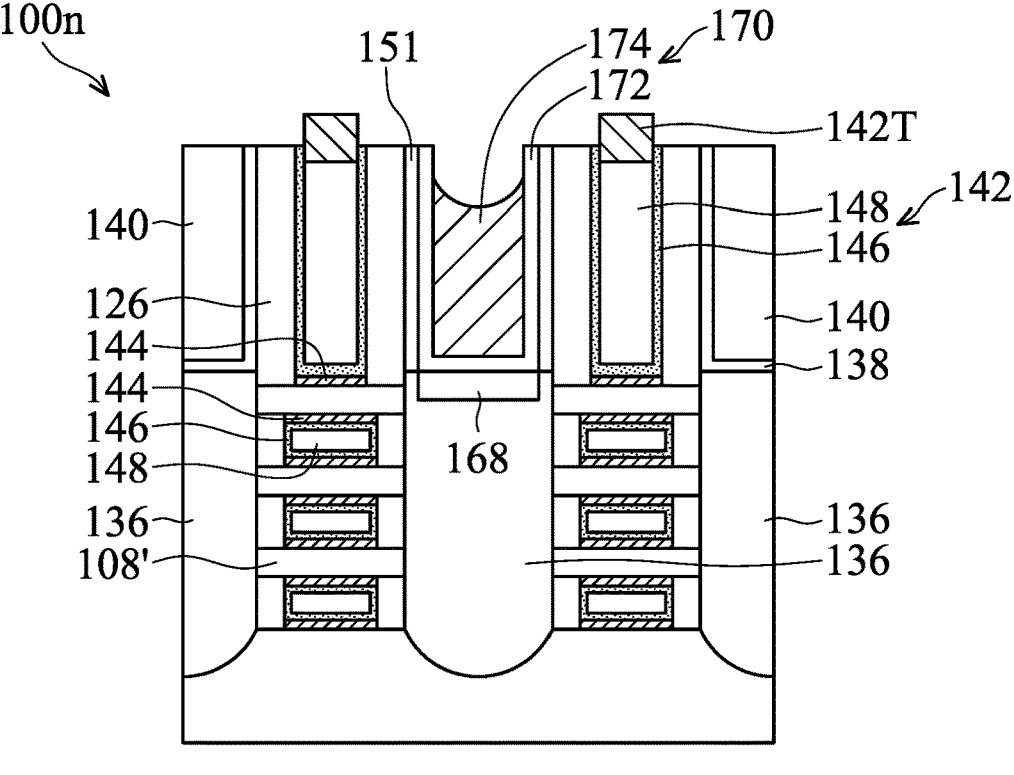
Figure 21C:
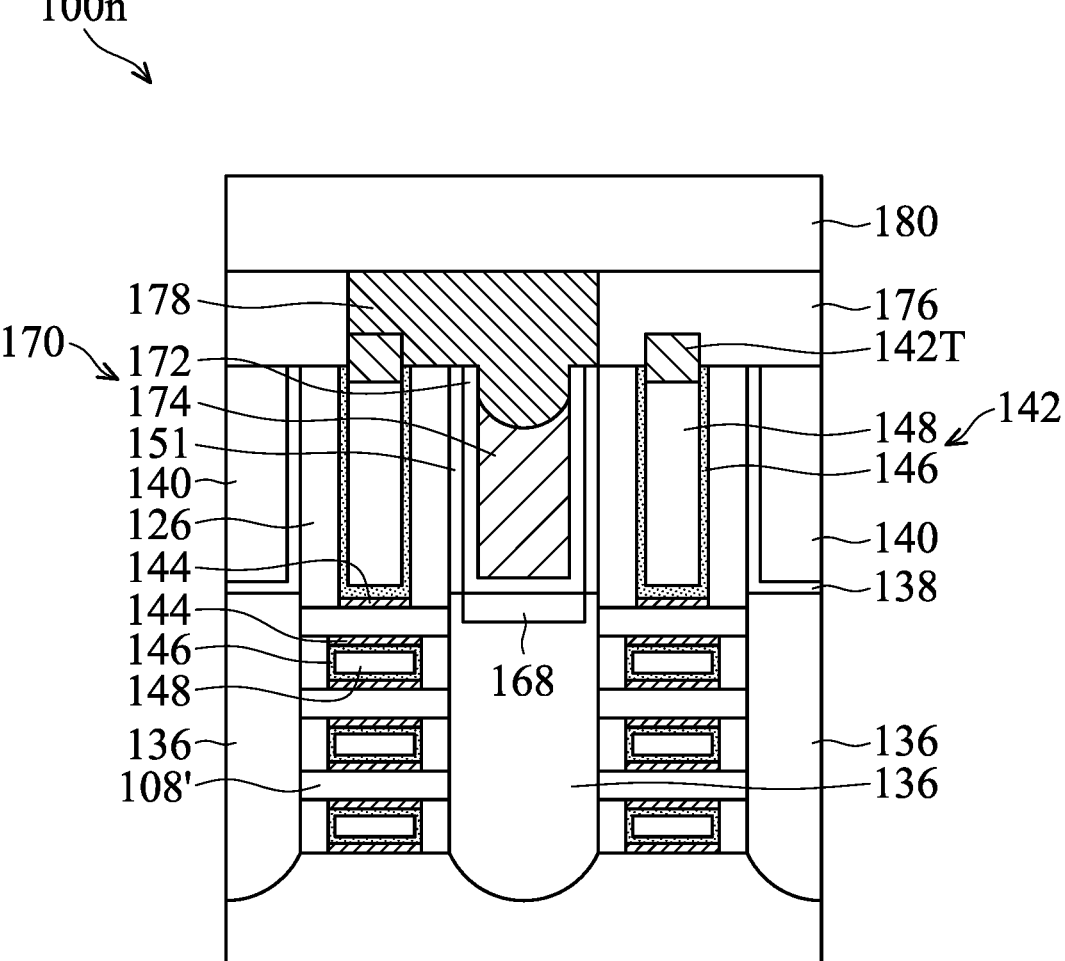

FIGS. 21A to 21C illustrate cross-sectional representations of various stages of manufacturing a semiconductor structure 100n shown along line A-A' in FIG. 1E, in accordance with some embodiments.

As shown in FIG. 21A, the top portion of the gate electrode layer 148 of the gate structure 142 is recessed, and the top portion of the S/D contact structure 170 is recessed.

Next, as shown in FIG. 21B, the additional conductive layer 142T is selectively formed on the gate electrode layer 148 of the gate structure 142, in accordance with some embodiments. The top surface of the additional conductive layer 142T is higher than the top surface of the gate spacer layer 126.

Afterwards, as shown in FIG. 21C, the dielectric layer 176 is formed on the additional conductive layer 142T and the ILD layer 140, and the bridge contact structure 178 is formed on the additional conductive layer 142T and the S/D contact structure 170, in accordance with some embodiments. The dielectric layer 180 is formed on the bridge contact structure 178 and the dielectric layer 176.

Note that the bridge contact structure 178 is formed on the recessed top surface of the S/D contact structure 170, and therefore a portion of the bridge contact structure 178 is lower than the top surface of the gate spacer layer 126. The bridge contact structure 178 is electrically connected to the S/D contact structure 170 and the additional conductive layer 142T.

Figure 22:
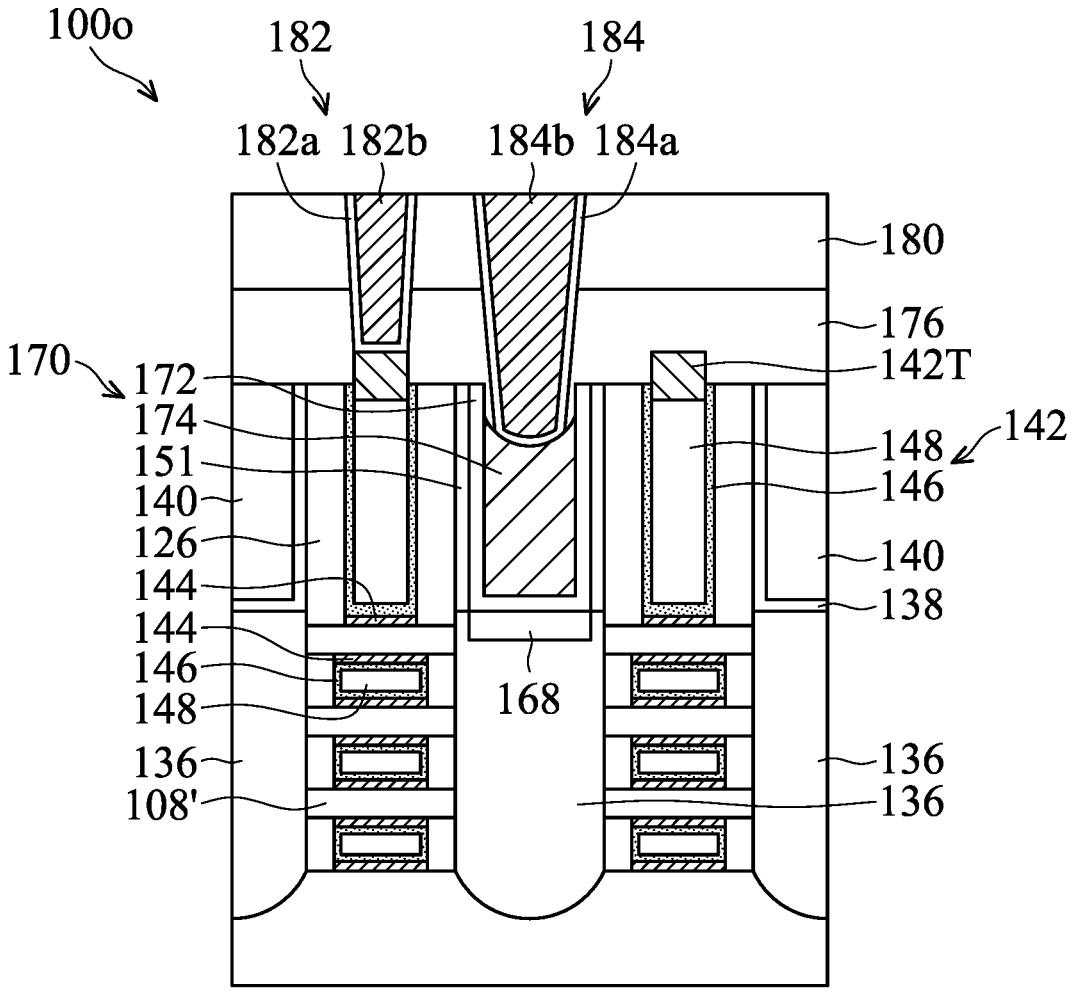
FIG. 22 illustrates a cross-sectional representation of a semiconductor structure, in accordance with some embodiments.

FIG. 22 illustrates a cross-sectional representation of a semiconductor structure 100o, in accordance with some embodiments. The semiconductor structure 100o of FIG. 22 includes elements that are similar to, or the same as, elements of the semiconductor structure 100k of FIG. 18, the difference between the FIG. 20 and FIG. 18 is that top portion of the S/D contact structure 170 is recessed, and the additional conductive layer 142T is formed on the recessed top surface of the S/D contact structure 170. Furthermore, a portion of the dielectric layer 176 is lower than the surface of the gate spacer layer 126.

Figure 23A:
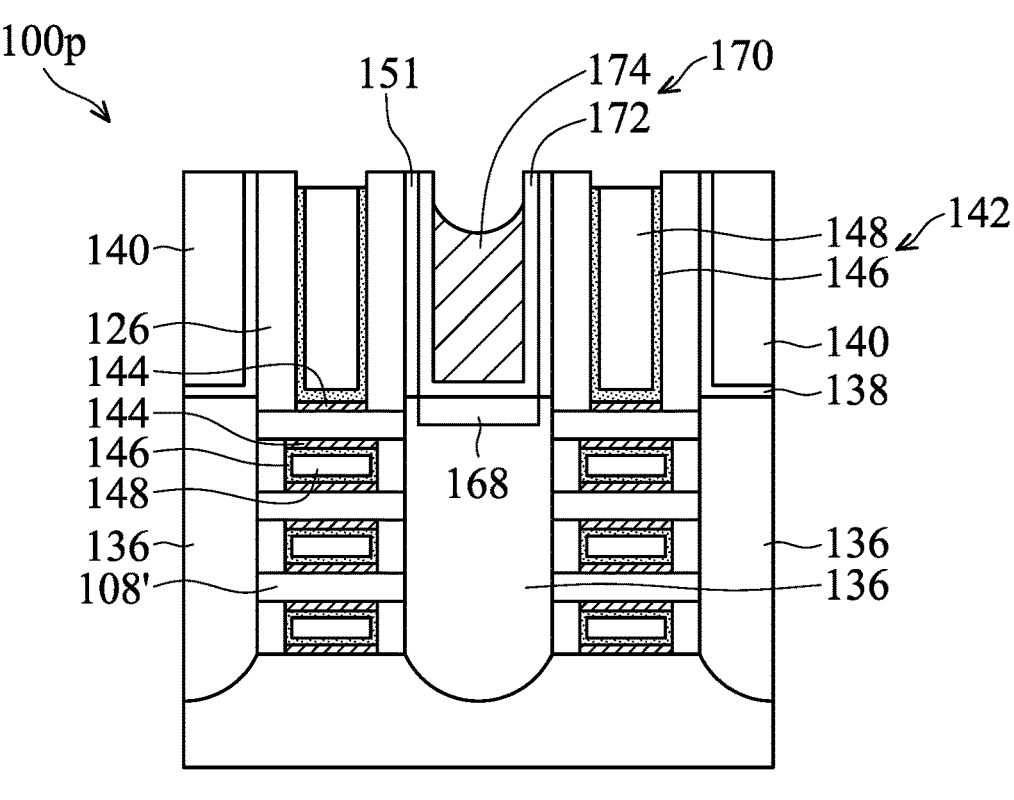
FIGS. 23A to 23C illustrate cross-sectional representations of various stages of manufacturing a semiconductor structure shown along line A-A' in FIG. 1E, in accordance with some embodiments.
Figure 23B:
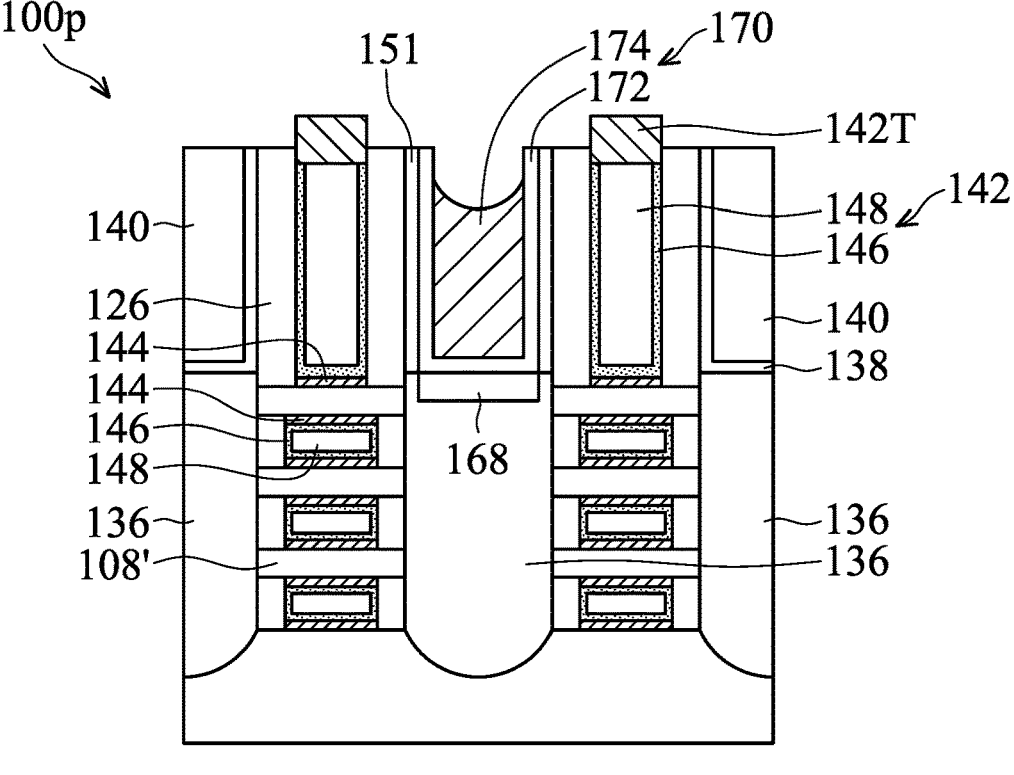
Figure 23C:
Figure 23C:
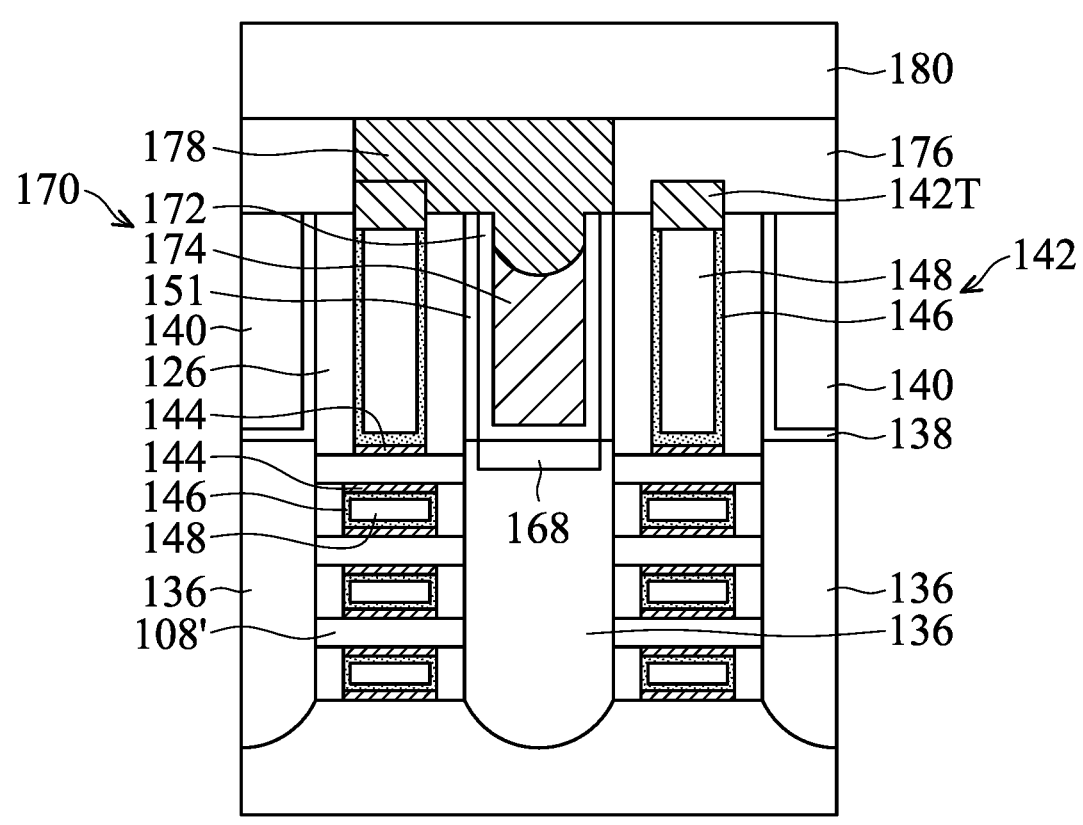

FIGS. 23A to 23C illustrate cross-sectional representations of various stages of manufacturing a semiconductor structure 100p shown along line A-A' in FIG. 1E, in accordance with some embodiments.

As shown in FIG. 23A, the top portion of the gate electrode layer 148 and the top portion of the gate dielectric layer 146 of the gate structure 142 are recessed. In addition, the top portion of the S/D contact structure 170 is recessed.

Next, as shown in FIG. 23B, the additional conductive layer 142T is selectively formed on the gate electrode layer 148 and on the gate dielectric layer 146 of the gate structure 142, in accordance with some embodiments. The top surface of the additional conductive layer 142T is higher than the top surface of the gate spacer layer 126.

Afterwards, as shown in FIG. 23C, the dielectric layer 176 is formed on the additional conductive layer 142T and the ILD layer 140, and the bridge contact structure 178 is formed on the additional conductive layer 142T and the S/D contact structure 170, in accordance with some embodiments. The dielectric layer 180 is formed on the bridge contact structure 178 and the dielectric layer 176. The S/D contact structure 170 is electrically connected to the additional conductive layer 142T by the bridge contact structure 178. Since the bridge contact structure 178 is formed on the recessed top surface of the S/D contact structure 170, the bottom portion of the bridge contact structure 178 is lower than the top surface of the gate spacer layer 126.

Figure 24:
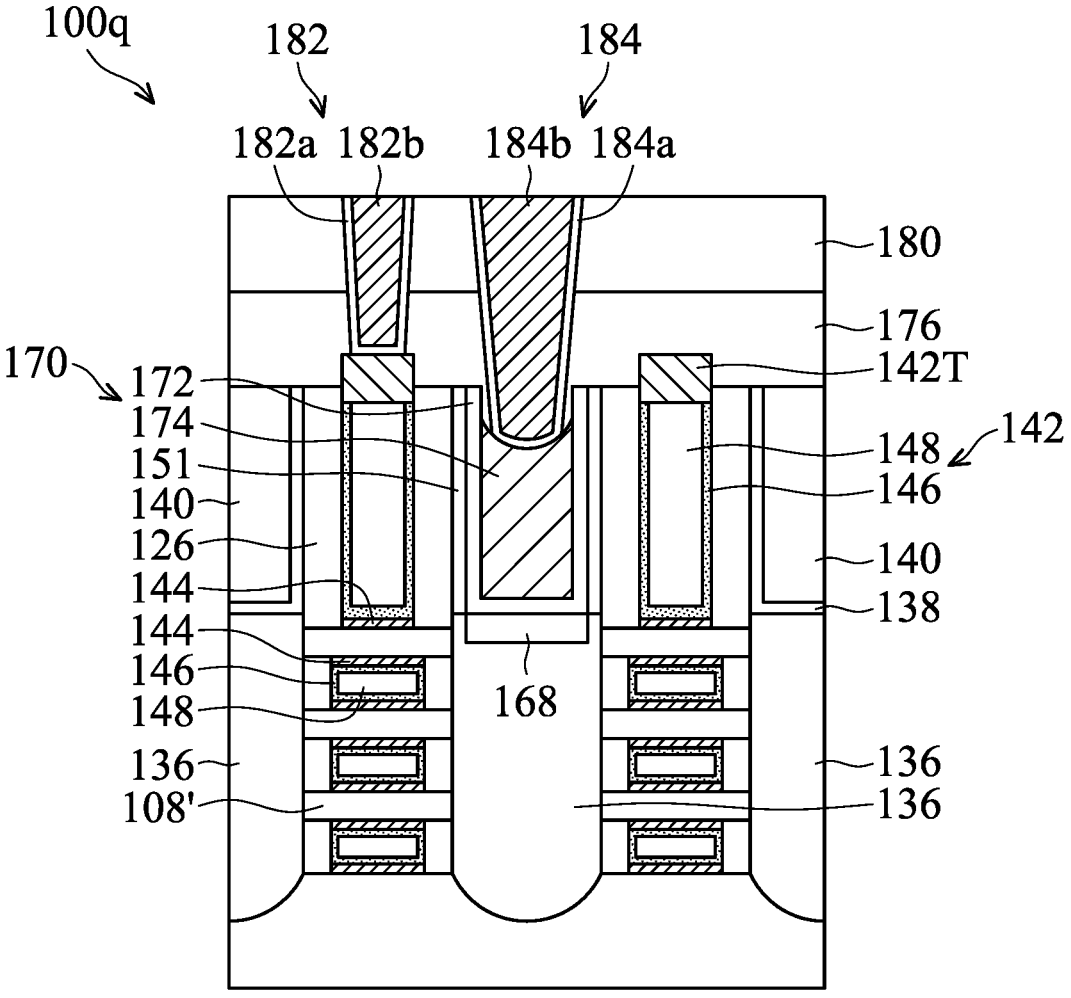
FIG. 24 illustrates a cross-sectional representation of a semiconductor structure, in accordance with some embodiments.

FIG. 24 illustrates a cross-sectional representation of a semiconductor structure 100q, in accordance with some embodiments. The semiconductor structure 100q of FIG. 24 includes elements that are similar to, or the same as, elements of the semiconductor structure 100o of FIG. 22, the difference between the FIG. 24 and FIG. 22 is that top portion of the gate dielectric layer 146 of the gate structure 142 is recessed, and the additional conductive layer 142T is formed on the recessed top surface of the gate dielectric layer 146 of the gate structure 142.

The topmost surface of the gate structure 142 is designed to be higher than the top surface of the S/D contact structure 170 by forming the additional conductive layer 142T. In addition, the top portion of the S/D contact structure 170 is recessed to make the recessed top surface of the S/D contact structure 170 lower than the top surface of the gate structure 142. The height difference between the gate structure 142 and the S/D contact structure 170 can reduce the unwanted capacitance and the leakage. Therefore, the performance of the semiconductor structure is improved. The semiconductor structure mentioned above can applied to gate all around (GAA) structure, FinFET structure, Forksheet structure or Complementary Field effect transistor (CEET) structure.

It should be noted that same elements in FIGS. 1A to 24 may be designated by the same numerals and may include similar or the same materials and may be formed by similar or the same processes; therefore such redundant details are omitted in the interest of brevity. In addition, although FIGS. 1A to 24 are described in relation to the method, it will be appreciated that the structures disclosed in FIGS. 1A to 24 are not limited to the method but may stand alone as structures independent of the method. Similarly, although the methods shown in FIGS. 1A to 24 are not limited to the disclosed structures but may stand alone independent of the structures. Furthermore, the nanostructures described above may include nanowires, nanosheets, or other applicable nanostructures in accordance with some embodiments.

Also, while disclosed methods are illustrated and described below as a series of acts or events, it will be appreciated that the illustrated ordering of such acts or events may be altered in some other embodiments. For example, some acts may occur in different orders and/or concurrently with other acts or events apart from those illustrated and/or described above. In addition, not all illustrated acts may be required to implement one or more aspects or embodiments of the description above. Further, one or more of the acts depicted above may be carried out in one or more separate acts and/or phases.

Furthermore, the terms "approximately," "substantially," "substantial" and "about" describe above account for small variations and may be varied in different technologies and be in the deviation range understood by the skilled in the art. For example, when used in conjunction with an event or circumstance, the terms can refer to instances in which the event or circumstance occurs precisely as well as instances in which the event or circumstance occurs to a close approximation.

Embodiments for forming semiconductor structures may be provided. The semiconductor structure includes forming a gate structure, a source/drain (S/D) structure adjacent to the gate structure, and an S/D contact structure over the S/D structure. The additional conductive layer is selectively formed on the gate electrode layer and thus the additional conductive layer becomes an extending portion of the gate structure. The top surface of the gate structure is designed to be higher than the top surface of the S/D contact structure. The additional conducive layer provides more contact area for landing the gate contact structure over the gate structure. In some embodiments, the top portion of the S/D contact structure is recessed, and the unwanted capacitance between the gate structure and the S/D contact structure is reduced. In addition, the leakage between the gate structure and the S/D contact structure is reduced. The performance of the semiconductor structure is improved by controlling the positional relationship between the gate structure and the S/D contact structure.

In some embodiments, a semiconductor structure is provided. The semiconductor structure includes a gate structure formed over a substrate, and a source/drain (S/D) structure formed adjacent to the gate structure. The semiconductor structure includes a first dielectric layer formed over the S/D structure, and an S/D contact structure formed over the S/D structure. The S/D contact structure is through the first dielectric layer, and a top surface of the gate structure is higher than a top surface of the S/D contact structure.

In some embodiments, a semiconductor structure is provided. The semiconductor structure includes a plurality of nanostructures formed over a substrate, and a gate electrode layer formed over the nanostructures. The semiconductor structure includes a gate spacer layer formed adjacent to the gate electrode layer, and a source/drain (S/D) structure formed adjacent to the gate electrode layer. The semiconductor structure also includes a first dielectric layer formed over the S/D structure, and an S/D contact structure formed over the S/D structure. The S/D contact structure is through the first dielectric layer. The semiconductor structure includes a second dielectric layer formed over the first dielectric layer, and a portion of the second dielectric layer is lower than a top surface of the gate spacer layer.

In some embodiments, a method for manufacturing a semiconductor structure is provided. The method includes forming nanostructures over a substrate, and forming a gate electrode layer wrapped around the nanostructures. The method includes forming a source/drain (S/D) structure attached to the nanostructures adjacent to the gate electrode layer, and forming an etch stop layer on the S/D structure. The method also includes forming a first dielectric layer on the etch stop layer, and forming an additional conducive layer over the gate electrode layer. The method includes removing the first dielectric layer, and forming a first hard mask layer over the etch stop layer. The first hard mask layer has a reversed U-shaped structure to cover the additional conducive layer and the gate structure. The method includes forming a second hard mask layer over the first hard mask layer, and removing a sidewall portion of the first hard mask layer and a sidewall portion of the second hard mask layer to form a trench. The top surface of the S/D structure is exposed by the trench. The method includes forming an S/D contact structure in the trench, and removing a portion of the S/D contact structure to form a recessed S/D contact structure. The top surface of the additional conductive layer is higher than a top surface of the recessed S/D contact structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a gate structure formed over a substrate;
a source/drain (S/D) structure formed adjacent to the gate structure;
a first dielectric layer formed over the S/D structure;
an S/D contact structure formed over the S/D structure, wherein:
the S/D contact structure penetrates through the first dielectric layer, and
a top surface of the gate structure is higher than a top surface of the S/D contact structure;
a gate spacer layer adjacent to the gate structure; and
a second dielectric layer formed on the gate structure, wherein a portion of the second dielectric layer is lower than a top surface of the gate spacer layer.

2. The semiconductor structure as claimed in claim 1, wherein the gate structure comprises a gate electrode layer and an additional conductive layer on the gate electrode layer.

3. The semiconductor structure as claimed in claim 1, wherein the top surface of the S/D contact structure is lower than a top surface of the first dielectric layer.

4. The semiconductor structure as claimed in claim 1, further comprising:
a bridging contact structure covering the gate structure and the S/D contact structure, wherein a first interface between the bridging contact structure and the gate structure is higher than a second interface between the bridging contact structure and the S/D contact structure.

5. The semiconductor structure as claimed in claim 1, further comprising:
a gate contact structure formed on the gate structure; and
an S/D conductive plug formed on the S/D contact structure, wherein a first interface between the gate contact structure and the gate structure is higher than a second interface between the S/D conductive plug and the S/D contact structure.

6. The semiconductor structure as claimed in claim 1, wherein:
the gate structure comprises a gate dielectric layer, a gate electrode layer and an additional conductive layer, and
a top surface of the gate dielectric layer is higher than a top surface of the gate electrode layer and lower than a top surface of the additional conductive layer.

7. The semiconductor structure as claimed in claim 6, wherein a portion of the additional conductive layer is lower than a top surface of the gate spacer layer.

8. The semiconductor structure as claimed in claim 1, further comprising:
a bridging contact structure on and in direct contact with the gate structure and the S/D contact structure, wherein a portion of the bridging contact structure is lower than a top surface of the gate spacer layer.

9. The semiconductor structure as claimed in claim 1, further comprising:
a gate contact structure, wherein a bottom surface of the S/D contact structure is lower than a bottom surface of the gate contact structure.

10. A semiconductor structure, comprising:
a plurality of nanostructures formed over a substrate;
a gate electrode layer formed over the nanostructures;

a gate spacer layer formed adjacent to the gate electrode layer;
a source/drain (S/D) structure formed adjacent to the gate electrode layer;
a first dielectric layer formed over the S/D structure;
an S/D contact structure formed over the S/D structure, wherein:
the S/D contact structure penetrates through the first dielectric layer,
the S/D contact structure has a recessed top surface, and the recessed top surface of the S/D contact structure is lower than a top surface of the gate spacer layer; and
a second dielectric layer formed over the first dielectric layer, wherein a portion of the second dielectric layer is lower than the top surface of the gate spacer layer.

11. The semiconductor structure as claimed in claim 10, further comprising:
an additional conductive layer formed on the gate electrode layer, wherein a top surface of the additional conductive layer is higher than the recessed top surface of the S/D contact structure.

12. The semiconductor structure as claimed in claim 11, wherein an interface between the gate electrode layer and the additional conductive layer is lower than the top surface of the gate spacer layer.

13. The semiconductor structure as claimed in claim 11, further comprising:
a bridging contact structure on and in direct contact with the additional conductive layer and the S/D contact structure, wherein a portion of the bridging contact structure is lower than the top surface of the gate spacer layer.

14. The semiconductor structure as claimed in claim 10, further comprising:
an inner spacer layer between the gate electrode layer and the S/D structure.

15. The semiconductor structure as claimed in claim 10, further comprising:
an additional conductive layer formed on the gate electrode layer; and
a gate dielectric layer formed over the substrate to surround the gate electrode layer, wherein an inner sidewall of the gate dielectric layer is in direct contact with an outer sidewall of the additional conductive layer.

16. A semiconductor structure, comprising:
a plurality of nanostructures formed over a substrate;
a gate electrode layer formed over the nanostructures;
a gate spacer layer formed adjacent to the gate electrode layer;
a source/drain (S/D) structure formed adjacent to the gate electrode layer;
a first dielectric layer formed over the S/D structure;
an S/D contact structure formed over the S/D structure, wherein the S/D contact structure penetrates through the first dielectric layer;
a second dielectric layer formed over the first dielectric layer, wherein a portion of the second dielectric layer is lower than a top surface of the gate spacer layer;
an additional conductive layer formed on the gate electrode layer; and
a gate dielectric layer formed over the substrate to surround the gate electrode layer, wherein an inner sidewall of the gate dielectric layer is in direct contact with an outer sidewall of the additional conductive layer.

17. The semiconductor structure as claimed in claim 16, wherein a top surface of the additional conductive layer is higher than a top surface of the S/D contact structure.

18. The semiconductor structure as claimed in claim 16, wherein an interface between the gate electrode layer and the additional conductive layer is lower than the top surface of the gate spacer layer.

19. The semiconductor structure as claimed in claim 16, further comprising:

a bridging contact structure on and in direct contact with the additional conductive layer and the S/D contact structure, wherein a portion of the bridging contact structure is lower than the top surface of the gate spacer layer.

20. The semiconductor structure as claimed in claim 16, further comprising:

an inner spacer layer between the gate electrode layer and the S/D structure.

* * * * *